US008838408B2

(12) United States Patent  (10) Patent No.: US 8,838,408 B2
Linde et al.  (45) Date of Patent: Sep. 16, 2014

(54) MISALIGNMENT INDICATION DECISION SYSTEM AND METHOD

(75) Inventors: Reed Linde, El Dorado Hills, CA (US); Dan Glotter, Moshav Shadma (IL); Alexander Chufarovsky, Ashdod (IL); Leonid Gurov, Rishon Le Zion (IL)

(73) Assignee: Optimal Plus Ltd, Nes-Zionna (IL)

( * ) Notice: Subject to any disclaimer, the term of this patent is extended or adjusted under 35 U.S.C. 154(b) by 585 days.

(21) Appl. No.: 12/944,363

(22) Filed: Nov. 11, 2010

(65) Prior Publication Data

US 2012/0123734 A1  May 17, 2012

(51) Int. Cl.
*G01C 9/00* (2006.01)
*G01R 31/00* (2006.01)
*G01R 31/28* (2006.01)

(52) U.S. Cl.
CPC ................................. *G01R 31/2891* (2013.01)
USPC ...................... 702/150; 324/750.16

(58) Field of Classification Search
CPC ........... G01R 31/2891; G01R 31/2884; G01R 31/2887; G01R 31/2889
USPC ...................... 702/150; 324/750.16
See application file for complete search history.

(56) References Cited

U.S. PATENT DOCUMENTS

| | | | |
|---|---|---|---|
| 3,724,084 A * | 4/1973 | McNeece | 33/501 |
| 4,052,793 A | 10/1977 | Coughlin et al. | |
| 5,010,296 A | 4/1991 | Okada et al. | |
| 5,065,092 A | 11/1991 | Sigler | |
| 5,134,365 A | 7/1992 | Okubo et al. | |
| 5,321,453 A | 6/1994 | Mori et al. | |
| 5,365,180 A | 11/1994 | Edelman | |
| 5,534,784 A | 7/1996 | Lum et al. | |
| 5,656,943 A | 8/1997 | Montoya et al. | |
| 5,726,920 A | 3/1998 | Chen et al. | |
| 6,127,831 A | 10/2000 | Khoury et al. | |
| 6,927,078 B2 | 8/2005 | Saijyo | |
| 7,026,833 B2 | 4/2006 | Rincon et al. | |
| 7,119,566 B2 | 10/2006 | Kim | |
| 7,129,733 B2 | 10/2006 | Savagaonkar et al. | |

(Continued)

FOREIGN PATENT DOCUMENTS

| IL | 170252 A | 4/2011 |
|---|---|---|
| JP | 5-30582 A | 2/1993 |

(Continued)

OTHER PUBLICATIONS

Liu, et al., "Measurement and Analysis of Contact Resistance in Wafer Probe Testing," Microelectronics Reliability, (2007), vol. 47, pp. 1086-1094.

(Continued)

*Primary Examiner* — Michael Nghiem
(74) *Attorney, Agent, or Firm* — Nath, Goldberg & Meyer; Jerald L. Meyer

(57) ABSTRACT

Systems and methods for deciding whether or not to indicate misalignment. In some examples, an analysis of parametric data relating to tests sensitive to misalignment is performed in order to determine which data is incongruous and to identify corresponding probes or socket contacts as suspected misaligned. In some examples, additionally or alternatively, a spatial analysis quantifies the placement of a set of identified suspected misaligned probes, which were identified from pass/fail test data and/or parametric test data, with respect to a contiguous or non-contiguous area on one or more wafers.

40 Claims, 30 Drawing Sheets

(56) References Cited

U.S. PATENT DOCUMENTS

| | | | |
|---|---|---|---|
| 7,167,811 | B2 | 1/2007 | Tabor |
| 7,230,439 | B2 | 6/2007 | Tan |
| 7,437,271 | B2 | 10/2008 | Tabor |
| 7,498,824 | B2 | 3/2009 | Lane |
| 8,222,912 | B2* | 7/2012 | Dang et al. ............... 324/755.01 |
| 2001/0056486 | A1* | 12/2001 | Kosaka ......................... 709/224 |
| 2002/0003432 | A1 | 1/2002 | Leas et al. |
| 2002/0105348 | A1 | 8/2002 | Resor, III |
| 2003/0011376 | A1 | 1/2003 | Matsushita et al. |
| 2003/0178988 | A1 | 9/2003 | Kim |
| 2003/0212523 | A1 | 11/2003 | Dorough et al. |
| 2004/0070413 | A1 | 4/2004 | Kasukabe et al. |
| 2005/0253607 | A1 | 11/2005 | Kimoto |
| 2006/0103408 | A1 | 5/2006 | Takahashi et al. |
| 2006/0244438 | A1 | 11/2006 | Strom |
| 2007/0035318 | A1 | 2/2007 | Yoo et al. |
| 2007/0057684 | A1* | 3/2007 | Chong et al. ................... 324/754 |
| 2007/0156379 | A1 | 7/2007 | Kulkarni et al. |
| 2007/0296438 | A1 | 12/2007 | Gore et al. |
| 2008/0197865 | A1 | 8/2008 | Endres |
| 2008/0211525 | A1 | 9/2008 | Garabedian et al. |
| 2008/0246030 | A1 | 10/2008 | Satya et al. |
| 2008/0290885 | A1 | 11/2008 | Matsunami |
| 2009/0105983 | A1 | 4/2009 | Variyam et al. |
| 2009/0121733 | A1* | 5/2009 | Choi ............................. 324/758 |
| 2009/0239316 | A1 | 9/2009 | Li |
| 2009/0289651 | A1 | 11/2009 | Caldwell |
| 2010/0271062 | A1* | 10/2010 | Breinlinger et al. .......... 324/758 |

FOREIGN PATENT DOCUMENTS

| | | | |
|---|---|---|---|
| JP | 5288802 | A | 11/1993 |
| JP | 6216204 | A | 8/1994 |
| JP | 11352149 | A | 12/1999 |
| JP | 2008300655 | A | 12/2008 |
| SG | 20090000904 | | 2/2009 |
| SG | 20070018461 | | 1/2011 |
| WO | WO 2012/063244 | * | 5/2012 |

OTHER PUBLICATIONS

Giaimo, "A Method for Measuring and Evaluating Contact Resistance in Burn-in and Test Sockets," 2000 Burn-in and Test Sockets Workshop, ninety-four (94) pages.

Weeden, "Probe Card Tutorial," published on the Accuprobe website and downloaded on Mar. 24, 2010, forty (40) pages.

Muriel, et al., "Statistical Bin Analysis on Wafer Probe," (2001), IEEE/SEMI Advanced Semiconductor Manufacturing Conference, pp. 187-192.

Rodriguez, et al., "Wafer Probe process verification tools," (2000) IEEE/SEMI Advanced Semiconductor Manufacturing Conference, pp. 207-212.

Quach, et al., "Characterization and Optimization of the Production Probing Process," ITC International Test Conference, (1999), pp. 378-387.

Quach, et al., "Real Time In-situ Monitoring and Characterization of Production Wafer Probing Process," International Test Conference, (1997), pp. 802-808.

Broz, "Controlling Contact Resistance," Evaluation Engineering, (2004), in http://www.evaluationengineering.com/articles/200405/controlling-contact-resistance.php , nine (9) pages.

Broz, et al., "Probe Contact Resistance Variations During Elevated Temperature Wafer Test," International Test Conference Proceedings, (1999), pp. 396-405.

Liu, et al., "An Investigation of Wafer Probe Needles Mechanical Properties and Contact Resistance Changing Under Multiprobing Process," Transactions on components and packaging technology, (2008), vol. 31, No. 1, pp. 196-203.

Pandey, et al., "P4 Probe Card—A Solution for At-Speed, High Density, Water Probing," International Test Conference, (1998), pp. 836-842.

Maekawa, et al., "Highly Reliable Probe Card for Water Testing," Electronic Components and Technology Conference Proceedings, (2000), pp. 1152-1156.

Brandemuehl, "Challenges in Advanced Wafer Test Probing," Solid State Technology, (2003), seven (7) pages.

Langlois, et al., "Implementing Fiducial Probe Card Alignment Technology for Production Wafer Probing," IEEE/SEMI Advanced Manufacturing Conference, (2003), pp. 238-243.

Zimmerman, "SiProbe—A New Technology for Wafer Probing," International Test Conference Proceedings, (1995), pp. 106-112.

Kister, et al., "Electric Contact Resistance—The Key Parameter in Probe Card Performance," Semiconductor Wafer Test Workshop, (2007), twenty-one (21) pages.

Marcelis, "Probe-Tip Clean On-Demand," IS-Test Workshop 2008, May 26-27, 2008, Munich, Germany, thirty-four (34) pages.

Marcelis, "Probe-Tip Clean On-Demand," Semiconductor Wafer Test Workshop, Jun. 3-6, 2007, San Diego, CA, twenty-six (26) pages.

Wong, "ST Quality: Business Driving Force," Aug.-Sep. 2007, in http://www.ed-china.com/ARTICLE_IMAGES/200801/Quality.PDF?SOURCES=DOWN), twenty-one (21) pages.

"Binomial Probability," Wikipedia, last visited Apr. 22, 2010, http://en.wikipedia.org/wiki/Binomial_probability , four (4) pages.

"Statistics Tutorial: Binomial Distribution," last visited Apr. 22, 2010, http://stattrek.com/Lesson2/Binomial.aspx , five (5) pages.

"The Binomial," CliffsNotes, last visited Apr. 22, 2010, http://www.cliffsnotes.com/study_guide/The-Binomial.topicArticleId-25951,articleID-25918.html , three (3) pages.

"Binomial Theorem," Wikipedia, last visited Apr. 22, 2010, http://en.wikipedia.org/wiki/Binomial_theorem , twelve (12) pages.

"Binomial Distribution," Wikipedia, last visited Apr. 22, 2010, http://en.wikipedia.org/wiki/Binomial_distribution , twelve (12) pages.

"Poisson Distribution," Wikipedia, last visited Apr. 22, 2010, http://en.wikipedia.org/wiki/Poisson_distribution , twelve (12) pages.

Ashman, et al., "Detecting Biomodality in Astronomical Datasets," The Astronomical Journal, (1994), vol. 108, No. 6, pp. 2348-2361.

* cited by examiner

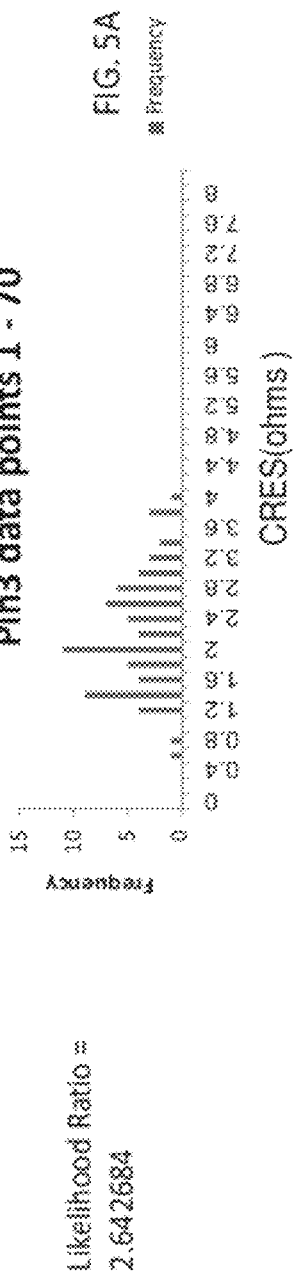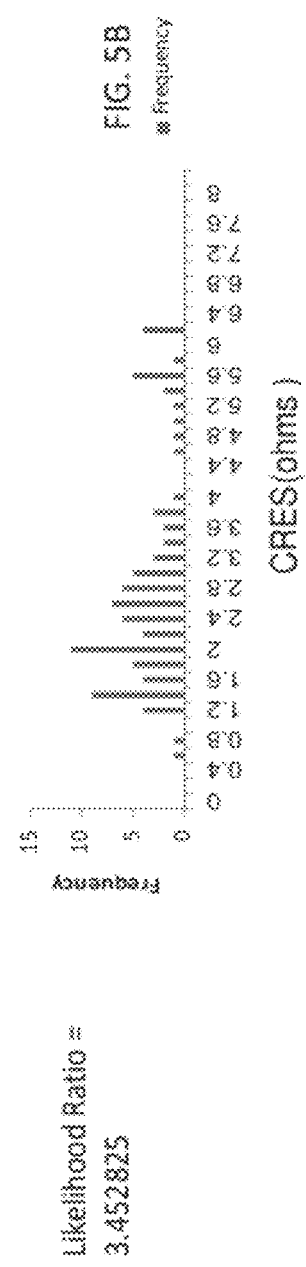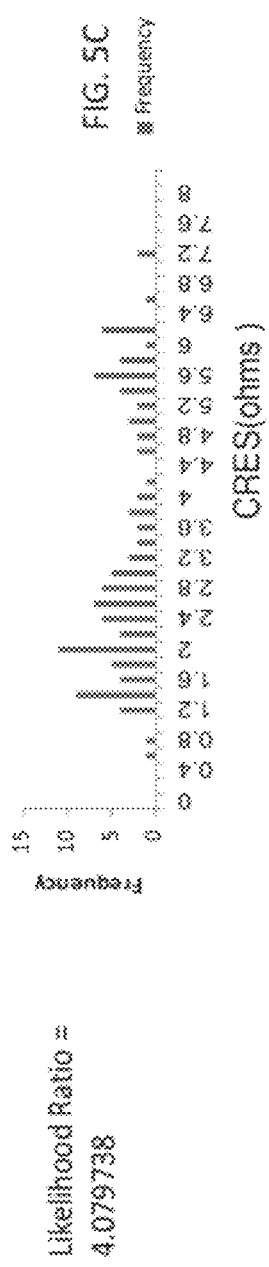

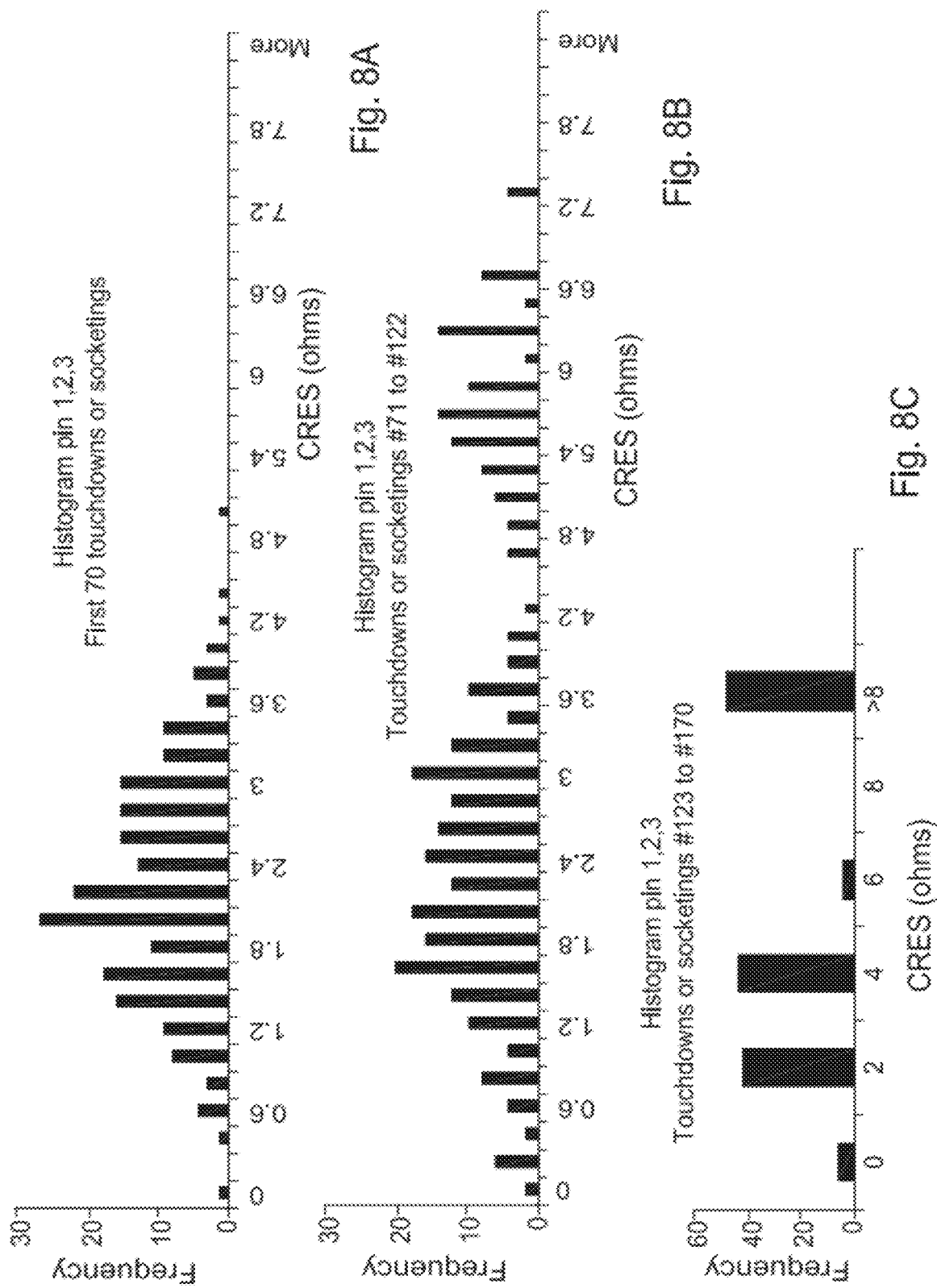

| #probes/region | | SYSTEMATIC FAIL PROBE PATTERN # BAD PROBES BY REGION 336 | | | | | | | | SYSTEMATIC FAIL PROBE PATTERN CUMULATIVE BINOMIAL PROBABILITY 336 | | | | | | | |
|---|---|---|---|---|---|---|---|---|---|---|---|---|---|---|---|---|---|
| | | Left-Right (FIG.13A) | Top-Bottom (FIG.13B) | NW-SE (FIG.13C) | SW-NE (FIG.13D) | Left-Right (FIG.13A) | Top-Bottom (FIG.13B) | NW-SE (FIG.13C) | SW-NE (FIG.13D) | Left-Right (FIG.13A) | Top-Bottom (FIG.13B) | NW-SE (FIG.13C) | SW-NE (FIG.13D) | Left-Right (FIG.13A) | Top-Bottom (FIG.13B) | NW-SE (FIG.13C) | SW-NE (FIG.13D) |
| | | Region A | Region A | Region A | Region A | Region A | Region A | Region A | Region A | Region A | Region A | Region A | Region A | Region A | Region A | Region A | Region A |
| Total Bad Probes | Average Bad Probe Density | | | | | | | | | | | | | | | | |
| 1 | 0.001488 | 0 | 0 | 0 | 0 | 61% | 61% | 61% | 61% | | | | | | | | |
| 2 | 0.002976 | 0 | 0 | 1 | 1 | 74% | 37% | 74% | 74% | | | | | | | | |
| 3 | 0.004464 | 1 | 1 | 1 | 1 | 56% | 56% | 56% | 56% | | | | | | | | |
| 4 | 0.005952 | 1 | 1 | 1 | 1 | 41% | 41% | 41% | 41% | | | | | | | | |
| 5 | 0.007440 | 2 | 1 | 1 | 2 | 54% | 29% | 29% | 54% | | | | | | | | |
| 6 | 0.008929 | 2 | 1 | 2 | 2 | 42% | 20% | 20% | 42% | | | | | | | | |
| 7 | 0.010417 | 3 | 1 | 2 | 3 | 54% | 13% | 32% | 64% | | | | | | | | |
| 8 | 0.011905 | 3 | 1 | 3 | 4 | 43% | 9% | 24% | 63% | | | | | | | | |
| 9 | 0.013393 | 4 | 2 | 3 | 4 | 53% | 17% | 32% | 58% | | | | | | | | |
| 10 | 0.014881 | 4 | 3 | 4 | 4 | 44% | 26% | 44% | 44% | | | | | | | | |

| | | Region B | Region B | Region B | Region B | Region B | Region B | Region B | Region B | Region B | Region B | Region B | Region B | Region B | Region B | Region B | Region B |
|---|---|---|---|---|---|---|---|---|---|---|---|---|---|---|---|---|---|
| Total Bad Probes | Average Bad Probe Density | | | | | | | | | | | | | | | | |
| 1 | 0.001488 | 1 | 1 | 1 | 1 | 91% | 91% | 91% | 91% | | | | | | | | |
| 2 | 0.002976 | 1 | 1 | 1 | 1 | 74% | 74% | 74% | 74% | | | | | | | | |
| 3 | 0.004464 | 2 | 2 | 2 | 2 | 81% | 81% | 81% | 81% | | | | | | | | |
| 4 | 0.005952 | 3 | 3 | 3 | 3 | 86% | 80% | 86% | 86% | | | | | | | | |
| 5 | 0.007440 | 3 | 4 | 3 | 3 | 76% | 89% | 76% | 76% | | | | | | | | |
| 6 | 0.008929 | 4 | 5 | 4 | 4 | 82% | 92% | 82% | 82% | | | | | | | | |
| 7 | 0.010417 | 4 | 6 | 4 | 4 | 73% | 94% | 86% | 73% | | | | | | | | |
| 8 | 0.011905 | 5 | 7 | 5 | 4 | 79% | 95% | 89% | 63% | | | | | | | | |
| 9 | 0.013393 | 5 | 7 | 5 | 5 | 70% | 91% | 83% | 70% | | | | | | | | |
| 10 | 0.014881 | 6 | 7 | 6 | 6 | 76% | 87% | 76% | 76% | | | | | | | | |

FIG. 16

| #probes/region | | | SYSTEMATIC FAIL PROBE PATTERN<br># BAD PROBES, BY REGION | | | | SYSTEMATIC FAIL PROBE PATTERN<br>CUMULATIVE BINOMIAL PROBABILITY | | | |
|---|---|---|---|---|---|---|---|---|---|---|
| | | | 336 | 336 | 336 | 336 | 336 | 336 | 336 | 336 |
| | | | Left-Right<br>(FIG. 14A) | Top-Bottom<br>(FIG. 14B) | NW-SE<br>(FIG. 14C) | SW-NE<br>(FIG. 14D) | Left-Right<br>(FIG. 14A) | Top-Bottom<br>(FIG. 14B) | NW-SE<br>(FIG. 14C) | SW-NE<br>(FIG. 14D) |
| Total Bad Probes | Average Bad Probe Density | | Region A | Region A | Region A | Region A | Region A | Region A | Region A | Region A |
| 1 | 0.001488 | | 0 | 1 | 1 | 0 | 91% | 91% | 91% | 91% |
| 2 | 0.002976 | | 0 | 2 | 2 | 0 | 37% | 92% | 92% | 37% |
| 3 | 0.004464 | | 1 | 3 | 3 | 0 | 56% | 93% | 93% | 22% |
| 4 | 0.005952 | | 1 | 4 | 4 | 0 | 41% | 95% | 95% | 13% |
| 5 | 0.007440 | | 1 | 5 | 5 | 0 | 29% | 96% | 96% | 8% |
| 6 | 0.008929 | | 1 | 6 | 6 | 0 | 20% | 97% | 97% | 5% |
| 7 | 0.010417 | | 1 | 7 | 7 | 0 | 13% | 97% | 97% | 3% |
| 8 | 0.011905 | | 2 | 8 | 8 | 1 | 24% | 98% | 98% | 9% |
| 9 | 0.013393 | | 3 | 9 | 9 | 1 | 34% | 98% | 98% | 6% |
| 10 | 0.014881 | | 3 | 10 | 10 | 1 | 26% | 98% | 98% | 4% |

| | | | Region B | Region B | Region B | Region B | Region B | Region B | Region B | Region B |
|---|---|---|---|---|---|---|---|---|---|---|
| Total Bad Probes | Average Bad Probe Density | | | | | | | | | |
| 1 | 0.001488 | | 1 | 0 | 0 | 1 | 91% | 91% | 91% | 91% |
| 2 | 0.002976 | | 2 | 0 | 0 | 2 | 92% | 37% | 37% | 92% |
| 3 | 0.004464 | | 2 | 0 | 0 | 3 | 81% | 22% | 22% | 92% |
| 4 | 0.005952 | | 3 | 0 | 0 | 4 | 86% | 13% | 13% | 95% |
| 5 | 0.007440 | | 4 | 0 | 0 | 5 | 89% | 8% | 8% | 96% |
| 6 | 0.008929 | | 5 | 0 | 0 | 6 | 92% | 5% | 5% | 97% |
| 7 | 0.010417 | | 8 | 0 | 0 | 7 | 94% | 3% | 3% | 97% |
| 8 | 0.011905 | | 8 | 0 | 0 | 7 | 89% | 2% | 2% | 95% |
| 9 | 0.013393 | | 6 | 0 | 0 | 8 | 83% | 1% | 1% | 96% |
| 10 | 0.014881 | | 7 | 0 | 0 | 9 | 87% | 1% | 1% | 97% |

MISALIGNMENT INDICATION DECISION SYSTEM AND METHOD

FIELD OF THE INVENTION

The invention relates to semiconductor testing.

BACKGROUND OF THE INVENTION

During wafer testing, electrical contact is preferably made between tester channels or power supplies and the bondpads (also known as pads or pins) of the one or more dies (AKA devices) being tested by means of a probecard. The probecard is constructed with a multitude of metallic probes that are attached to a printed circuit board. The traces of the PC board are electrically connected to tester channels and power supplies, while the probes, often in the format of tungsten needles, make temporary contact to the surface of the bondpads. The metallic "probes" provide a mechanical and electrical interface through which electrical signals and power supply voltages are applied to the device during testing, and also pass voltage responses from the device back to the tester for evaluation. Each device on a wafer will contain multiple bondpads (sometimes, hundreds per die), and in some cases (during parallel test operations), multiple devices at a time will be probed. Therefore, a probecard may have as many as several thousand probes in the probe array, spanning an area of several centimeters. During a sequential test operation, each die is tested separately. During a parallel test operation, a subset of all of the dies on a wafer, or all of the dies on the wafer, are tested simultaneously. Therefore, depending on the testing conditions, one or several passes may be made through the wafer in order to contact and to test all of the dies on the wafer. Each pass is referred to as a "touchdown".

For each touchdown for each wafer during wafer testing, each probe in the probe array should be aligned to fall on the correct corresponding bondpad. Note that alignment relates to any of the X dimension, the Y dimension, the Z-dimension (for probe array planarity), and/or rotationally (so called "theta dimension", referring to the angular dimension).

If an alignment problem remains undetected and worsens, the integrity of the electrical signals involved in testing dies on a wafer may eventually degrade to a point in which spurious failures of dies being tested appear. Additionally or alternatively an alignment problem may cause a loss in yield due to mechanical damage of die bondpads. Additionally or alternatively, after probing in a misaligned condition, the probecard may require special cleaning and/or other maintenance (for example due to having probed on the insulating layer typically surrounding the bondpads). Additionally or alternatively, an alignment problem may cause a requirement for wafer(s) to be reprobed (for example due to invalid yield loss) which may necessitate special handling and may consume manufacturing capacity.

Similarly, during testing of packaged devices ("units"), electrical contact is preferably made between tester channels or power supplies and the "pins" of a packaged device. The term "pins" is commonly used to refer to the external package contact point that is electrically connected to the die bondpads, internal to the package. (Note that each packaged device may include one or more die). A packaged device is inserted into a socket which is mounted on a loadboard. The traces of the loadboard are electrically connected to tester channels and power supplies, and the loadboard also provides a rigid surface to physically support the socket. The test socket contacts, make temporary contact to the surface of the pins of the packaged device. The metallic test socket contacts provide a mechanical and electrical interface through which electrical signals and power supply voltages are applied to the packaged device during testing, and also pass voltage responses from the packaged device back to the tester for evaluation. Each packaged device may contain multiple pins (sometimes, hundreds per device). During a sequential test operation, each packaged device is tested separately. During a parallel test operation, a plurality of packaged devices may be tested in parallel in a plurality of sockets and the handler may perform the socketing and unsocketing of the plurality of packaged devices in parallel.

During testing each test socket contact should be aligned to fall on the correct corresponding pin. Note that alignment relates to any of the X dimension, the Y dimension, the Z-dimension, and/or rotationally (so called "theta dimension", referring to the angular dimension).

If an alignment problem remains undetected and worsens, the integrity of the electrical signals involved in testing packaged devices may eventually degrade to a point in which spurious failures of packaged devices being tested appear. Additionally or alternatively an alignment problem may cause a loss in yield due to mechanical damage of pins. Additionally or alternatively, after socketing/unsocketing in a misaligned condition, the test socket may require special cleaning and/or other maintenance. Additionally or alternatively, an alignment problem may cause a requirement for packaged devices to be resocketed (for example due to invalid yield loss) which may necessitate special handling and may consume manufacturing capacity.

SUMMARY OF THE INVENTION

According to some embodiments of the invention, there is provided a system for deciding to indicate misalignment, comprising: a suspected misaligned identifier operable to identify at least, one suspected misaligned probe or socket contact based at least partly on examination of a test data collection, including analysis of at least one group of a plurality of parametric test measurements whose values are sensitive to misalignment; an attribute determiner operable to determine at least one attribute relating to at least one identified suspected misaligned probe or socket contact; and an evaluator operable to evaluate the at least one attribute in order to decide whether or not a misalignment indication condition has been, met and misalignment is to be indicated.

According to some embodiments of the invention, there is also provided a system for deciding to indicate misalignment, comprising: a suspected misaligned probe identifier operable to identify suspected misaligned probes; an attribute determiner operable to determine at least one attribute including operable to perform a spatial analysis in order to determine at least one position attribute which quantifies placement of a plurality of the suspected misaligned probes with respect to an area on one or more wafers; and a misprobe evaluator operable to evaluate at least one of the at least one determined attribute including at least one of the at least one determined position attribute in order to decide whether or not a misalignment indication condition has been met and misalignment is to be indicated.

According to some embodiments of the invention, there is further provided a method of deciding to indicate misalignment, comprising: identifying at least one suspected misaligned probe or socket contact based at least partly on examination of a test data collection, including analyzing at least one group of a plurality of parametric test measurements whose values are sensitive to misalignment; determining at least one attribute relating to at least one identified suspected misaligned probe or socket contact; and evaluating the at least one attribute in order to decide whether or not a misalignment indication condition has been met and misalignment is to be indicated.

According to some embodiments of the invention, there is provided a method of deciding to indicate misalignment, comprising: identifying suspected misaligned probes; determining at least one attribute including performing a spatial analysis in order to determine at least one position attribute which quantifies placement of a plurality of the suspected misaligned probes with respect to an area on one or more wafers; and evaluating at least one of the at least one determined attribute including at least one of the at least one determined position attribute in order to decide whether or not a misalignment indication condition has been met and misalignment is to be indicated.

According to some embodiments of the invention, there is also provided a system comprising: a suspected misaligned identifier operable to identify at least one suspected misaligned probe or socket contact based at least partly on examination of a test data collection, including analysis of at least one group of a plurality of parametric test measurements whose values are sensitive to misalignment.

According to some embodiments of the invention, there is further provided a system comprising: an attribute determiner operable to determine at least one attribute including being operable to perform a spatial analysis in order to determine at least one position attribute which quantifies placement of a plurality of identified suspected misaligned probes with respect to an area on one or more wafers.

According to some embodiments of the invention, there is provided a computer program product comprising a computer useable medium having computer readable program code embodied therein for deciding to indicate misalignment, the computer program product comprising: computer readable program code for causing the computer to identify at least one suspected misaligned probe or socket contact based at least partly on examination of a test data collection, including analyzing at least one group of a plurality of parametric test measurements whose values are sensitive to misalignment; computer readable program code for causing the computer to determine at least one attribute relating to at least one identified suspected misaligned probe or socket contact; and computer readable program code for causing the computer to evaluate the at least one attribute in order to decide whether or not a misalignment indication condition has been met and misalignment is to be indicated.

According to some embodiments of the invention, there is also provided a computer program product comprising a computer useable medium having computer readable program code embodied therein for deciding to indicate misalignment, the computer program product comprising: computer readable program code for causing the computer to identify suspected misaligned probes; computer readable program code for causing the computer to determine at least one attribute including performing a spatial analysis in order to determine at least one position attribute which quantifies placement of a plurality of the suspected misaligned probes with respect to an area on one or more wafers; and computer readable program code for causing the computer to evaluate at least one of the at least one determined attribute including at least one of the at least one determined position attribute in order to decide whether or not a misalignment indication condition has been met and misalignment is to be indicated.

BRIEF DESCRIPTION OF THE DRAWINGS

In order to understand the invention and to see how it may be carried out in practice, some embodiments will now be described, by way of non-limiting example only, with reference to the accompanying drawings, in which:

FIG. 5A shows a histogram of the cumulative CRES measurements for one pin over 70 touchdowns or socketings using the data from FIG. 4 and also shows a corresponding likelihood ratio, according to some embodiments of the disclosed subject matter;

FIG. 5B shows a histogram of the cumulative CRES measurements for one pin over 90 touchdowns or socketings using the data from FIG. 4 and also shows corresponding likelihood ratio, according to some embodiments of the disclosed subject matter;

FIG. 5C shows a histogram of the cumulative CRES measurements for one pin over 110 touchdowns or socketings using the data from FIG. 4 and also shows a corresponding likelihood ratio, according to some embodiments of the disclosed subject matter;

FIG. 8A is a histogram of the combined dataset for the three pins from FIG. 4 for the first 70 touchdowns or socketings, according to some embodiments of the disclosed subject matter;

FIG. 8B is a histogram of the combined dataset for the three pins from FIG. 4 for touchdowns or socketings 71 to 122, according to some embodiments of the disclosed subject matter;

FIG. 8C is a histogram of the combined dataset for the three pins from FIG. 4 for touchdowns or socketings 123 to 170, according to some embodiments of the disclosed subject matter;

FIG. 11 is a chart of probe misalignment in the X or Y direction for a probe array, where the misalignment values by probe location are random, according to some embodiments of the disclosed subject matter;

FIG. 12 is a chart of probe misalignment in the X or Y direction for a probe array, where the misalignment values by probe location are not random, according to some embodiments of the disclosed subject matter;

FIG. 15 shows cumulative binomial probabilities corresponding to the templates of FIG. 13, according to some embodiments of the disclosed subject matter;

FIG. 16 shows cumulative binomial probabilities corresponding to the templates of FIG. 14, according to some embodiments of the disclosed subject matter;

DETAILED DESCRIPTION OF EMBODIMENTS

Figure 1A:
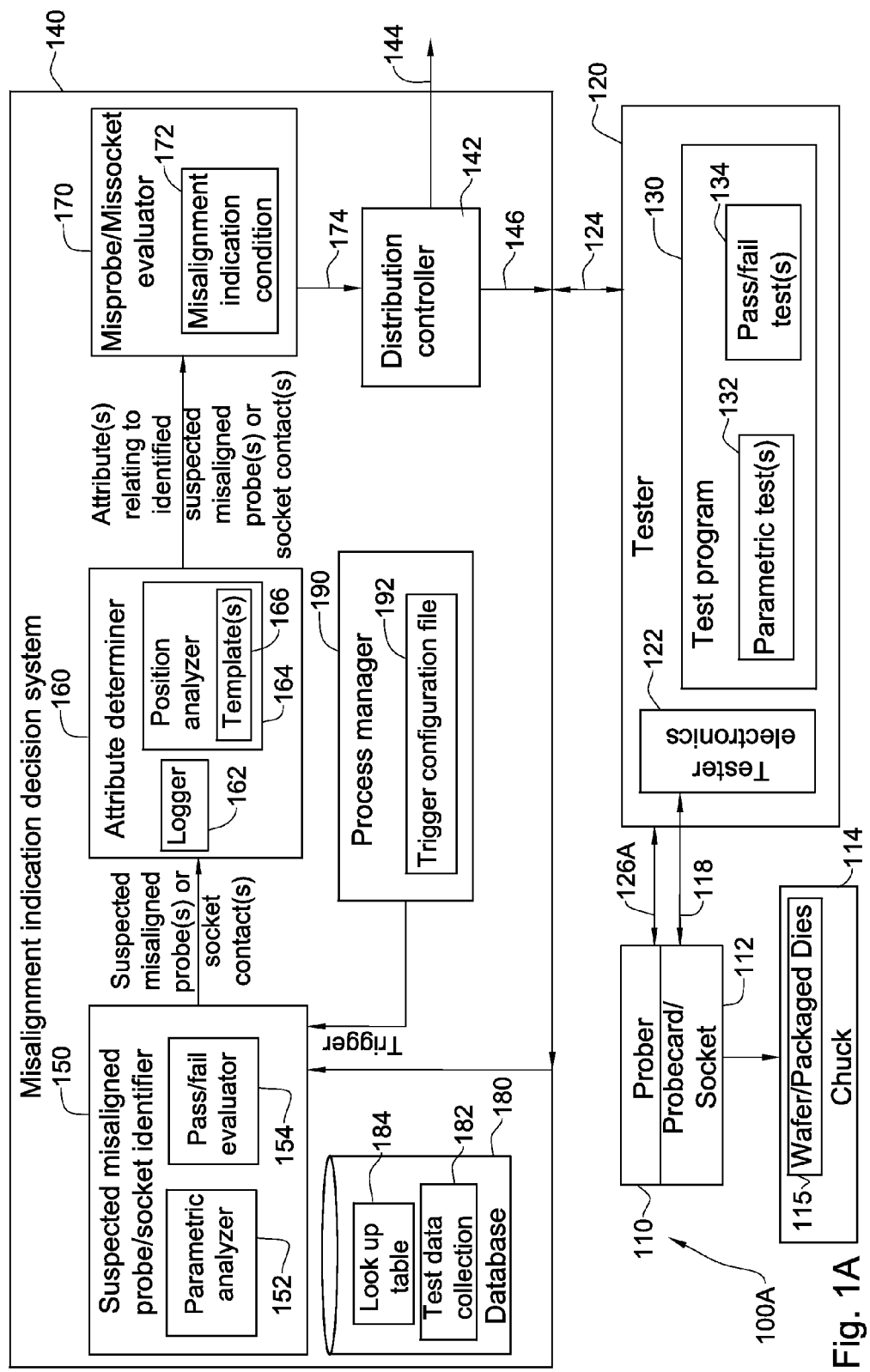
FIG. 1A shows a wafer testing system, according to some embodiments of the disclosed subject matter.

Described herein are some embodiments for deciding whether or not to provide an indication of misalignment. Hereinbelow, unless expressly stated otherwise, the term misalignment refers to probe-to-pad misalignment or to socket contact-to-pin misalignment, as appropriate.

In some of the embodiments discussed below, the terms "misalignment", "misaligned probe(s)", "misaligned socket contact(s)", "suspected misaligned probe(s)", "suspected misaligned socket contact(s)" and variants thereof are variously used to refer to failure (or suspected failure) in achieving the desired relative alignment of bondpad(s) to probe(s) or package pin(s) to socket contact(s). These terms should therefore be construed to include embodiments where the misalignment is due (or the suspected misalignment may be due) to incorrect positioning of bondpad(s)/package pin(s) and/or due or to incorrect positioning of probe(s)/socket contact(s).

Some embodiments of the invention refer to contact resistance testing but do not limit implementation of contact resistance testing. In various embodiments, contact resistance measurements can refer to actual measurements of resistance, or corresponding measurements of voltage or current in which resistance is implied/derived from known test conditions. An ideal implementation of contact resistance testing is given in Microelectronics Reliability 47 (2007), titled "Measurement and Analysis of Contact Resistance in Wafer Probe Testing", by D. S. Liu, M. K. Shih, and W. H. Huang, which describes measurements made with a low resistance voltage-current meter, such as ADEX model AX 115A with the meter set to the 1 ohm scale, giving a measurement range of 0.0-1.5 ohm with a resolution of 100 micro ohms under a measurement current of 100 mA. In the described implementation measurements are made between a clean tungsten probe and various specimen surfaces (such as a sheet of copper foil), providing an idealized environment for the measurements. In such an embodiment, contact resistances with typical nominal values less than ~1 ohm may easily be resolved. In some of the embodiments that will be described below, by contrast, measurement is made in-situ while probing wafer bondpads, or contacting packaged device leads, during VLSI chip manufacturing test operations. Measurements in such embodiments could be made using digital voltage-current meter resources of tester 120, sometimes in the form of an integrated Parametric Measurement Unit (PMU). However other implementations are additionally or alternatively possible depending on the embodiment. Additionally, in embodiments involving in-situ contact resistance measurements during manufacturing test operations, there may be parasitic electrical elements in the current path that result in deviation from the ideal measurement environment described by D. S. Liu et al, typically seen even under DC test conditions. For example, in the path of current generated from a tester PMU current source, routed through the test system fixturing to the device bondpad or external package lead, there may be long runs of wire and PC board traces as well as electronic relays that add resistance to that current path segment. From the device bondpad or external package lead under bias, current then flows through internal device circuitry, which frequently includes one or more diodes in the current path and additional path resistance. Finally, in the current's return path to the tester, the current flows from the device to tester ground or power supplies, again via test system fixturing that includes additional resistive elements. "2-Point" resistance measurement embodiments (performed by forcing a known current level into a probe or package lead while measuring the resulting voltage level), are well known to those with ordinary skill in the art. A brief description may be referenced, for example, in the proceedings of the March 2003 Burn-In and Test Socket Workshop, in the presented paper "A Method for Measuring and Evaluating Contact Resistance in Burn-in and Test Sockets", by Angelo Giaimo. The specific bias conditions of any given measurement will depend on the various factors above, and will vary depending on the embodiment. For example, if driving current into a given bondpad or package lead requires forward-biasing a diode internal to the device-under-test, then sufficient current must be supplied by the tester PMU to drive the diode above its turn-on voltage, while if no such internal diode is present (for example, if the bondpad or package lead being driven is used as device "ground"), then a lower current level and voltage measurement may be applied. As may be seen in this last example, within any given test program for any given device, measurement conditions may be varied according to pin type. Since the resistance measurements unavoidably include not only the contact resistance but also the resistive parasitic elements in the current path described above, the resulting values may be much higher than in an ideal case—in some embodiments in the range of 200 ohms to 1,500 ohms. In the description below, in order to facilitate the reader's interpretation of the various examples and figures disclosed below, the extraneous (non-contact-related) resistive components described here have been excluded from the illustrative resistance measurement values given, and idealized values of contact resistance are instead used in the figures and examples In some embodiments, an analysis of parametric data relating to tests sensitive to misalignment is performed in order to determine which data is incongruous and to identify corresponding probes or socket contacts as suspected misaligned.

In some embodiments, additionally or alternatively, a spatial analysis quantifies the placement of a set of identified suspected misaligned probes, which were identified from pass/fail test data and/or parametric test data, with respect to a contiguous or non-contiguous area on one or more wafers. These embodiments as well as additional and/or alternative embodiments are described below.

It is noted that there are many styles of probecards and many types of probe technologies in use, and that the embodiments described herein are not limited to any particular type of probecard or probe technology. A variety of bondpad structures also exist, ranging from simple planar bondpads to bondpads processed with "bumps", and the embodiments described herein are not limited to any particular bondpad style. Similarly, there are many types of test sockets/loadboards and many types of package types and handlers and the embodiments described herein are not limited to any particular type of test socket/loadboard, package type or handler. A variety of forms and structures of package pins, and sockets contacts also exist, for example varying with package type, and the embodiments described herein are not limited to any particular form/structure of package pin or socket contact.

In the following detailed description, numerous specific details are set forth in order to provide a thorough understanding of the invention. However, it will be understood by those skilled in the art that the present invention may be practiced without these specific details. In other instances, well-known methods, procedures and components have not been described in detail so as not to obscure the present invention.

As used herein, the phrase "for example," "such as", "for instance" and variants thereof describe non-limiting embodiments of the present invention.

Reference in the specification to "one embodiment", "an embodiment", "some embodiments", "another embodiment", "other embodiments", "one instance", "some instances", "one case", "some cases", "other cases" or variants thereof means that a particular feature, structure or characteristic described in connection with the embodiment(s) is included in at least one embodiment of the invention. Thus the appearance of the phrase "one embodiment", "an embodiment", "some embodiments", "another embodiment", "other embodiments" one instance", "some instances", "one case", "some cases", "other cases" or variants thereof does not necessarily refer to the same embodiment(s).

It should be appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Unless specifically stated otherwise, as apparent from the following discussions, it is appreciated that throughout the specification discussions utilizing terms such as "receiving", "determining", "obtaining", "triggering", "causing", "executing", "allowing", "using", "recognizing", "handling", "managing", "inserting", "replacing", "preparing", "providing", "storing", "deciding", "indicating", "identifying", "examining", "analyzing", "evaluating", "distributing", "quantifying", "comparing", "mapping", "performing", "producing", "probing", "generating", "socketing", "unsocketing", "testing" or the like, refer to the action and/or processes of any combination of software, hardware and/or firmware. For example, these terms may refer in some cases to the action and/or processes of a programmable machine, that manipulates and/or transforms data represented as physical, such as electronic quantities, within the programmable machine's registers and/or memories into other data similarly represented as physical quantities within the programmable machine's memories, registers or other such information storage, transmission or display elements.

Figure 1B:
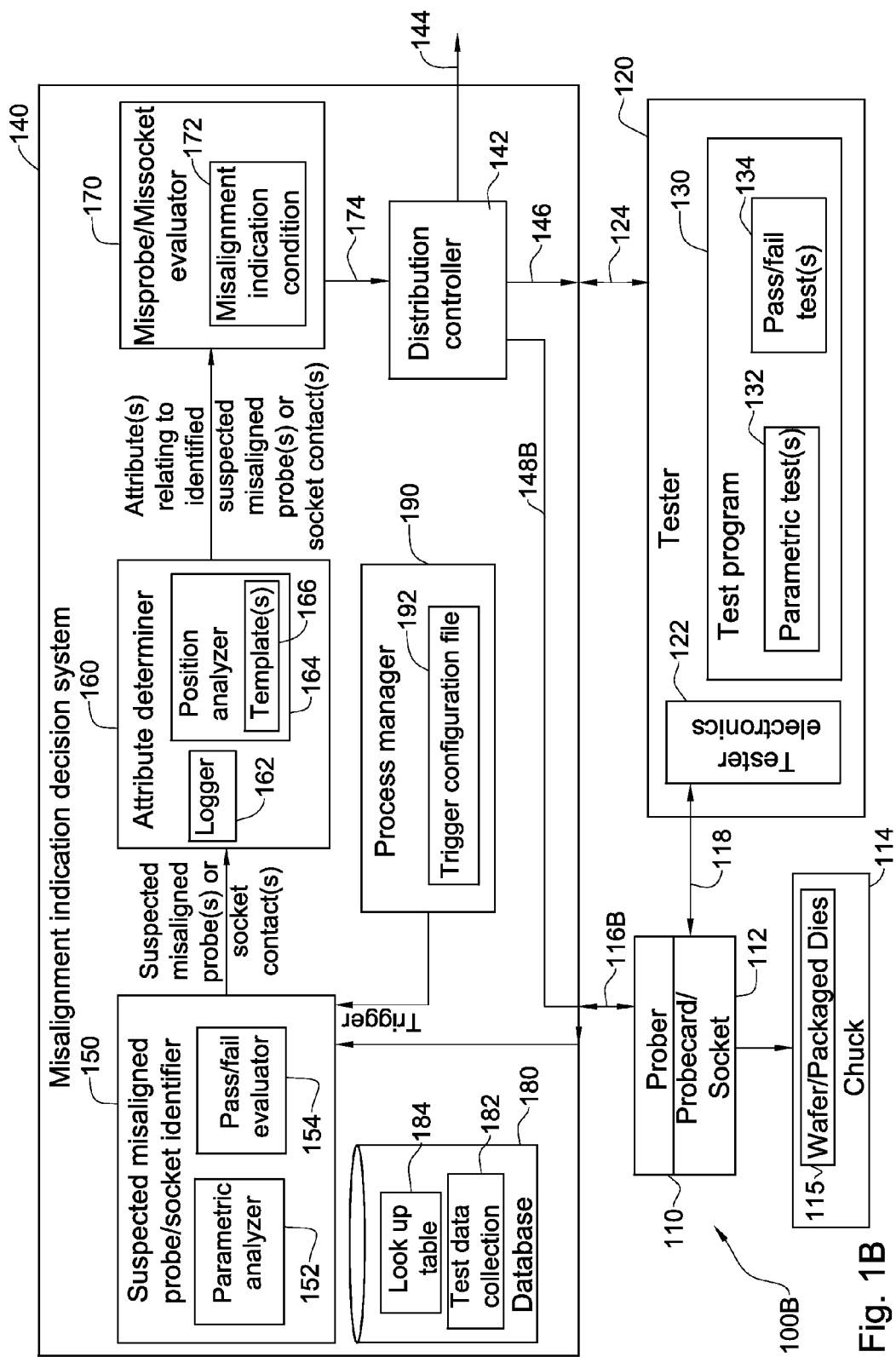
FIG. 1B shows a wafer testing system, according to some other embodiments of the disclosed subject matter.

Referring now to the figures in more detail, some embodiments of a wafer testing system are illustrated in FIGS. 1A and 1B. For simplicity's sake, in the description herein a module or arrow is labeled with a number and the letter A or B when referring specifically to the module or arrow in FIG. 1A and FIG. 1B respectively. However a module or arrow is labeled with only a number when referring to the module in either FIG. 1A or 1B and/or in both FIGS. 1A and 1B. FIG. 1A illustrates a wafer testing system 100A and FIG. 1B illustrates a wafer testing system 100B, according to various embodiments of the present invention. In the illustrated embodiments, wafer testing system 100 (e.g. system 100A and/or 100B) is configured to test semiconductor wafers.

In the illustrated embodiments, wafer testing system 100 comprises a tester 120 configured to test dies on a wafer 115, a misalignment indication decision system 140 configured to make a decision on whether or not to indicate misalignment, and a prober 110 configured to contact probes on a probecard 112 with bondpads on a wafer 115, for example by moving a wafer chuck 114 on which wafer 115 is mounted.

In various embodiments of the invention, any of the modules in FIGS. 1A and 1B may be made up of any combination of software, hardware and/or firmware that performs the functions as described and explained herein. In some embodiments, wafer testing system 100A and/or 100B may include fewer, more and/or different modules than shown in FIG. 1A and FIG. 1B respectively. For example, in some of these embodiments, some or all of tester 120 and misalignment indication decision system 140 may be integrated together. In some embodiments, the functionality of wafer testing system 100A and/or 100B may be divided differently than illustrated among the modules illustrated in FIG. 1A and FIG. 1B respectively. In some embodiments, wafer testing system 100 may include additional, less, and/or different functionality than described herein.

In the illustrated embodiments of wafer testing system 100A, misalignment indication decision system 140 and tester 120 communicate with one another via a channel 124, and tester 120 and prober 110 communicate with one another via a channel 126A. In the illustrated embodiments of wafer testing system 100B, misalignment indication decision system 140 communicates with tester 120 via channel 124, and misalignment indication decision system 140 communicates with prober 110 via a channel 116B.

In some embodiments, the communication between prober 110 and other modules of system 100 (for example with tester 120 in FIG. 1A via channel 126A, or with misalignment indication decision system 140 in FIG. 1B via channel 116B) may occur, in some cases, via any suitable channel including inter-alia: parallel digital communication, RS-232 serial communication, a Transmission Control Protocol/Internet Protocol TCP/IP network, a GPIB bus (General Purpose Interface Bus), also known as a IEEE-488 or HP-IB bus (Hewlett-Packard Instrument Bus), a Universal Serial Bus (USB), an IEEE 1394 Interface, any appropriate channel using high-speed electronic communication technology, etc.

In some embodiments, the communication between misalignment indication decision system 140 and tester 120, assuming different units, is via any suitable channel 124 including inter-alia a local area network such as an Ethernet connection with a network protocol (e.g.TCP/IP), a Universal Serial Bus (USB), an IEEE 1394 Interface, any appropriate channel using high-speed electronic communication technology, etc.

In the illustrated embodiments, tester 120 applies electronic test sequences to the die or dies being tested in the current touchdown (also known as devices under test DUTs) through a test program 130. Test program 130 digitally controls tester electronics 122 for generating physical test signals, such as pin electronics cards, pattern generator boards, power supplies, and the like, to drive test signals and to provide power to all probes in the probe array on probe card 112. Depending on the embodiment, tester 120 may support testing of multiple dies in parallel and/or testing each die sequentially.

In the illustrated embodiments, specification of the test content, for example the desired signal transition timing, voltage or current levels, pass/fail criteria, vector/data pattern selection, vector/data pattern sequences, test subroutine and pattern content, test flow sequencing and branching, etc. is made through compiled or linked files constituting test program 130, created for example using custom tester-specific programming languages and a library of application programming interface (API) functions. In the illustrated embodiments; the test content of test program 130 includes pass/fail test(s) 134 and/or parametric test(s) 132. A pass/fail test 134 is a single-valued test which yields a single valued result indicating whether or not the tested value is greater than (or in other testing less than) a given value/limit. If the tested value is greater than (or less than) the given limit, the single valued result is "failure", but if not then the single valued result is "pass". A parametric test 132 yields a resulting measurement that can take on any of multiple values. Depending on the implementation, the resulting measurement value for a particular parametric test 132 may be provided by analog measurement equipment (as part of testing electronics 122), or may be honed in through the performance of a plurality of single valued tests. As an example of the latter implementation, a series of single valued tests may be performed, in which the given value/limit is repeatedly varied until determination of a range of the actual measurement value to within the desired resolution. In some embodiments, parametric test(s) 132 include at least one or more different parametric tests whose resulting measurement values are sensitive to misalignment between probe(s) on probecard 112 and pad(s) on the die(s) in wafer 115 which are undergoing testing. In some embodiments, additionally or alternatively, pass/fail test(s) 134 include at least one or more different pass/fail tests whose results are sensitive to misalignment between probe(s) on probecard 112 and pad(s) on die(s) in wafer 115 which are undergoing testing.

In some embodiments, commercially available testers used for electronic device testing operations today, along with their operating systems, may be adapted to become tester 120. As an example, the Verigy HP93K tester or the Teradyne J750 tester may be considered typical of such commercially available systems.

In the illustrated embodiments, tester electronics 122 are electrically connected to the traces of probecard 112 while the probes in the probe array of probecard 112, for example in the format of tungsten needles, make temporary contact to the surface of bondpads of one or more dies of wafer 115 currently being tested. The probes provide a mechanical and electrical interface through which electrical signals and power supply voltages are applied to the device during testing, and also pass voltage responses from the device back to the tester for evaluation, for example via tester-probecard signal(s) 118. Probecard 112 may have as many as several thousand probes attached for testing, which may span an area of several centimeters.

In some embodiments, it is assumed that after probecard 112 has been mounted on prober 110 but prior to beginning wafer testing, for instance a wafer sort operation, optical and/or electrical procedures are used to try to align the probe array of probecard 112 in the X, Y, Z and/or theta dimensions. For example, in some of these embodiments, an automated or semi-automated procedure may be performed to optically align the individual probe tips to bondpads (through recognition and alignment with features visible under high magnification at the surface of the wafer). Additionally or alternatively, for example, in some of these embodiments an automated or semi-automated procedure may be performed to electrically align the individual probe tips to bondpads. For instance, contact pressure may be deliberately controlled by prober 110 overdrive, setting the probe tips of the probe array of probecard 112 in the Z dimension somewhat below the plane of the bond pad surface to ensure good contact. As the overdrive setting is increased, the contact resistance will initially decrease, and then level off to a nominal low contact resistance value. This relationship is well known to those familiar with the art. In some cases, any of the alignment procedures can include moving individual probe(s) on probecard 112 (prior to mounting probecard 112), moving the entire probecard 112, moving chuck 114 and/or moving any other prober fixture used to hold probecard 112 and/or chuck 114 in place. In embodiments where optical and/or electrical procedures are used to try to align the probe array of probecard 112, it is assumed that if probecard 112 was previously constructed and adjusted properly prior to mounting on prober 110, then at the conclusion of alignment procedures, the probes should be aligned to bondpads and testing can begin.

In some embodiments, each probe tip should be precisely positioned within the XY plane of the wafer surface, corresponding to the location of an associated bondpad, should also be positioned properly in the Z dimension such that the tips of all the probes are within the same plane when the wafer is being contacted for testing, and should also be rotationally aligned. In some of these embodiments, good electrical contact between probes and bondpads can only be achieved when the tips of each of these probes are positioned within a few micrometers of the centers of the associated bondpads while also being correctly positioned in the Z and theta dimensions. In some of these embodiments, maintaining the correct alignment of each one of the thousands of probes involved without error or adjustment, while stepping across the surface of hundreds of successive wafers in a semiconductor manufacturing wafer testing operation is challenging.

In the illustrated embodiments, misalignment indication decision system 140 includes a suspected misaligned probe identifier 150 configured to identify suspected misaligned probe(s), an attribute determiner 160 configured to determine one or more attributes relating to identified suspected misaligned probe(s), a misprobe (AKA suspected misaligned probe) evaluator 170 configured to evaluate the attribute(s) to decide whether or not a condition for indicating misalignment has been met and misalignment is to be indicated. In some embodiments, misalignment indication decision system optionally also includes a distribution controller 142 configured to distribute a misalignment indication, a database 180 configured to store a test data collection and/or a look up table, and/or a processor manager 190 configured to control the operation of one or more of the modules in misalignment indication decision system 140. Any of the modules in misalignment indication decision system 140 may be made up of any combination of software, hardware and/or firmware that performs the functions as described and explained herein. In some embodiments, misalignment indication decision system 140 may comprise a machine specially constructed for the desired purposes, and/or may comprise a programmable machine selectively activated or reconfigured by specially constructed program code. In some embodiments, misalignment indication decision system 140 includes at least some hardware.

In some embodiments, misalignment indication decision system 140 may include fewer, more and/or different modules than shown in FIG. 1A and FIG. 1B. For example, in some of these embodiments, part or all of database 180 may be separated out of misalignment indication decision system 140 (for example included instead in tester 120 or in a separate unit), or may be omitted. As another example, in some embodiments, suspected misaligned probe identifier 150 may be separated out of misalignment indication decision system 140. As another example, in some embodiments, attribute determiner 160 (or just a position analyzer 164 part) may be separated out of misalignment indication decision system 140. For instance, in some embodiments there may be advantages to the identification provided by suspected misaligned probe identifier 150 and/or the position attribute analysis provided by attribute determiner 160/position analyzer 164 even when separated from the functionality of the remainder of system 140. In some embodiments, the functionality of misalignment indication decision system 140 may be divided differently than illustrated among the modules illustrated in FIG. 1A and FIG. 1B. In some embodiments, misalignment indication decision system 140 may include additional, less, and/or different functionality than described herein. For example misalignment indication decision system 140 may include additional functionality relating to testing and/or support functionality for additional modules such as computer terminals, networked test program servers, and/or networked data storage systems.

In the illustrated embodiments, test data collection 182 is shown stored in database 180 but in some embodiments some or all of test data collection 182 is made accessible to identifier 150 without being stored in database 180 or without being stored at all. Test data collection 182 includes test results from parametric tests 132 and/or pass/fail tests 134 relevant to a current decision on whether or not to indicate misalignment (for example results of parametric and/or pass fail tests which are sensitive to misalignment). For pass/fail tests, only failing results may be included in test data collection 182 or both passing and failing results may be included.

Embodiments of the current invention do not limit test data collection 182. However for the sake of further illustration to the reader, some examples will now be presented. Examples of test data collection include inter-alia: data over a plurality of touchdowns for a single probe, data over a plurality of touchdowns for selected probe(s), data over a plurality of touchdown for probe(s) previously identified as suspected misaligned, data over a plurality of touchdowns for all probes, data from a single touchdown for selected probes, data from a single touchdown for all probes, etc. Depending on the embodiment, a plurality of touchdowns may refer to selected touchdowns within a wafer, selected touchdowns within a plurality of wafers in a lot, selected touchdowns within a plurality of wafers in multiple lots, all touchdowns within a wafer, all touchdowns within a lot, all touchdowns within a plurality of lots, etc.

In some embodiments, the scope of test data collection 182 varies depending on the type of misalignment indication decision to be made based on that test data collection. For example, if looking for variation within touchdown, for instance due to individual misaligned probes, then in some cases a particular test data collection 182 may include data from a single touchdown. As another example, if looking for variation between touchdowns, for instance due to drift in one or more directions, then in some cases a particular test data collection may include data from a plurality of touchdowns. As another example, if looking for variation within wafer 115, for instance due to tilt of probecard 112 and/or chuck 114, then in some cases a particular test data collection 182 may include data from a plurality or all touchdowns in wafer 115.

Depending on the embodiment, the extent of test data collection 182 may be defined a-priori or may be dynamic. For example, assume that n identified suspected misaligned probes (n≥1) are required in order to make a useful misalignment indication decision. In this example, test data collection 182 needs to include sufficient test data to allow the identification of at least n suspected misaligned probes. However, since the amount of data which would be sufficient to allow identification of at least n suspected misaligned probes is not known a-priori, the extent of test data collection 182 may either be dynamic based on the real time identification, or may be predefined to be sufficiently large so that identification of n suspected misaligned probes (n≥1) is sufficiently probable to meet the demands of the implementation. In another example, there may not be a requirement for n identified suspected misaligned probes (n≥1) nor any other requirements which cannot be determined a-priori, and therefore in this example, the extent of test data collection 182 may be predefined. In another example, if in a previous misalignment indication decision certain probe(s) were identified as suspected misaligned but the decision was not to indicate misalignment, then test data collection(s) 182 used for subsequent misalignment indication decisions may focus on data relating to those probe(s) identified as suspected misaligned. Similarly, in this example, current test data collection 182 may additionally or alternatively be reduced as needed while identification of suspected misaligned probes continues, in order to focus on data relating to probes identified as suspected misaligned. In this example, the extent of a particular test data collection 182 may therefore be dynamically changed based on the identity of previously identified suspected misaligned probes. In another example, the extent of a particular test data collection 182 may be dynamically changed if a previous misalignment indication decision was borderline, in order to allow for a more conclusive misalignment indication decision.

It is noted that depending on the embodiment, only one test data collection 182 may be accessible at a time, or a plurality of test data collections 182 (each relevant for a different instance of a misalignment indication decision) may be accessible at a time. In cases where a plurality of test data collections 182 are accessible at a time, the plurality may be accessed in parallel in order to make parallel misalignment decisions, or the plurality may not be accessed at the same time. Assuming test data collection 182 is stored on database 180 then depending on the embodiment, database 180 may include only one data collection 182 at a time or may include a plurality of data collections concurrently. Assuming different test data collections 182 during the life of system 100 (which may or may not be accessible at the same time), then depending on the embodiment, each data collection (which is used in a different decision on whether or not to indicate misalignment) may include a unique set of data, or each data collection does not necessarily include a unique set of data.

As an example of the latter embodiment, assuming each test data collection includes data from a plurality of touchdowns, each data collection may include data relating to distinct touchdowns or two or more data collections may include data relating to at least one of the same touchdown.

In some embodiments of test data collection 182, corresponding bondpads for test results are apparent. For example, in some embodiments in wafer testing system 100A, prober 110 may transfer identification data of the die or dies currently being tested to tester 120, for example die XY coordinates relating to the die position within wafer 115, and optionally other identification data such as lot number, wafer 115 number, etc. may also be provided to tester 120. In these embodiments tester 120 integrates test results with identification data so that the test results, identified by identification data, can become part of test data collection 182. As another example, in some embodiments of wafer testing system 100B, misalignment indication decision system 140 controls synchronization of testing and probing and therefore is aware of identification data of the die or dies currently being tested, for example die XY coordinates relating to the die position within wafer 115, and optionally lot number, wafer 115 number, etc. Misalignment indication decision system 140 can therefore integrate identification data with test results received from tester 120 so that the test results, identified by identification data, can become part of test data collection 182. In various embodiments of either of the latter two examples, corresponding bondpads for test results may be apparent because the test results are arranged in test data collection 182 in a manner in which the corresponding bondpad is evident (for example in consecutive order by bondpad number), and/or because the corresponding bondpad is explicitly indicated for each result.

In some embodiments, additionally or alternatively, test data collection 180 includes data obtained from initial setup procedure(s) prior to testing, for example from initial optical and/or electrical alignment.

In the illustrated embodiments, database 180 additionally or alternatively includes a look up table 184 or an equivalent correspondence module which associates bondpads with probe array coordinates. For example, in some cases look up table 184 comprises any convenient system readable file format (such as American Standard Code for Information Interchange ASCII) that includes information indicating which bondpad corresponds to which probe. Continuing with the example, in some of these cases, the correspondence may state that data from a certain bondpad on a die with particular X coordinate and given Y coordinate corresponds to a specific probe in the probe array. Depending on the embodiment, a probe may correspond to any number of bondpads on wafer 115. For example, a probe in some embodiments may correspond to the same number of bondpads as there are touchdowns in wafer 115. Depending on the embodiment, look up table 184 may be the same or may vary with test data collection 182. In some other embodiments, look up table 184 is included elsewhere in misalignment indication decision system 140. In some other embodiments, the correspondence between bondpads and probes is hardcoded.

In some embodiments, look up table 184 includes entries relating to various products tested by wafer testing system 100, and for each product that is tested table entries relating to that product are referenced. In some other embodiments, each product that is tested by wafer testing system 100, has a unique associated look up table, or is uniquely hardcoded.

In some embodiments, look up table 184 includes other useful product specific information such as bondpad electrical and/or physical characteristics including for example bondpad size/dimensions, bondpad layout and/or bondpad structure, etc. Additionally or alternatively, in some of these embodiments look up table 184 includes useful probecard information such as physical characteristics of probes. For example, in some cases such product and/or probecard specific information may be used as a basis for grouping data for common analysis (see for example description of stage 250 below) and/or for defining template(s) 166 (see for example description of template(s) 166 below). In some other embodiments such product and/or probecard specific information is included in a separate lookup table which does not include bondpad-probe correspondence. In some other embodiments, such product and/or probecard specific information is not used in deciding whether or not to indicate misalignment or such product and/or probecard specific information is hardcoded.

In some embodiments database 180 may additionally or alternatively include other data, for example test data irrelevant to misalignment, etc.

Optionally, suspected misaligned probe identifier 150 includes a parametric analyzer 152 configured to analyze parametric data in test data collection 182 relating to misalignment and/or a pass/fail evaluator 154 configured to evaluate pass/fail data in test data collection 182 relating to misalignment. In some embodiments with suspected parametric analyzer 152, the analysis relates to determining whether or not there is data incongruity, as will be discussed in more detail below.

Optionally attribute determiner 160 includes a logger 162 configured to log (non-position) attribute(s) relating to suspected misaligned probe(s). For example logger 162 may log any of the following inter-alia: incidence (e.g. number of times) that a particular probe is identified as suspected misaligned; the "badness" (explained further below) of a particular suspected misaligned probe; incongruous parametric data; the total number of and/or fraction of identified suspected misaligned probe(s) within the probe array; the likelihood ratio (e.g. as described in FIG. 3); tested die, tested touchdown, location of tested touchdown in wafer, and/or tested wafer during which a particular probe was identified (each time) as suspected misaligned (enabling for instance independent computation of incidence per touchdown location); statistical values derived from incongruous testing data; parametric congruous testing data (for example in order to provide a contrast); electrical functionality of bondpad corresponding to particular identified suspected misaligned probe; unusual physical characteristic of bondpad corresponding to particular identified suspected misaligned probe and/or unusual physical characteristic of particular identified suspected misaligned probe; statistical values derived from congruous testing data; statistical values derived from testing data of all probes (both those identified as suspected misaligned and those not so identified); change in any of the above as a function of touchdown iteration, number of touchdowns since the last probecard clean operation, touchdown index and/or touchdown identity; trend etc. In various embodiments, statistical values can include any appropriate statistical value such as for example, mean, median, maximum, minimum, standard deviation and/or rolling average, etc.

Optionally, additionally or alternatively, attribute determiner 160 includes a position analyzer 164 configured to determine a position attribute of probe(s) identified as suspected misaligned. In some cases, position analyzer 164 includes one or more templates 166 in order to facilitate the determination of position attribute(s), where each template 166 represents a contiguous or non-contiguous area on one or more wafer(s) 115. The scope of the contiguous or non-contiguous area "on one or more wafer(s)" is not limited by embodiments of the invention but for the sake of further illustration to the reader some examples are now given. Examples of embodiments where the contiguous or non-contiguous area is on one or more wafer(s) include: where the area is on part of one wafer, where the area is on all of one wafer, where the area is on part of each of two or more wafer(s), where the area is on all of one wafer and on part of one or more other wafer(s), where the area is on all of two or more wafers, where the area is on two or more wafers and on part of one or more other wafer(s), etc. When reference is made below to an area on one or more wafer(s), it should be understood that the area may be contiguous or non-contiguous as appropriate in various embodiments, unless explicitly stated otherwise. Depending on the embodiment of these cases, each template 166 may be of any shape, size and position.

In some embodiments with templates 166, each template 166 consists of any convenient system readable file format that contains information assigning probes to region(s) of the template. In some embodiments, each template may include one or more defined regions. Any useful and physically meaningful regions may be defined. Depending on the embodiment, the number of probes assigned to each region (assuming two or more regions) may or may not be identical. Depending on the embodiment, there may or may not be different templates for different anticipated misalignment problems. For example, if there are different templates for different anticipated misalignment problems, then in some cases different template(s) may be designed to highlight a rotational alignment problem (say, a probecard with an angular offset with respect to the wafer's X and Y axes) rather than a Z alignment problem (say, a probecard with a tilt in the plane of the probe-tips of the probe array with respect to the wafer's XY plane). As another example, if there are different templates for different anticipated misalignment problems, then in some cases different template(s) may be designed to highlight a misalignment problem particular to probes with specific physical characteristics and/or particular to probes corresponding to bondpads with specific physical and/or electrical characteristic(s), rather than to highlight a misalignment problem unrelated to probe and/or bondpad physical and/or electrical characteristic(s).

As mentioned above, each template 166 represents a contiguous or non-contiguous area on one or more wafer(s) 115. In some embodiments each template 166 represents a touchdown and therefore each probe in the probe array is assigned as a member of one of the region(s) of the template.

In other embodiments, there may be additionally or alternatively, one or more templates 166, to each of which are assigned a smaller number of probes, larger number of probes and/or different probes than in the probe array. For example even in the case of a touchdown with a plurality of dies, a template may represent a die, and therefore only those probes in the probe array corresponding to that die are assigned to region(s) of the template. As another example, additionally or alternatively a template may represent some but not all dies in a touchdown and therefore only those probes in the probe array corresponding to those dies are assigned to region(s) of the template. As another example, additionally or alternatively, a template may represent a wafer, and therefore (assuming multiple touchdowns per wafer) probes in the probe array are assigned multiple times to region(s) of the template. As another example, additionally or alternatively, a template may represent part or all of multiple wafers, and therefore some or all of the probes in the probe array are assigned multiple times to region(s) of the template. As another example, additionally or alternatively, a template may represent only some of the bondpads on a die and therefore only those probes in the probe array corresponding to those bondpads are assigned to region(s) of the template. As another example, additionally or alternatively, each region of a template with two or more regions, does not necessarily represent contiguous bondpads. For instance in some cases each region of the template may represent not necessarily contiguous bondpads with particular physical/electrical characteristics or which correspond to probes with particular physical characteristics. Continuing with these cases, assume embodiments where a probe array includes probes of varying lengths with the longer probes tending to exhibit greater variation in hitting the intended bondpads than the shorter probes. In some of these embodiments a template may be defined which is comprised of regions, with each region representing non-contiguous bondpads corresponding to either long or short probes.

Depending on the embodiment, there may or may not be different templates 166 for different types of data. For example in embodiments where a template represents a touchdown, there may or may not be different templates 166 for different touchdowns on wafer 115. In this example if there are different templates for different touchdowns, then in some cases the defined region(s) and probe membership by region may be defined differently for templates corresponding to different touchdowns on wafer 115. As another example, in embodiments where a template represents a die, there may or may not be different templates 166 for different dies. Similar examples would correspond to templates representing other types of areas.

In the illustrated embodiments, misprobe evaluator 170 includes misalignment indication condition 172 so that misprobe evaluator 170 can evaluate attribute(s) determined by attribute determiner 160, singly and/or in combination, and decide whether or not a misalignment indication condition has been met. Depending on the embodiment, condition 172 may necessitate a particular attribute or combination of attributes, or condition 172 may be fulfilled by any of two or more stipulations, where each stipulation requires a particular attribute or combination of attributes. Depending on the embodiment, misalignment indication condition 172 may be predetermined, and/or may be created and/or adapted by system 140. If misalignment indication condition 172 has been met, then misalignment is to be indicated. For example, in some embodiments, misprobe evaluator 170 provides a misalignment indication 174 to distribution controller 142. Continuing with the example, in system 100A, distribution controller 142 outputs a misalignment indication for example to an operator or engineering personnel (e.g. indication 144) and/or to tester 120 (e.g. indication 146 via channel 124) with the indication optionally forwarded by tester 120 to prober 110 (e.g. via channel 126A). Continuing with the example, in system 100B, distribution controller 142 outputs a misalignment indication for example to an operator or engineering personnel (e.g. indication 144), to tester 120 (e.g. indication 146 via channel 124) and/or to prober 110 (e.g. indication 148B via channel 116B) As another example, in some embodiments, distribution controller 142 is omitted and any misalignment indication is outputted to an operator/engineering personnel, tester 120 and/or prober 110 by misprobe evaluator 170. As another example, distribution controller 142 and misprobe evaluator 170 may both output misalignment indications.

In some embodiments, control of the operation of one or more of the modules in misalignment indication decision system 140 by process manager 190 includes triggering suspected misaligned probe identifier 150 to attempt to identify if there are any suspected misaligned probes. For example process manager may monitor the testing status and trigger attempts accordingly.

Optionally process manager 190 includes a trigger configuration file 192. Trigger configuration file 192 may comprise any convenient system readable file format (such as ASCII) which stipulates trigger point(s) within a test flow. In some cases, trigger configuration file 192 can also include any of the following specifications for each specified trigger point: which test data collection 182 to access (see stage 224 below), how to group parametric data (see stage 250 below), how to analyze a group of parametric data (see stage 250, method 300 and other procedures for performing stage 250 discussed below), how to divide identified suspected misaligned probe(s) into set(s) for attribute determination (see stage 270 below), which attributes to determine (see stage 270 below), which template(s) 182 to use (see stage 1006 below), how to perform spatial analysis (see stage 1012 below) which misalignment indication condition to apply (see stage 278 below), which misalignment indication decision to decide (see stage 278 below), any combination of the above, etc. In some cases, a particular trigger point may trigger access to a plurality of test data collections 182 in order to make a plurality of independent misalignment indication decisions, and therefore in some of these cases one or more of the above specifications may need to be specified per test data collection for that trigger point. In cases where a particular trigger point triggers access to a plurality of test data collections in order to make a plurality of misalignment indication decisions, the triggering may be performed consecutively or in parallel. In some embodiments, some or all of the above specifications may not be included in configuration file 192, for example because the specification is the same for each trigger point included in configuration file 192.

In some other embodiments, process manager 190 may be omitted, and triggering point(s) for suspected misaligned probe identifier 150 to attempt identification may be defined a-priori, for instance as a static set of default conditions embedded in the logic of system 140 (for example in suspected misaligned probe identifier 150 and/or other module(s)). In these embodiments specification(s) for each trigger point may in some cases also be embedded in the logic of system 140.

Figure 2A:
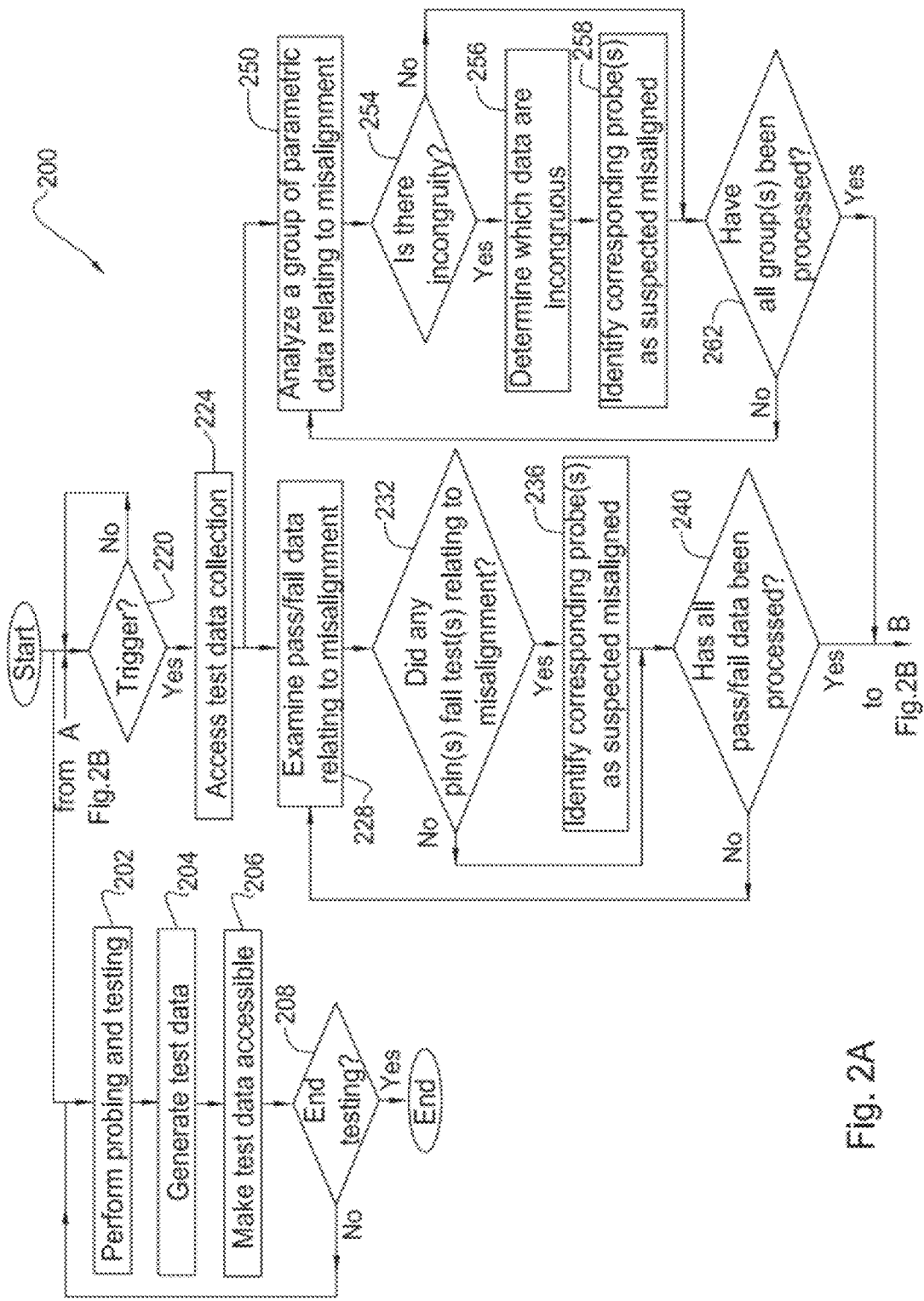
FIG. 2 (comprising FIGS. 2A and 2B) is a flowchart of a method of semiconductor wafer testing, according to some embodiments of the disclosed subject matter.
Figure 2B:
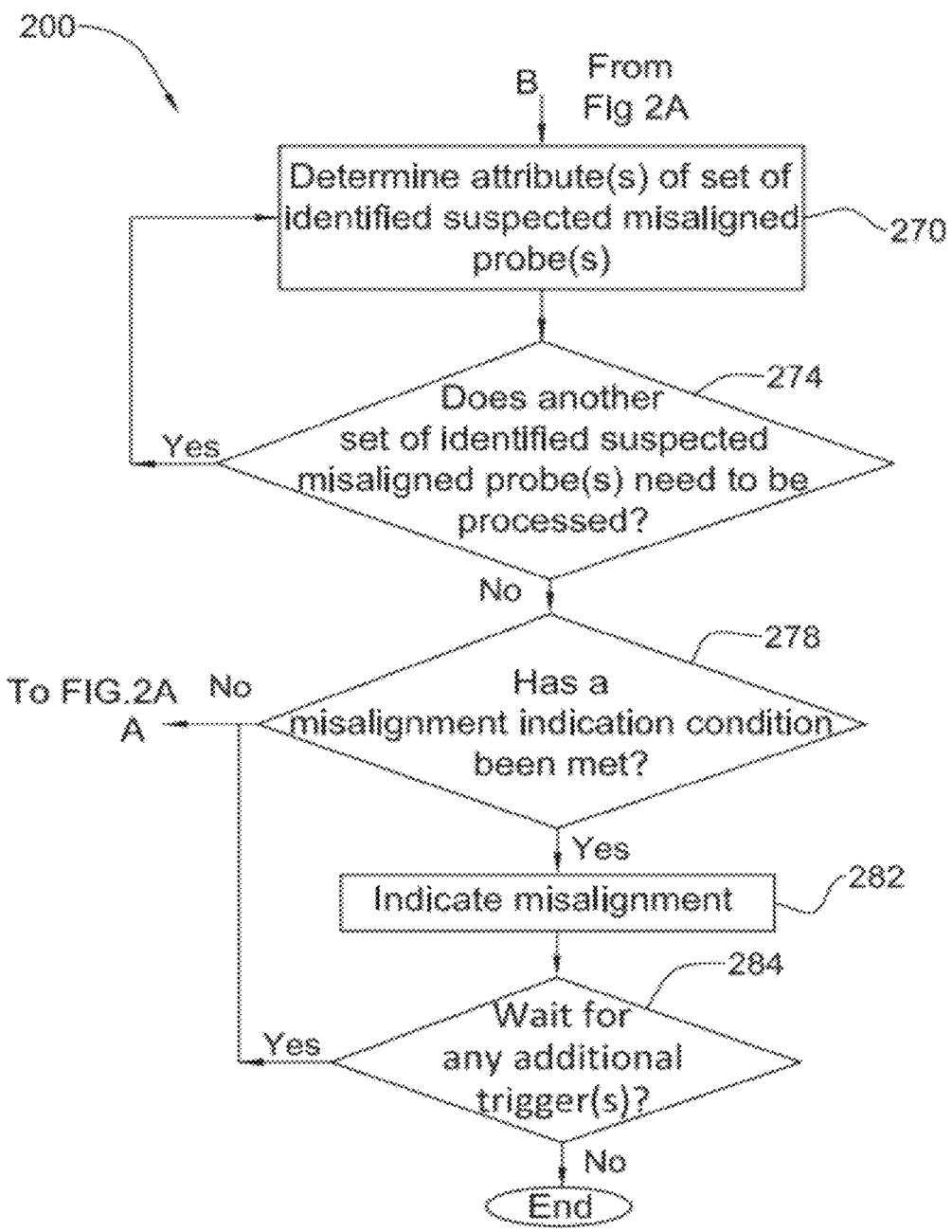

FIG. 2 is a flowchart of a method 200 of semiconductor wafer testing, according to some embodiments of the invention. In some embodiments, wafer testing system 100 performs method 200. In some embodiments, stages which are shown in FIG. 2 as being executed sequentially may be executed in parallel and/or stages shown in FIG. 2 as being executed in parallel may be executed sequentially. In some embodiments method 200 may include more, less and/or different stages than illustrated in FIG. 2. In some embodiments, stages may be executed in a different order than illustrated in FIG. 2.

In the illustrated embodiments a first subprocess includes any of stages 202 to 208. In the illustrated embodiments, in stage 202 probes on probecard 112 make temporary contact with bondpads of one or more dies on wafer 115 during a current touchdown and tester 120 executes a test program 130 including for example one or more parametric tests 132 and/or one or more pass/fail tests 134. Depending on the embodiment, prober 110 can perform any kind of maneuvering so that the probes make temporary contact, including for example maneuvering chuck 114.

It is assumed that test program 130 executed in stage 202 includes at least one parametric test 132 and/or pass/fail test 134 whose result is sensitive to probe to pad misalignment in any dimension (X, Y, Z or theta). Embodiments of the invention do not limit the types of parametric tests and/or pass fail tests whose results are sensitive to misalignment, but for the sake of further illustration to the reader, some examples are now presented. One example of a parametric test that may reflect misalignment (and/or other issues) is a contact resistance (CRES) test. Bondpads typically are coated with aluminum or another metal. Bondpads are typically surrounded by insulating material (e.g. glassy layer) also known as the passivation. Good electrical contact between probes and bondpads can only be achieved when the tips of each of these probes are positioned within a few micrometers of the centers of the corresponding bondpads while also being correctly positioned in the Z-dimension and theta-dimension. Under good electrical contact, there would be some inherent contact resistance whose value would depend on one or more factors such as the bondpad and/or probing technology, measurement procedure, resistance definition (for example including or excluding series resistance added by measurement fixturing), etc. For example, in some cases the inherent contact resistance may be less than 1 ohm whereas in other cases with different factor(s) the range may be about 2 to 3 ohms. Any type of misalignment which alters the probe-to-pad force (e.g. too light or too heavy depending on Z alignment) and/or which causes the probe tip to incompletely contact the bondpad metal surface may have an impact on contact resistance. For example, if the position of a probe's tip is off target in the XY plane or rotationally misaligned so that the probe tip incompletely contacts the bondpad metal surface and/or partially or fully falls on the passivation, and/or if the probe's tip position in the Z dimension is higher than the nominal probe tip position (i.e. too little prober 110 overdrive and too light a probe to pad force), then higher than inherent contact resistance between probe and bondpad may result. At an extreme instance, if a probe lands completely off the bondpad but on the passivation instead, the probe will not make electrical contact with the bondpad and the measured bondpad electrical contact resistance will be infinite, optionally limited by tester 120 overvoltage protection. Lower than inherent contact resistance may alternatively or additionally occur if the probe's tip position extends substantially below the plane of the surface of wafer 115 than the nominal probe tip Z position (i.e. too much prober 100 overdrive and too high a probe to pad force). It is noted that higher than inherent contact resistance can alternatively or additionally indicate other conditions in some embodiments such as a need for probecard cleaning (as probes slowly become increasingly resistive with repeated use), a damaged probe, a probe blocked by a particle, etc.

As another example, a pass/fail test which may be sensitive to misalignment is an opens test. A bondpad will fail the test typically if misalignment is severe although in some embodiments the opens test can be defined to fail for less severe misalignment. For example, in some cases X, Y and/or theta misalignment and/or Z alignment due to too little overdrive (too little probe-to-pad force) may cause an opens test failure. It is noted that in some embodiments a bondpad may additionally or alternatively fail an opens test due to other conditions such as a damaged probe, a probe-tip blocked by a particle, etc.

Other examples of tests whose results may be sensitive to misalignment include pin leakage tests, tests for a specific product whose results are affected by increases in contact resistance (e.g. power supply drop, on-chip data latch, etc), a resistive drop in power supply voltages reaching the chip's internal Vdd bondpad, an unusual RC delay in a high-speed signal path, etc.

In some embodiments, at least one parametric test 132 and/or pass/fail test 134 whose result is sensitive to even slight probe to pad misalignment is included so that early detection of misalignment is possible.

In some embodiments, not all tests which are sensitive to misalignment are performed. For example, in some cases the tests which are performed may depend on the product. As another example, in some cases the tests which are performed may depend on results of earlier performed tests. Continuing with the example, and assuming that the opens test is scheduled before the contact resistance test, in some of these cases if a bondpad failed an opens test, contact resistance may not be measured for that bondpad.

In the illustrated embodiments, in stage 204 test data are generated. The test data can include results of tests performed in stage 202 and generated by tester 120, identification data of the dies currently being tested, etc. As mentioned above, identification data may be generated by prober 110, by misalignment indication decision system 140, and/or otherwise.

Although the generation of test data and the format of the test data is not limited by embodiments of the invention, for the sake of further illustration to the reader, two examples are now given. In the first example, where a device had eight input/output bondpads that were submitted to the an opens test, test data may include the die XY coordinates and the pass/fail results in a format such as "23 18 OPENS PPPFP-PPP" where the die coordinates are X=23 and Y=18, the test is the opens test and of the eight bondpads, the fourth failed and the rest passed the test. As another example, assuming the same device with eight input/output pins had contact resistance measured, test data may include the die XY coordinates and the measurements in a format of "23 18 CRES 1.115 1.121 0.998 0.999 1.002 1.107 1.101 1.103", where CRES indicates that the test was contact resistance measurement.

In the illustrated embodiments, in stage 206 the generated test data is made accessible to identifier 150. For example, in some embodiments, generated test data may be stored in database 180 so as to be accessible to identifier 150. As another example, the generated test data may be passed to identifier 150 for processing without storage.

In the illustrated embodiments, in stage 208, it is determined if testing has been completed. If testing has been completed, then stages 202 to 206 are not repeated. If testing has not been completed, then stages 202 to 206 are repeated for the next touchdown. The next touchdown may be the next touchdown on the same wafer, the first touchdown on the next wafer in the same lot, the first touchdown on the first wafer of the next lot, etc.

In the illustrated embodiments, a second sub-process of method 200 (including any of stages 220 to 284) illustrates possible stages in some embodiments for deciding whether or not to indicate misalignment. In some embodiments, the second subprocess is performed by misalignment indication decision system 140. Embodiments of the invention do not limit the timing of the second subprocess in relation to the timing of the first subprocess. For example, in some embodiments, once the second subprocess has triggered in stage 220 various remaining stages of the second subprocess may be performed without regard to which stages of the first subprocess are being performed. As another example, in some embodiments, additionally or alternatively, once the second subprocess has triggered, at least some of the remaining stages of the second subprocess are preferably performed between various passes of stage 202 (i.e. when no touchdown of die(s) is currently being tested). As another example, in some embodiments, additionally or alternatively, once the second subprocess has triggered, at least some of the remaining stages of the second subprocess are preferably performed in parallel with stage 202 (i.e. when a touchdown of die(s) is actually being tested). As another example, in some embodiments, additionally or alternatively once the second subprocess has triggered, at least some of the remaining stages of the second subprocess may be performed after testing has ended (i.e. after a yes in stage 208)

In the illustrated embodiments in stage 220, it is determined if a trigger occurred which causes the remaining stages of the second subprocess to be executed. If not, method 200 waits for a trigger. If a trigger has occurred then method 200 proceeds to stage 224. In some embodiments, process manager 190 monitors the wafer testing, for example monitors subprocess 202 to 208, and triggers the remaining stages of the second subprocess, in accordance with trigger configuration file 192 described above. In some embodiments, additionally or alternatively, the remaining stages of the second subprocess are triggered according to a static set of default conditions integrated for example in suspected misaligned probe identifier 150 and/or other module(s) in misalignment indication decision system 140.

Embodiments of the invention do not limit the trigger(s). However for the sake of further illustration to the reader, some examples will now be presented. For example, trigger point(s) can include any of the following material processing event(s): after each touchdown has completed testing, after a plurality of touchdowns have completed testing, after a wafer has completed testing, after a plurality of wafers have completed testing, after a lot has completed testing, after a plurality of lots have completed testing, etc. As another example, additionally or alternatively trigger point(s) can include event(s) not directly related to material processing such as amount of data in a system data buffer, time of day, time based event (e.g. after every N hours of "runtime", shiftly, daily, weekly etc), manufacturing-based event/metric (such as after the first N wafers have been tested following a set up conversion from Product Type A to Product Type B or when low yield has been observed, etc), after a maintenance operation (for example after every probecard clean operation), whenever misalignment indication decision system 140 is available, etc.

In some examples of trigger point(s), additionally or alternatively, a specified trigger point for a particular misalignment indication is substantially soon after the required test data collection 182 is complete. For instance, in some of these examples, after each touchdown a decision for a type of misalignment which could be manifested within an individual touchdown (such as one or more probes that are out of alignment) may be triggered, with test data collection 182 possibly including data from that touchdown. Additionally or alternatively, for instance, in some of these examples, a decision for a type of misalignment which could be manifested after a plurality of touchdowns (such as a gradual continuous drift from time zero in one or more directions, monotonically getting worse in X, Y, Z, and/or theta dimension) may be triggered after a plurality of touchdowns, with test data collection possibly including data from those touchdowns. Additionally or alternatively, for instance, in some of these examples, a decision for a type of misalignment which may be manifested at the wafer level (such as probe chuck 114 and/or probecard 112 that is tilted in the Z direction, causing touchdowns near the high-Z part of the wafer to have too much probe force and touchdowns near the low Z part of the wafer having too little probe force) may be triggered after a wafer has completed testing with test data collection 182 possibly including data from all touchdowns of that wafer. However, in some other examples of trigger point(s), additionally or alternatively, a specified trigger point may be at a point later in time than when the test data collection 182 needed for the misalignment indication decision is complete. For instance, a trigger point may be deferred in order to postpone the analysis necessary for the misalignment indication decision to a time when tester 120 and/or system 140 is idle. Continuing with this instance, in some of these examples, the trigger point for a misalignment indication decision may be when the current wafer 115 or lot is being switched, even if the misalignment indication decision does not require testing data from later touchdowns in the current wafer 115 or lot, because there is typically more idle time during the switching of the wafer or lot than at other times such as when indexing between touchdowns. In examples where a misalignment indication decision is deferred, any action resulting from a decision to indicate misalignment would also be deferred.

As mentioned above, depending on the embodiment, a trigger point may trigger access to one data collection 182 and one pass of remaining stages of subprocess 220 to 284 in order to make a misalignment decision, or multiple accesses to a plurality of test data collections 182 and a plurality of passes in order to make a plurality of independent misalignment decisions, consecutively or in parallel. For simplicity of explanation it is assumed in the description below that access to one data collection 182 and one pass of the remaining stages of subprocess 220 to 284 is triggered at trigger point 220.

In the illustrated embodiments, in stage 224, test data collection 182 is accessed, for example by suspected misaligned probe identifier 150. Test data collection 182 includes, inter-alia, data generated and made accessible in one or more iterations of stages 204 and 206 which will be analyzed in one pass of stages 228 to 284 in order to make a decision on whether or not to indicate misalignment. See above description of FIG. 1 for additional details on various embodiments of test data collection 182.

Depending on the embodiment, in the current pass of method 200, stages 228 to 240 may be performed, stages 250 to 262 may be performed, and/or both stages 228 to 240 and stages 250 to 262 may be performed. In embodiments where both stages 228 to 240 and stages 250 to 262 are performed, stages 228 to 240 may or may not be performed in parallel with stages 250 to 262.

In the illustrated embodiments of stage 228, pass/fail data relating to misalignment in test data collection 182 is examined, for example by pass/fail evaluator 154.

In the illustrated embodiments of stage 232, it is determined, for example by pass/fail evaluator 154 whether or not any bondpads failed tests relating to misalignment. Refer again to the example of test data which in the form of "23 18 OPENS P P P F P P P". Pass/fail evaluator 154 may detect the "F" in the fourth position indicating that the fourth bondpad failed the test, while the "P"s in the other positions indicate that the other bondpads passed the test.

If there are any failing bondpads (yes to stage 232) then stage 236 is performed. If there are no failing bondpads then stage 236 is skipped.

In some embodiments, test data in test data collection 182 which relate to pass/fail tests, may only include failure results. In these embodiments, stages 228 to 232 may be simplified because there are no passing results to be examined.

In the illustrated embodiments in stage 236, probe(s) corresponding to failing bondpad(s) are identified as suspected misaligned probe(s), for instance by pass/fail evaluator 154. In some embodiments, the determination of which probe(s) correspond to the failing bondpad(s) is facilitated by the usage of lookup table 184. In some embodiments, data corresponding to identified suspected misaligned probes is indexed to probe identity (e.g. position within probe array of probecard 112) and/or touchdown identity (e.g. serialized by within wafer and within lot probing sequence, and/or by wafer identify and position within wafer of individual touchdown).

In the illustrated embodiments, in stage 240, it is determined, for instance by pass/fail evaluator 154, whether or not all pass/fail data required for attribute determination has been processed. In some embodiments, all pass/fail data related to misalignment in test data collection 182 is processed in one or more iterations of stages 228 to 240 prior to determining attribute(s). Depending on the embodiment, the amount of pass/fail data processed in each iteration may vary. If another iteration is required (yes to stage 240), then method 200 iterates back to stage 228. If no more iterations are required, then method 200 proceeds with stage 270 (optionally after waiting for stages 250 to 260 to also be completed).

In the illustrated embodiments, in stage 250, a group of parametric data in test data collection 182 relating to misalignment is analyzed, for instance by parametric analyzer 152. Depending on the embodiment, the group may include all the parametric data in test data collection 182 relating to misalignment or may include only part of the parametric data. It is assumed that any feature or artifact that increases the standard deviation of measurements of a group of parametric test data being analyzed together could possibly lead to a false conclusion of defective subpopulations and/or may mask the presence of actual defective subpopulations. Therefore in some embodiments, each group includes parametric test data results, preferably resulting from the same parametric test, which are expected to be sufficiently similar to one another under identical physical probe-to-pad contact conditions.

For example, assume test data collection 182 relates to all bondpads or selected bondpads tested during one or more touchdowns. Further assume in this example that bondpads can be classified according to the characteristic electronic design and/or physical characteristics, so that each group of parametric data relates to performing a given test on bondpads with similar electrical and/or physical characteristics. Continuing with the example, assume as a simplified instance that test data collection 182 includes CRES measurements for 16 bondpads with similar physical characteristics but of which eight are bidirectional input/output bondpads, four are dedicated input bondpads (e.g. clock input, output enable, etc), and two are power supply bondpads. Due to differences in the electronic circuits of the device design that are connected to the various types of bondpads, the electrical characteristics under CRES measurement may differ, producing different CRES measurement values even under identical probe-to-pad contact conditions. Therefore in this example, the CRES test results relating to bidirectional input/output bondpads, dedicated input bondpads, and power supply bondpads are analyzed in separate groups. In another example, assume that the bondpads of the previous example also differ based on relevant physical characteristics such as bondpad location, structural dimensions, film thicknesses, and/or structure, some of which may be related to natural variation in fabrication conditions and/or to bondpad design. In this example, CRES measurements can be divided into groups, each of which is distinguished by electrical characteristic and/or physical characteristic from the other groups. In some embodiments of these examples, the division into groups may be facilitated by probecard and/or product specific information, which may be provided for example by look-up table 184.

Depending on the embodiment of stage 250 the analysis may or may not be statistical. Further below, some embodiments of analysis procedures for stage 250 are described.

In the illustrated embodiments of stage 254, it is assumed that the analysis of stage 250 enables determination if there is data incongruity in the group. If data incongruity exist (yes to stage 254) then method 200 continues with stage 256. If on the other hand data incongruity does not exist (no to stage 254), then method 200 skips stages 256 and 258.

In the illustrated embodiments, in stage 256, it is determined which data is incongruous. For example, it is determined which test result(s) are incongruous with other test results in the group.

In the illustrated embodiments, in stage 258, the probe(s) which correspond to bondpad(s) whose test results are incongruous are identified as suspected misaligned. In some embodiments, the determination of which probe(s) correspond to the bondpad(s)) with incongruous test results is facilitated by the usage of lookup table 184. It is noted that in some embodiments, a particular bondpad may only have test result(s) which are either incongruous or congruous with group test results whereas in other embodiments this is not necessarily so and a particular bondpad may in some cases have test result(s) which are incongruous as well as test result(s) which are congruous. In some embodiments, data corresponding to identified suspected misaligned probes is indexed to probe identity (e.g. position within probe array of probecard 112) and/or touchdown identity (e.g. serialized by within wafer and within lot probing sequence, and/or by wafer identify and position within wafer of individual touchdown).

In the illustrated embodiments, in stage 262, it is determined if all groups which should be processed prior to attribute determination have been processed. If all groups have been processed (yes to stage 262), then method 200 proceeds to stage 270 (optionally after waiting for stages 228 to 240 to also be completed). If all groups have not been processed (no to stage 262), then method 200 iterates to process the next group beginning with stage 250.

In some embodiments, each group may include unique data points compared to any other groups, whereas in other embodiments this may not necessarily be the case and any particular data point may be common to one or more groups.

In some embodiments, there may be one or more group(s) common to the current test data collection 182 and to test data collection(s) used in previous misalignment decision indication passes. In some of these embodiments, the common group(s) may be again analyzed in stages 250 to 262 in order to identify suspected misaligned probes in the group(s), if any. In other of these embodiments, the common group(s) may not be re-analyzed in stages 250 to 262 but the identities of any suspected misaligned probes relating to the common group(s) which were previously identified may be retrieved.

It is noted that identifying a probe as being suspected misaligned in stage 236 or 258 does not necessarily mean that the probe is misaligned. For example, as noted above, other circumstances may lead to a probe being suspected for misalignment, for example a dirty probe, damaged probe, a probe-tip blocked by a particle. For this reason, the term "suspected" is used.

In some embodiments, the identification of suspected misaligned probe(s) is advantageous. Some examples of advantages will now be provided for further illustration to the reader, but embodiments of the invention do not limit the possible advantages. For example, in some embodiments the identification of suspected misaligned probe(s) in stage 236 or 258 enables tracking to see if the same probe(s) are consistently being identified as suspected misaligned for each iteration of stage 236 or 258 or there is instead inconsistency in which probe(s) are identified as suspected misaligned. Continuing with the example, in some cases the consistency or inconsistency (for example as recorded by an incidence attribute—see below) across touchdowns and/or across wafers may be useful in making the decision of whether or not to indicate misalignment. As another example, in some embodiments, additionally or alternatively the identification of suspected misaligned probe(s) in stage 236 or 258 may cause future analysis to focus only on data relating to corresponding bondpad(s), or cause future analysis to focus more on such data than on data relating to other bondpads. Continuing with the example, in some cases, only data relating to bondpad(s) whose corresponding probe(s) were previously identified as suspected misaligned (based on data from previous touchdown(s)) is analyzed to see if there is an upward trend in parametric measurements such as CRES, and/or for other tracking purposes. As another example, in some embodiments, additionally or alternatively, data relating to probe(s) identified as suspected misaligned in stage 236 or 258 is excluded from any calculations reserved for normal parametric measurements such as normal CRES measurements. Continuing with the example, in some cases, if it is desired to calculate the mean and standard deviation to model a nominal dataset (for example for the unimodal model described below with reference to stage 346 of FIG. 3), data relating to identified suspected misaligned probe(s) may be excluded. As another example, in some embodiments, additionally or alternatively, the identification of suspected misaligned probes in stage 236 or 258 enables the determination of common attributes between identified probes. Continuing with the example, in some cases, it can be determined if all identified suspected misaligned probes are associated with bondpads that are located at particular positions on a die or which have common electrical functionality. As another example, in some embodiments, additionally or alternatively, the identification of suspected misaligned probes in stage 236 or 258 enables position attribute analysis across more than one touchdown and/or for the same touchdown(s) across more than one wafer. As another example, additionally or alternatively, the identity of the suspected misaligned probe(s) (and optionally other analysis results) as identified in stage 236 or 258, can be reported to engineering personnel and/or an operator for use in determining the root cause of the problem. Continuing with the example, in some cases identified suspected misaligned probe(s) may be subsequently optically inspected in order to narrow down the list of hypothetical root cause problems.

It should be apparent from the above advantages that in some cases, it may be advantageous to identify suspected misaligned probe(s) even outside the context of a misalignment indication decision or in a different misalignment indication system than described with respect to method 200. Similarly suspected misaligned probe identifier 150 may in these cases be useful even separate from a misalignment indication system or within a different misalignment indication system than system 140.

In the illustrated embodiments, in stage 270, one or more attributes of a set of one or more identified suspected misaligned probe(s) is determined, for example by attribute determiner 160.

Depending on the embodiment, the determination of attribute(s) of identified suspected misaligned probe(s) can be performed on one or more sets of identified suspected misaligned probe(s). Embodiments of the invention do not limit the division into sets, but for the sake of further illustration to the reader some examples are now given. For example, in some embodiments all identified suspected misaligned probe(s) may belong to the same set, and attributes(s) for the set may be determined. In another example, in some embodiments, additionally or alternatively, suspected misaligned probe(s) identified via pass/fail test data may be part of one set analyzed for attribute(s) and suspected misaligned probe(s) identified via parametric test data may be part of a different set which is separately analyzed for attribute(s). In another example, suspected misaligned probe(s) corresponding to incongruous data with larger value(s) than congruous data may be part of one set analyzed for attribute(s) and suspected misaligned probe(s) corresponding to incongruous data with smaller value(s) than congruous data may be part of a different set analyzed for attribute(s). In another example, in some embodiments, additionally or alternatively, suspected misaligned probes from touchdowns on different locations on a wafer may be part of different sets. In another example, additionally or alternatively, in embodiments which include a plurality of templates 166 used by a position analyzer 164 to determine a position attribute, each identified suspected misaligned probe may be included in a plurality of sets dependent on the number of relevant templates 166, as will be explained in more detail below. In embodiments with more than one set, each set may include unique identified suspected misaligned probe(s), or each set may not necessarily include unique identified suspected misaligned probe(s) and partial or full overlap among identified suspected misaligned probe(s) which are members of each set is possible.

The invention does not limit the possible attribute(s) which may be determined in stage 270. However for the sake of further illustration to the reader, some examples will now be presented. Examples of possible attribute categories include any of the following inter-alia: actual test results, statistical attribute(s), temporal attribute(s) (e.g. history), electrical and/or physical characteristics (attributes), position/geographical attribute(s), etc. Examples of possible attribute(s) which may or may not fit the listed attribute categories include any of the following inter-alia: incidence (e.g. number of times) that a particular probe is identified as suspected misaligned; the "badness" (explained below) of a particular suspected misaligned probe; incongruous parametric data corresponding to the set; the total number of and/or fraction of identified suspected misaligned probe(s) within the probe array; the likelihood ratio (e.g. as described in FIG. 3); tested die, tested touchdown, location of tested touchdown in wafer, and/or tested wafer during which a particular probe was identified (each time) as suspected misaligned (enabling for instance independent computation of incidence per touchdown location); electrical functionality of bondpad corresponding to a particular identified misaligned probe; unusual physical characteristic of bondpad corresponding to particular identified suspected misaligned probe and/or unusual physical characteristic of particular suspected misaligned probe; statistical values derived from incongruous testing data corresponding to the set; parametric congruous testing data (for example in order to provide a contrast); statistical values derived from congruous testing data; statistical values derived from testing data of all probes (both those identified as suspected misaligned and those not so identified); change in any of the above as a function of touchdown iteration, number of touchdowns since the last probecard clean operation, touchdown index and/or of touchdown identity; trend etc. In various embodiments, separate statistical values may be derived from testing data which was analyzed in different groups, or statistical values may be derived from testing data which was analyzed in all groups of the current pass. In various embodiments, statistical values can include any appropriate statistical value such as for example, mean (i.e. average), median, maximum, minimum, standard deviation and/or rolling average, etc. Depending on the embodiment and the attribute, determination of attributes derived for different sets of identified suspected misaligned probe(s) may or may not be cumulative for test data collection 182. For example, in some embodiments an incidence attribute for a particular suspected misaligned probe which is included in more than one set, cumulates over all sets in which the probe is included. In other embodiments of the same example, accumulation is not required since suspected misaligned probes would be evaluated as one set for incidence attribute, even though not necessarily for other attributes, or because separate incidence counters for each set is preferable for making the misalignment indication decision. Assuming embodiments where if a particular bondpad fails a pass/fail test sensitive to misalignment and parametric measurements for a test sensitive to misalignment is in any event performed on that bondpad, in some of these embodiments if a probe is identified as suspected misaligned based on data from a pass/fail test and also identified as suspected misaligned based on data from a parametric test, where the data from both tests relates to the same touchdown, the incidence attribute is incremented once whereas in other of these embodiments the incidence attribute is incremented twice.

In some embodiments with a "badness" attribute, the "badness" of an individual suspected misaligned probe may be expressed in any appropriate manner, for example by the incidence of a probe being identified as suspected misaligned, by the incidence of a probe being identified as suspected misaligned per touchdown location in a wafer, by the mean, median, or maximum values that have been observed for the corresponding probed bondpads, etc. In some embodiments, the "badness" attribute may additionally or alternatively be expressed as a function of the congruous testing data points, or of the statistical parameters of a distribution of the congruous data points. For example, in some of these embodiments the number of standard deviations from the average of the distribution of the congruous data points that were analyzed in the same group(s) as the incongruous data associated with an identified suspected misaligned probe (or the average or maximum value of the incongruous data associated with an identified suspected misaligned probe) may be computed and used as a parametric figure-of-merit of the "badness".

In some embodiments, an unusual physical characteristic for a bondpad may relate to an unusual layout feature such as a bondpad which is relatively small or large. Similarly in some embodiments, an unusual physical characteristic for a probe may relate to an unusual design feature such as a probe which is relatively long or short.

In some embodiments, the determined attribute(s) additionally or alternatively include position attribute(s). In some of these embodiments, position attribute(s) are determined by a spatial analysis. In some cases of spatial analysis, spatial analysis calculates one or more metrics which quantifies the placement of the set of identified suspected misaligned probes with respect to a contiguous or non-contiguous area on one or more wafers 115, and the position attribute(s) include these calculated metric(s). Embodiments of the invention do not limit the type of metric(s), but for further illustration to the reader, some examples are now provided. Possible examples of metric(s) include: spatial density computations such as spatial probabilities, counts, percentages, ratios, etc; spatial variation; a measure of randomness versus systematic dispersion of a plurality of identified suspected misaligned probes; etc. Continuing with the example for probabilities, spatial probabilities may in some embodiments include the probability of the actual placement of the set compared to the expected placement, where the expected placement may depend on the embodiment. For instance the expected placement in this example may be random in one embodiment or non-random in another embodiment. In some embodiments, the calculated metric(s) allow the deduction of other possible position attribute(s) such as the likelihood of dispersion of the identified suspected misaligned probes being random versus systematic, regions of clustering of the identified suspected misaligned probes within the area, etc. In some embodiments determination of the position attribute(s) is facilitated through the usage of one or more template(s) 166. Embodiments of possible methods for determination of position attribute(s) are provided further below.

In the illustrated embodiments of stage 274 it is determined if another set of identified suspected misaligned probe(s) needs to be processed for attribute determination, prior to making a misalignment indication decision. If yes (yes to stage 274), then attribute(s) are determined for another set in another iteration of stage 270. If no other sets need to be processed then method 200 continues with stage 278.

In the illustrated embodiments, in stage 278, it is decided, for example by misprobe evaluator 170, whether or not a misalignment indication condition has been met and misalignment is to be indicated. For instance, misprobe evaluator 170 may evaluate attribute(s) determined in stage 270 and decide if misalignment indication condition 172 has been met by the attribute(s), singly and/or in combination. Depending on the embodiment, condition 172 for a misalignment indication may necessitate a particular attribute or combination of attributes, or condition 172 may be fulfilled by any one of two or more stipulations, where each stipulation requires a particular attribute or combination of attributes. Depending on the embodiment, misalignment indication condition 172 and all possible stipulations may be predetermined, or there may be a possibility for creating and/or adapting misalignment indication condition 172 and/or one or more stipulations. As an example of the latter embodiment, in some cases if a previous misalignment decision was to not indicate misalignment due to the absence of one stipulated attribute even though remaining stipulated attribute(s) were present, then a current misalignment decision may be to indicate misalignment if the stipulated attribute that was previously absent is present, even if one of the previously present stipulated attribute(s) is now absent.

Embodiments of the invention do not limit the attribute(s) which are required to meet the misalignment indication condition 172 but for the sake of further illustration to the reader, some examples are now given. For example, in some embodiments an attribute (required singly or in combination) may be that a median or average value for all CRES measurements whose incongruity led to corresponding probes to be identified as suspected misaligned is above a predetermined threshold, or that a median or average value for all CRES measurements whose incongruity led to corresponding probes to be identified as suspected misaligned is above a value threshold relative to the median or average value for all congruous data. As another example, in some embodiments an attribute (required singly or in combination) may be that incidence of a probe being identified as suspected misaligned is above a predetermined threshold, or that incidence of a probe being identified as suspected misaligned which was previously never flagged as suspected misaligned is above a predetermined threshold. As another example, in some embodiments an attribute (required singly or in combination) may be incidence of a probe being identified as suspected misaligned in at least x out of the last y touchdowns. As another example, in some embodiments an attribute (required singly or in combination) may be incidence of a probe being identified as suspected misaligned in touchdown #a to #d of the last few wafers. As another example, in some embodiments an attribute (required singly or in combination) may be that spatial density such as spatial probability, count, ratio and/or percentage of suspected misaligned probes in one or more regions of an area (for example as represented by template(s) 166) is/are above a predetermined floor and/or below a predetermined ceiling.

In the illustrated embodiments, if it is determined that the misalignment indication condition 172 has not been met and therefore misalignment is not to be indicated (no to stage 278), then method 200 iterates back to stage 220, waiting for the next trigger (if any) to make one or more new misalignment indication decision(s). If instead it is determined that the misalignment indication condition 172 has been met and misalignment is to be indicated (yes to stage 278), then misalignment is indicated in stage 282. For example misprobe evaluator 170 may provide misalignment indication 174 to distribution controller 142 which in turn distributes misalignment indication(s) (e.g. indication 146, 144 and/or 148B) outside of misalignment decision system 140. As another example, additionally or alternatively, misprobe evaluator 170 may output misalignment indication(s) directly from misalignment decision system 140.

Embodiments of the invention do not limit the type of misalignment indication, but for further illustration to the reader some examples will now be presented. For example, a misalignment indication may include an (automatic) abort indication to tester and/or prober (e.g. indication 146 and/or 148B), and/or a notification indication to an operator and/or engineering personnel (e.g. indication 144 which may include a hardware indication such as a red light and/or may include an indication sent in any appropriate fashion including: via email, beeper, and/or as part of a report, etc): In some cases, the notification may be recognizable to the operator as indicating that action is required, for example manual abort, review to see if aborting is necessary, etc. In some cases, the notification may additionally or alternatively be informative, for example providing diagnostic output from execution of method 200. In some of these cases, the diagnostic output can include the identity of the suspected misaligned probes and/or any other appropriate data.

Embodiments of the invention do not limit consequences of an automatic or manual abort, but for the sake of further illustration to the reader, some examples are now given. Consequences may include for example, not performing part or all of method 200. Continuing with the example, in some cases at least performance of stage 202 may be stopped. Consequences may additionally or alternatively include for example further diagnostic troubleshooting such as optical inspection of scrub marks left on the bond pads of a wafer which has been tested, for instance either manually, using a microscope attached to prober 110 with the wafer remaining in place, or off-line using a specialized automated inspection tool. In some cases of troubleshooting, system 140 may be interfaced to diagnostic equipment in order to facilitate troubleshooting. Consequences may additionally or alternatively include one or more alignment procedures.

In some embodiments, an indication (which is not a misalignment indication) may be provided even if the decision is to not provide a misalignment indication. For example, diagnostic output may be provided despite the decision to not indicate misalignment. As another example, additionally or alternatively, an indication may be provided because the decision that misalignment condition 172 was not met, led to the determination that some other condition was met. Continuing with the example, in some cases, a "clean" or "damaged probe" indication may be output if the analysis led to that conclusion (see for example discussion of FIG. 8D further below). In some embodiments, an indication unrelated to misalignment may be provided in addition to the misalignment indication.

In the illustrated embodiments, after misalignment has been indicated in stage 282, it is determined in stage 284 whether or not to wait for any additional triggers. If it is decided to wait for any additional triggers (yes to stage 284) then method 200 iterates back to stage 220, waiting for the next trigger (if any). If instead it is decided not to wait for any additional triggers (no to stage 284), then method 200 ends. For example, in some embodiments if the misalignment indication includes an automatic abort and/or notification to manually abort, then the decision is to not wait for any additional triggers. In these embodiments, if the misalignment indication does not include an automatic abort nor a notification to manually abort, then the decision is to wait for the next trigger (if any). Alternatively, in some embodiments, even if the misalignment indication does not include an automatic abort nor a notification to manually abort, the decision in some cases may be to not wait for any additional triggers. For example in some of these embodiments, the decision may be to not wait for any additional triggers if the current misalignment indication was sufficiently informative to allow the operator to review and determine if manual abort is necessary.

Some embodiments of the current invention may be advantageous for any of the following reasons: first, identification of suspected misaligned probes may be advantageous compared to a method where there is no identification. See above description of some possible advantages of identification (before description of stage 270). Second, additionally or alternatively, in embodiments with parametric data, the decision of whether or not to indicate misalignment may in some cases be more fine-tuned due to the analysis of parametric data that can take on any of multiple values compared to a method which only included analysis of binary pass/fail test results. This fine-tuning, for example can in some of these cases lead to a misalignment indication being output at an advantageous time. Continuing with the example, if a decision to indicate misalignment instead relied only on say the opens test, then indicating misalignment after say only one failure may in some instances be not as advantageous because the failure may be due to wafer fabrication error rather than misalignment, but indicating misalignment only after say 5 failures may in some cases be not as advantageous because the misalignment by then may be severe. Third, additionally or alternatively, in some cases tester 120 and prober 110 do not need to be adapted in order to implement method 200.

Fourth, additionally or alternatively, in embodiments with position attribute determination, position attribute(s) may in some cases be useful in making a misalignment indication decision. In some of these embodiments, as mentioned above position attribute(s) include metric(s) calculated by a spatial analysis which quantifies the placement of the set of identified suspected misaligned probes with respect to a contiguous or non-contiguous area on one or more wafers 115. In these embodiments, it may in some instances be advantageous to determine position attribute(s) by such a spatial analysis even outside the context of a misalignment indication decision or in a different misalignment indication system than described with respect to method 200. Similarly position analyzer 164 may in these instances be useful even separate from a misalignment indication system or within a different misalignment indication system than system 140.

Figure 3:
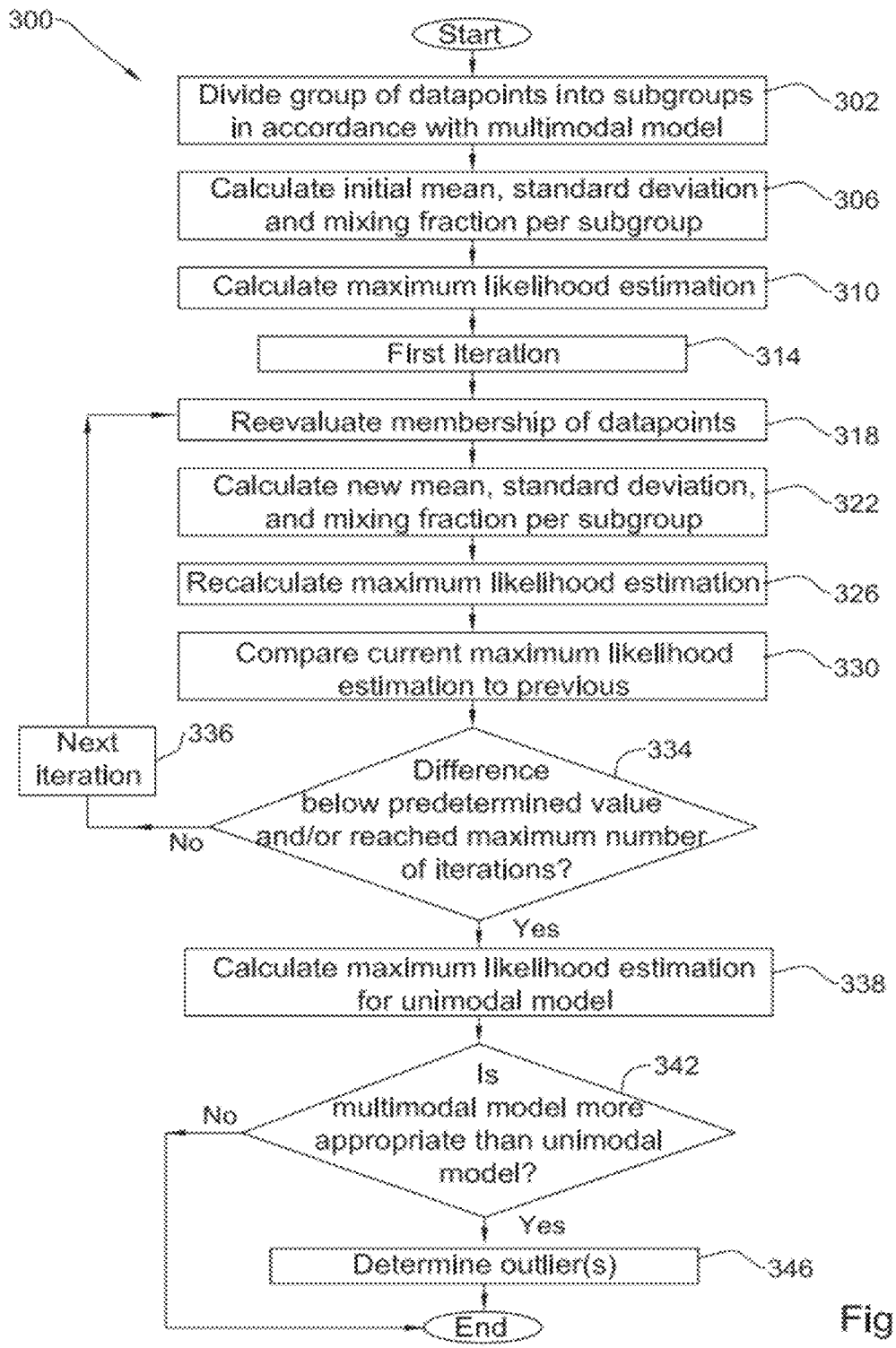
FIG. 3 is a flowchart of a maximum likelihood estimation method which may be used in the method of semiconductor wafer or packaged device testing, according to some embodiments of the disclosed subject matter.

As mentioned above, the parametric analysis of stage 250, the determination whether or not there is incongruity in stage 254, and/or the determination of which data is incongruous in stage 256, may in some cases be performed statistically. Additionally or alternatively, as mentioned below with reference to FIG. 19, the parametric analysis of stage 1950, the determination whether or not there is incongruity in stage 1954, and/or the determination of which data is incongruous in stage 1958, may in some cases be performed statistically. One possible statistical method includes a maximum likelihood estimation method. An example of a maximum likelihood estimation method 300 is illustrated in FIG. 3, according to some embodiments of the invention. In some embodiments of the invention, method 300 is performed by parametric analyzer 152 or 1852. In some embodiments, stages which are shown in FIG. 3 as being executed sequentially may be executed in parallel. In some embodiments method 300 may include more, less and/or different stages than illustrated in FIG. 3. In some embodiments, stages may be executed in a different order than illustrated in FIG. 3.

In the illustrated embodiments, method 300 may be used for identifying multimodality (i.e. bimodality or higher) within a group of data being analyzed. For simplicity of description it is assumed that the group of data includes CRES measurements, although in other embodiments other parametric data whose values are sensitive to misalignment may be used additionally or alternatively.

In the illustrated embodiments, in stage 302 the group of data points are divided into subgroups, with the number of subgroups equaling the number of Gaussian modes (AKA components, sources, distributions) in the model. It is noted that this division into subgroups is based on a hypothesis (not yet proven) that the group of data is derived from a multimodal distribution consisting of two or more Gaussian components, rather than from a unimodal distribution derived from a single Gaussian source. All data values in the group are numerically sorted, and then the group of data values are divided equally into as many sub-groups as are included in the multimodal model under consideration. It is initially assumed that each group's members are derived from a different Gaussian component, and thus, each group's data points are initially associated with the Gaussian distribution defined by the mean and standard deviation computed from those data. For a bimodal model, for example, the sorted data are divided into upper and lower halves, and initial assignment is made of all of the lower-valued data points to a (low mean value) model Gaussian, and all of the higher-valued data points to a (high mean value) model Gaussian.

In some embodiments, for each of the defined sub-groupings, and for each of the data points, the assignment of data points to sub-groups is represented within a membership status array whose elements are initialized to values of '0' or '1', depending on whether or not a particular data point has been assigned to a particular sub-group. For a bimodal model, for example, with a low-value data point sub-grouping designated by a '0' and a high-value data point sub-grouping designated by a '1', and also a data point index designated by 'j', the membership status array Z[sub-group,data_point] may be initialized such that Z[0,j]='1' and Z[1,j]='0' when j refers to data points in the lower half of sorted values, while Z[0,j]='0' and Z[1,j]='1' when j refers to data points in the upper half of sorted values. In other embodiments, rather than limiting the membership array to discrete values of '0' and '1', values in a continuous range from 0.0 to 1.0 may be assigned. In such embodiments, sub-group membership of a data value is quantified by this weighting factor for computational purposes, in which values closer to 1.0 than to 0.0 indicate a higher likelihood of membership of the data value to the given sub-group. This continuous range will be described in more detail further below.

In the illustrated embodiments in stage 306, based on the initial assignment of data points described above, an initial mean, standard deviation and/or mixing fraction are calculated for each of the defined sub-groups using only the data points assigned to the subgroups. For a bimodal model, for example, the values of the membership array Z[sub-group, data_point] are used as a multiplier to the data values in computing an initial mean and standard deviation for both the low-value sub-group and for the high-value sub-group, causing individual data points to be either included or omitted from the calculations. The mixing fraction refers to the fraction of data points that have been assigned to each sub-group, and is designated by the variable $\pi$ [sub-group]. For a bimodal model, for example, the initial mixing fraction values for both low-value and high-value sub-groups would be 0.50.

In general, the multimodal distribution is modeled as consisting of two or more Gaussian components. For a distribution model with 'g' Gaussian components, the mixture probability density function may be represented as $$f(x; \phi) = \sum_{i=1}^{g} \pi_i f_i(x; \theta)$$

The above mixture probability density function provides a probability value for any given value of x, given a multimodal distribution modeled as a linear combination of Gaussians (each of a given mean and standard deviation) with each weighted according to its respective mixing fraction.

In the illustrated embodiments, a maximum likelihood estimation is calculated in stage 310. For ease of calculation, it is actually the log(likelihood) value that is typically calculated in Maximum Likelihood Estimation, given by $L_c[\Phi]$ in the equation below, where $\Phi$ represents the full set of model parameters being used in the present calculation iteration. For instance, in a bimodal model, $\Phi$ may include the mean and standard deviation for mode 1, the mean and standard deviation for mode 2, and the mixing fraction.

$$L_C(\phi) = \sum_{i=1}^{g} \sum_{j=1}^{N} z_{ij} [\ln \pi_i + \ln f_i(x_j; \theta)].$$

In the above equation, variable i represents the sub-group and is therefore incremented for summation over all of the multimodal Gaussian components of the model (with i values ranging from 1 to g, the total number of sub-groupings). Variable j represents the data point and is therefore incremented for summation over all of the data points (with j values ranging from 1 to N, the total number of data points in the group). The probability density function for each Gaussian component is given by $f_i(x_j, \theta)$, which describes the probability of observing a sample data value of $x_j$ from a Gaussian distribution $\theta$ (where $\theta$ stands for the particular mean and standard deviation parameters that define the Gaussian). The Gaussian probability density function is well known in the art, and will therefore not be further described here. The "mixing fraction" variable described above also appears in the equation as $\pi[i]$, as does the membership array, appearing as Z[i, j].

In the illustrated embodiments, beginning with a first iteration (stage 314) membership of the data points in the various subgroups is re-evaluated in stage 318, using the set of model parameters $\Phi$ from the previous iteration (or in the case of the first iteration then using the initial set of model parameters $\Phi$). For each of the Gaussian sub-groups of the previous iteration's model (or initial model in the case of the first iteration), the density function probability for each point is computed and multiplied by the previous iteration's mixing fraction (or in the case of the first iteration, the initial mixing fraction) for that sub-group. The resulting set of numbers (one for each data point/Gaussian combination) is proportional to the probability of individual data points belonging to a particular Gaussian of the multimodal model, where larger numbers indicate higher probability. This is based on the fact that the likelihood of a given data point being associated with a particular Gaussian component is proportional both to the relative amplitude of that Gaussian to the other model components (indicated by the mixing fraction) and also to the statistical probability of encountering a data point with the given value from a sample of that Gaussian (i.e., the Gaussian's density function probability for the particular data point value). By dividing each of the values obtained for a given data point by the sum of all values for that point (summing across all Gaussian model components), the values are normalized to a range from 0.0 to 1.0, and may be suitably used as improved estimates in the membership array Z[i, j]. In some embodiments the revised values may be substituted with discrete values of '0' or '1', depending on whether the calculation yields a value closer to 0.0 or to 1.0. In embodiments in which the membership array Z[i, j] contains non-discrete values, as described above, the results of the calculation may be used as-is.

In the illustrated embodiments, having re-evaluated in stage 318 point membership of each of the Gaussian components of the multimodal model, in stage 322 a new mean, standard deviation and mixing fraction are calculated for each subgroup to replace those of the previous iteration (or in the case of the first iteration to replace the initial values). The means and standard deviations are calculated in the usual way, except that in the summations across all data points of each sub-group, data point values are replaced with the product of each data point value and the membership array value for the data point/sub-group combination (i.e., $x_j$*Z[sub-group, j]). In addition, the total number of data points N, used in the usual calculations of mean and standard deviation, is replaced with the sum of the values Z[sub-group, j], summed across all data points. In embodiments in which membership array Z[i,j] contains discrete '0' and '1' values, the calculation described amounts to either including or excluding individual points from the mean and standard deviation calculation of any given sub-group. For embodiments in which membership array Z[i,j] contains variable (none-discrete) values ranging from 0.0 to 1.0, the calculation weights individual points in the mean and standard deviation calculations according to the degree of each point's sub-group membership. For revision of the mixing fractions of the groups, $\pi$[sub-group], the values of the membership array for each sub-group, Z[sub-group, j], are summed across all data points, and is then divided by the total number of data points.

In the illustrated embodiments, at the end of the current iteration in stage 326 the revised values of the membership status array, and of the various parameters that describe the Gaussian components of the model (including, for each subgroup, the mean, standard deviation, and mixing fraction), are then used to calculate the maximum likelihood estimation using the equation for $L_c[\Phi]$, previously given.

In the illustrated embodiments, in stage 330, the value of the maximum likelihood estimation calculated in the current iteration of stage 326 is compared to the value obtained from the previous iteration (or in the case of the first iteration then compared to the initial value calculated in stage 310). As the algorithm converges on the most probable Gaussian parameters of the multimodal model and data point assignment, the value of $L_c[\Phi]$ increases and the difference between $L_c[\Phi]$ of the current iteration and the previous iteration (or initial $L_c[\Phi]$, in the case of the first iteration) asymptotically approaches zero.

In the illustrated embodiments, in stage 334, it is determined if the difference between the $L_c[\Phi]$ of the current iteration and the previous iteration (or initial $L_c[\Phi]$, in the case of the first iteration) has fallen below a predetermined value and/or a predetermined maximum number of iterations has been reached. The predetermined value and/or predetermined maximum, for example may have been defined by the operator. If the difference has not fallen below the predetermined value and the predetermined maximum number of iterations has not been reached (no to stage 334), then method 300 continues to the next iteration (stage 336) beginning with stage 318. If the difference has fallen below the predetermined value or the maximum number of iterations has been reached (yes to stage 334), then the iteration loop described above is terminated and method 300 continues to stage 338. In other embodiments, only either the predetermined value or predetermined maximum may determine whether or not the iteration loop has terminated, and/or one or more other conditions may additionally or alternatively determine whether or not the iteration loop has terminated. At the conclusion of the last iteration, the optimal multimodal model is defined by the values of the various parameters discussed here. The optimal multimodal model is the highest probability multimodal model for the given group of data.

In the illustrated embodiments in stage 338 the maximum likelihood estimation for a unimodal model (the alternate hypothesis) is calculated. Under the unimodal model assumption, consisting of a single Gaussian distribution, the above maximum likelihood estimation calculations are greatly simplified, requiring only a single calculation of the mean and standard deviation from the entire group of data, and then performing the summation of the log of the density function of that model distribution across all values of the data group. The expression for calculation of $L_{c'}[1]$, the maximum likelihood estimation for such a unimodal model, is given as:

$$L_C(1) = \sum_{j=1}^{N} \ln f(x_j; \theta).$$

In the illustrated embodiments, in stage 342 it is determined whether the multi-modal model is more appropriate than the unimodal model. For example, a decision that a multi-modal model is more appropriate (yes to stage 342) is an example of a decision that there is incongruity (yes to stage 254 or 1954) which will lead to a determination of which data points are outliers (stage 346 which is an example of stage 256 or 1956) so that probes or socket contacts corresponding to those data points may be identified as suspected misaligned (in stage 258 or 1958). Continuing with the example, a decision instead that a unimodal model is more appropriate (no to stage 342) is an example of a determination that there no incongruity (no to stage 254 or 1954).

In some embodiments, the determination in stage 342 includes the computation of a likelihood ratio. In these embodiments, the comparison of the multimodal (for example bimodal model) to the unimodal model is typically expressed as the natural log of the ratio of the unimodal maximum likelihood estimation value computed in stage 338 to the multimodal (e.g. bi-modal) maximum likelihood estimation value computed in the last iteration of stage 326, times the number "−2". In these embodiments, this "log likelihood-ratio statistic" has the form:

Likelihood Ratio=−2*ln($L_c[1]/L_c[\Phi]$)

In these embodiments, when the value of the Likelihood Ratio is sufficiently large, it may be concluded that for the given data set, the multimodal (e.g. bi-modal) model is a better fit to the data than a unimodal model. The conclusion depends partly on the number of data points that are applied to the calculation. In some cases it may be preferable that the number of data points "N" be greater than 50 to reliably reject the unimodal hypothesis in favor of a bimodal model. The definition of "sufficiently large" may vary depending on the implementation. In one non-limiting implementation, bi-modality may be assumed (rather than uni-modality) if the calculated likelihood ratio is greater than the maximum historical likelihood ratio when the unimodal model was appropriate (e.g. greater than the maximum historical likelihood ratio prior to the onset of misalignment)

In some embodiments where a likelihood ratio is used, a convenient feature of the form of the likelihood ratio given in the above equation is that for a sufficiently large number of data points, and for a bimodal model in which the standard deviations of the two Gaussian components are similar in size, an estimate of the statistical significance of the result may be derived from the well-known chi-squared distribution, with the number of degrees of freedom equal to twice the difference between the number of parameters of the two models under comparison. For the comparison of a bimodal model (whose parameters include two means and two standard deviations) to a unimodal model (whose parameters include one mean and one standard deviation), the number of degrees of freedom would therefore be equal to 2. In some other embodiments, particularly those in which the requirements of applying the chi-squared statistics are not met, the threshold for the likelihood Ratio being sufficiently large may be set empirically by users of the method, rather than being based on a statistical confidence level.

In the illustrated embodiments, if it was determined in stage 342 that the multimodal model is more appropriate (yes to stage 342), then in stage 346 it is determined which data points(s) are outlier(s). Stage 346 is an example of stage 256 or 1956 in method 200 or 1900 respectively, in that the outlier(s) are an example of incongruous data. In some embodiments, the data points which would be considered outliers are those data points which have greater calculated probability of belonging to one of the subgroups corresponding to one of the "abnormal" Gaussian components than to the "normal" Gaussian component. Depending on the embodiment, the normal versus abnormal Gaussian components may be differentiated using various suitable procedures.

In one procedure, the mixing fraction calculated in the last iteration for each of the sub-groups, which reflects the amplitude of the corresponding Gaussian component can be used as the basis of deciding which of the components is the "normal" component. For instance, it may be assumed in some of these embodiments that the "normal" Gaussian component is the dominant one associated with the largest number of data points (and therefore with the largest mixing fraction).

In another procedure, additionally or alternatively, the normal versus abnormal Gaussian components may be differentiated based on degree of similarity to a Gaussian unimodal distribution of data points where there is no suspected misalignment (for instance, a distribution computed using a group of data points corresponding to probes or socket contacts known to be aligned, a group of data points where there is no incongruity or which exclude any incongruous data points, a distribution computed using a group of data points where the unimodal model was considered more appropriate in stage 342, etc). In these cases there are various statistical methods which can be used for performing a test of similarity between two Gaussian distributions, such as the well known "Student T-Test".

Additionally or alternatively, in another procedure relevant to wafer testing, the normal versus abnormal Gaussian components may be differentiated based on the degree of similarity to a reference misaligned data set deliberately generated by probing in a misaligned condition, so as to produce a reference data incongruous with data produced when probing in a non-misaligned condition. For example, in some embodiments in which Z-dimension overdrive is of particular concern, a detailed characterization of the Cres distribution as a function of Z overdrive is performed, in which the characterization data may serve as a reference for determining which of the subpopulations detected are derived from usual/desirable probe conditions, versus conditions that are unusual/undesirable. Continuing with the example, in such characterizations, deliberately applying excessive overdrive (and therefore probe force) may result in a Cres distribution with lower values and smaller standard deviation than seen at the nominal overdrive setting. The Cres distribution which corresponds to the excessive overdrive condition may in some cases serve as a reference misaligned data set. In these cases, the subpopulation data which is statistically consistent with the (misaligned) reference data set corresponding to an overdrive characterization (and therefore incongruous with a non-misaligned data set) would be classified as outlier(s) (and therefore the corresponding probes as "suspected misaligned"). Similarly, in bondpad technologies utilizing a "metal stack" construction (such as bondpads based on copper metallurgy, capped by an aluminum alloy), excessive overdrive may result in the probe penetrating the top layer metallization to directly contact the underlying bondpad metal, producing a subpopulation of Cres data distinct from the nominal population, and inherently different than nominal due to the different probe-bondpad metal contact interface after penetration. Although, in some other cases, a distribution of lower Cres values with a smaller standard deviation may be electrically desirable, in such embodiments the concern over physical damage to the bondpads and/or to the probes caused by excessive force is the motivation for indicating misalignment and terminating the probe operation.

In some embodiments, the likelihood ratio discussed above is an attribute or one of the attributes which is used in making a decision on indication of misalignment.

Although embodiments of the invention do not limit applications of the above described methods and systems, some examples relating to wafer testing will now be provided for further illustration to the reader. These examples will be based on the data shown in FIG. 4 which is a graph of CRES measurements by touchdown number for three pins (i.e. bondpads), Pin 1, Pin 2, and Pin 3, according to some embodiments of the invention. The measurements may have been generated for example, using Monte Carlo procedures.

Figure 4:
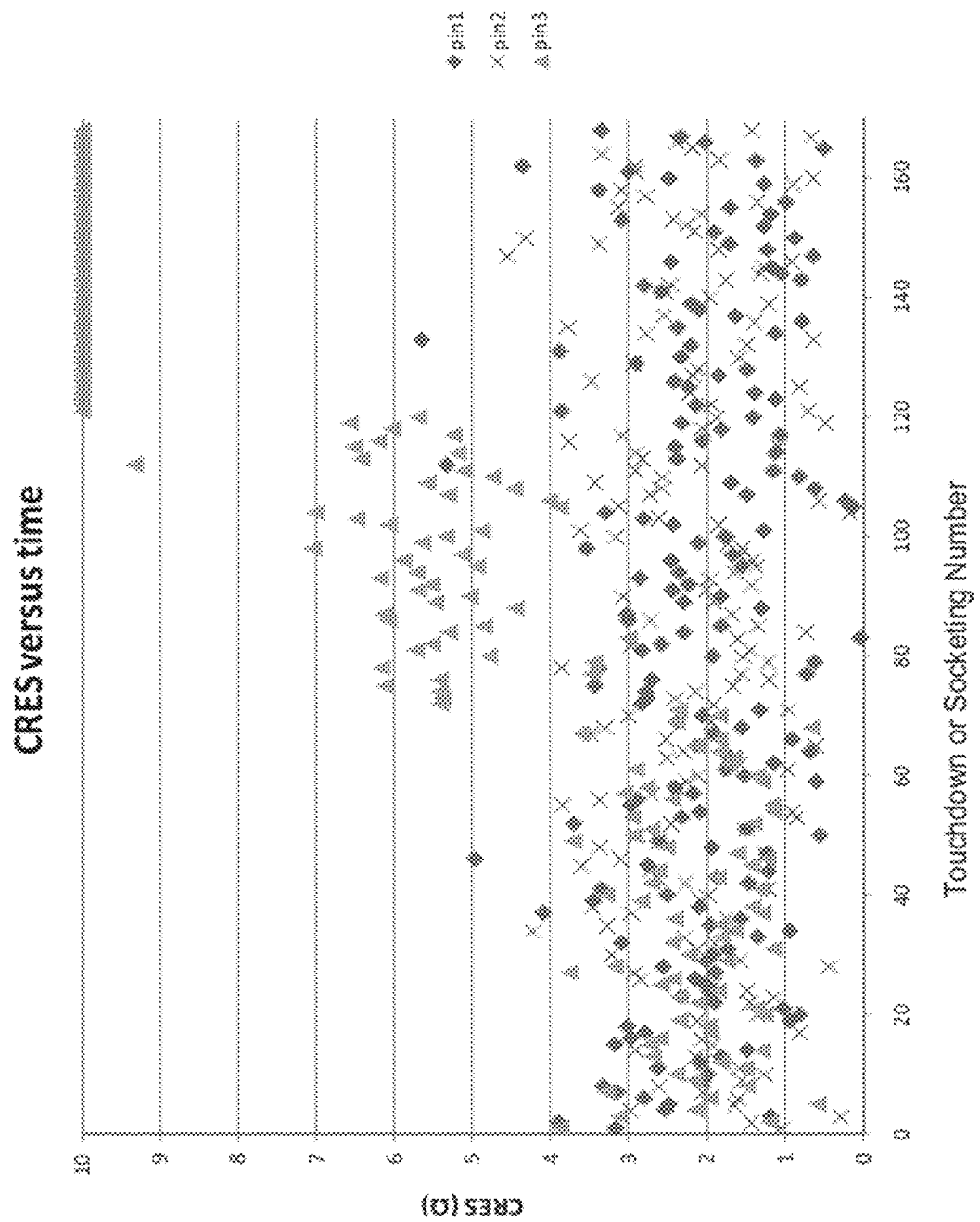
FIG. 4 is a graph of contact resistance (CRES) measurements for three pins, according to some embodiments of the disclosed subject matter.

In the illustrated embodiments, in one example, statistical method 300 described above with reference to FIG. 3 is applied to the Pin 3 CRES data of FIG. 4. Examples of the Likelihood Ratio calculated from the cumulative Pin 3 data at the $70^{th}$, $90^{th}$, and $110^{th}$ touchdown are shown in FIG. 5A, FIG. 5B, and FIG. 5C, respectively, along with histograms of the CRES data included in the Likelihood Ratio calculation at those points, according to some embodiments of the invention. It is assumed in this example that beginning with touchdown 70 and then after each 20 touchdowns, stage 220 triggers. After stage 220 has triggered, analysis of cumulative data for pin 3 is performed as a group in stages 250 to 256 using method 300 (Possibly an analysis of cumulative data for other pins, each group having data from a single pin, is also performed). It can be seen in FIG. 5A that at the $70^{th}$ touchdown, just prior to the beginning of an upward trend of the Pin 3 CRES data, a Likelihood Ratio of 2.642684 is found. In FIG. 5B after the Pin 3 CRES values have started trending up, the bimodality of the data becomes apparent in the histogram, and the Likelihood Ratio has increased to 3.452825. In FIG. 5C conditions have continued to worsen with increasing bimodality seen in the histogram, and the Likelihood Ratio has increased to 4.079738.

Figure 6:
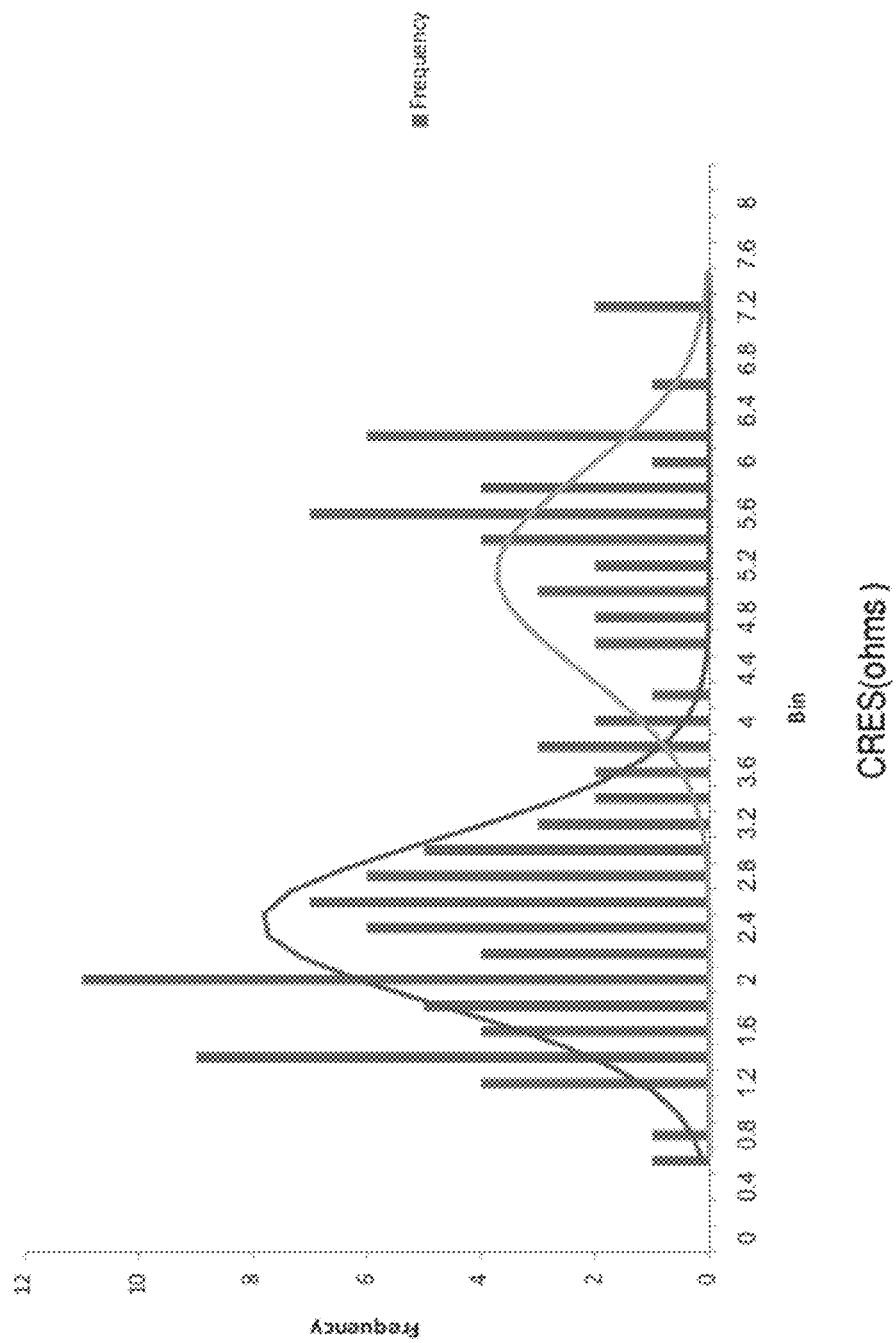
FIG. 6 illustrates the histogram of FIG. 5C, overlaid by two possible Gaussian components, according to some embodiments of the disclosed subject matter.

Continuing with this example, FIG. 6 illustrates the histogram of FIG. 5c overlaid by two possible Gaussian components which could be used to model the CRES measurements, according to some embodiments of the invention. In some embodiments, the area under each of the Gaussian curves is proportional to the expected number of data points, associated with that curve, and the relative fraction of data points associated with each is the mixing fraction. In these embodiments, roughly 70 data points are associated with the curve with the higher mean frequency and 40 data points are associated with the curve with the lower mean frequency, giving mixing fraction values of $70/110$ and $40/110$, or 0.64 and 0.36, respectively.

Figure 7:
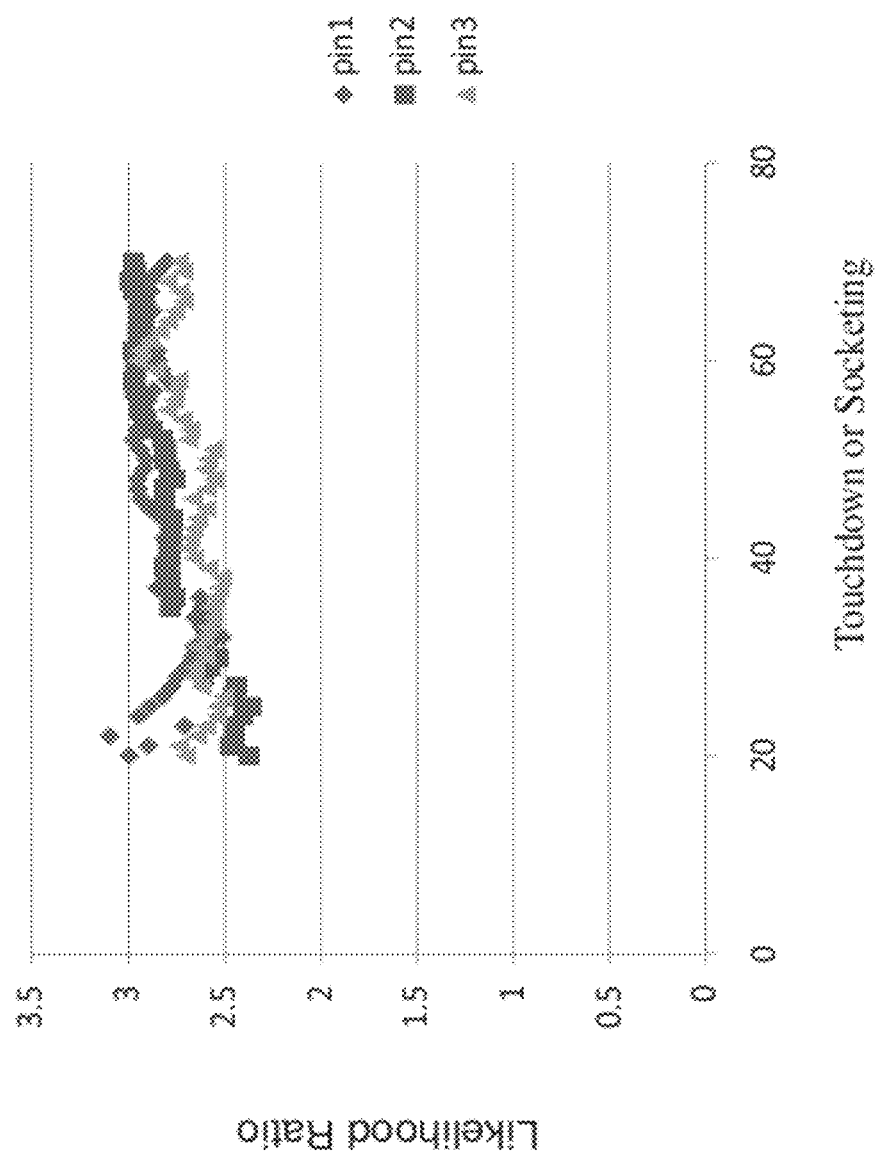
FIG. 7 illustrates calculation of a likelihood ratio using cumulative CRES measurements for each of the three pins from FIG. 4, within the first 70 touchdowns or socketings, according to some embodiments of the disclosed subject matter.

Assume in another example, that stage 220 triggers after each touchdown. In this example, cumulative data from all preceding touchdowns for each of Pin 1, Pin 2, and Pin 3 is analyzed as a group, using method 300 (possibly an analysis of cumulative data for other pins, each group having data from a single pin, is also performed). For instance calculations of the Likelihood Ratio using cumulative data within the first 70 touchdowns for each of Pin 1, Pin 2, and Pin 3 are shown in FIG. 7, according to some embodiments of the present invention. Since in these embodiments, it is assumed that for the first 70 touchdowns the unimodal model is appropriate for each of the three pins, the calculation of the Likelihood Ratio within the first 70 touchdowns may in some cases provide an indication of what may be an appropriate threshold in making a decision to indicate misalignment. With such nominal data, the maximum Likelihood Ratio calculated has a value around 3, suggesting sufficient margin if a threshold were set to be for instance near the value of around 3.5, i.e. set for instance to the Likelihood Ratio which was calculated using the data of FIG. 5B.

In some embodiments, other procedures can be implemented in performing stages 250 to 256, additionally or alternatively to method 300 described above with reference to FIG. 3.

An example of another procedure is now given, not in order to limit applications of other procedures, but to further illustrate embodiments of the invention to the reader. Referring again to the data of FIG. 4 for pins 1, 2, and 3, histograms for the combined dataset of Pin 1, Pin 2 and Pin 3 are shown for the first 70 touchdowns, touchdowns 71 to 122, and touchdown 123 to 170, in FIG. 8A, FIG. 8B, and FIG. 8C respectively, according to some embodiments of the invention. For example, it may be assumed that the three pins are similar enough that data relating to the three pins may be analyzed together.

In the illustrated embodiments of this example, it is assumed that the distribution is normal and similar for all material and therefore suitable historical data representative of normal CRES distributions may be used as a reference. In this example, assuming the CRES distribution of FIG. 8A is normal, a model normal distribution with mean of 2.13 ohms and standard deviation of 0.72 ohms may be used as a basis for identification of subsequent points with statistically unlikely high CRES values, for example those with values greater than the mean plus three standard deviations, or 4.3 ohms for the example data group of FIG. 8A. In excursions, the CRES data distribution will be composed of one or more subdivisions as shown in FIG. 8B and continuing in FIG. 8C. Based on the calculated threshold of the present example, the data associated with the high CRES values, on the right-hand side of the histogram, are easily distinguished based on CRES values greater than 4.3 ohms.

Referring again to FIG. 4, beginning at the dashed vertical line 402 marking touchdown number 70, Pin 3 begins to exhibit elevated CRES values, with most Pin 3 values beyond that touchdown falling above 4.3 ohms.

Figure 8D:
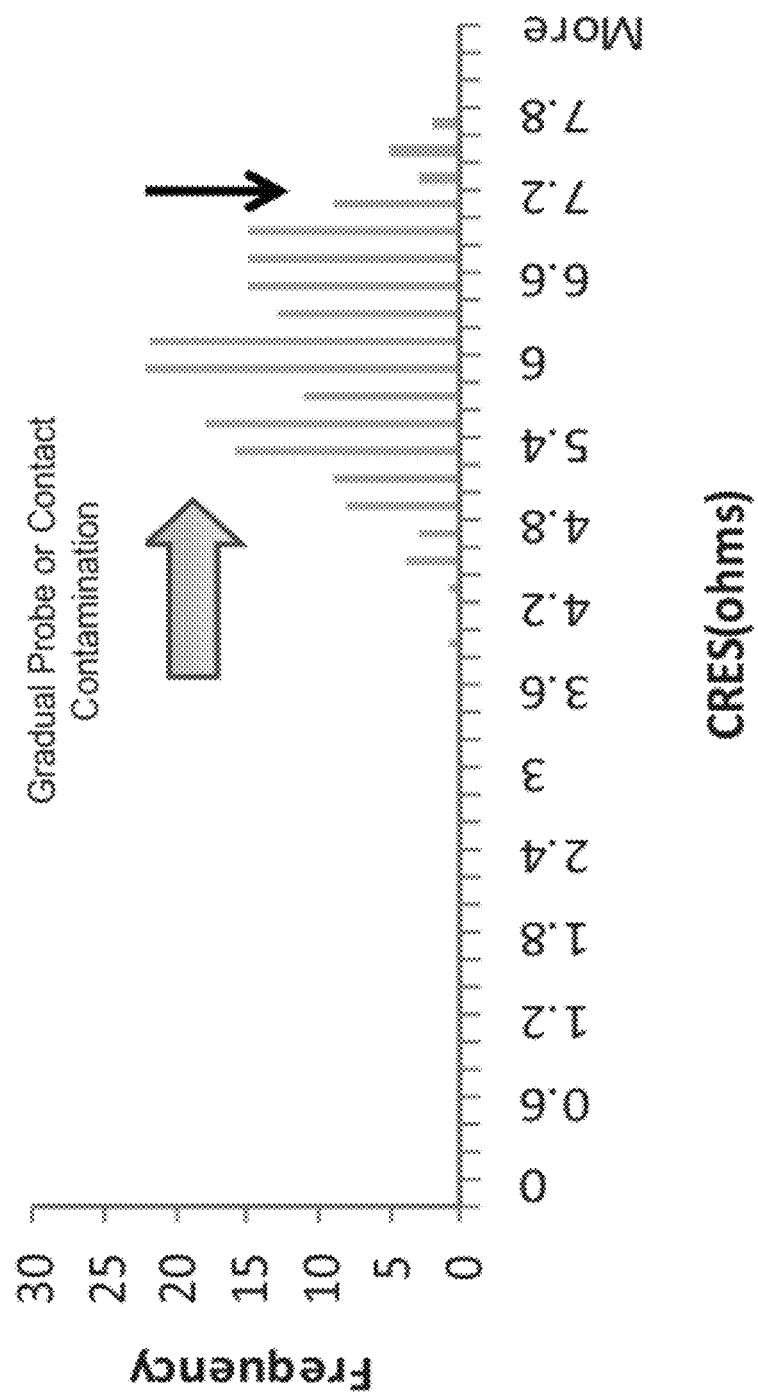
FIG. 8D is a histogram of the combined dataset for the three pins from FIG. 4 when cleaning is due to remove material buildup on probe-tips or socket contacts, according to some other embodiments of the disclosed subject matter.

As an aside, it is noted that in some cases a "clean" rather than a misalignment problem may be distinguished by a unimodal distribution with a higher mean CRES than in earlier touchdowns. Refer to FIG. 8D which shows histograms for the combined dataset of Pin 1, Pin 2 and Pin 3 when cleaning is due to remove material buildup on probe-tips, according to some embodiments of the invention. It is evident that compared to the normal CRES distribution of FIG. 8A, the mean CRES in FIG. 8D is higher but the distribution remains unimodal, hinting that the entire probe population has become contaminated.

In another example of a procedure, which can additionally or alternatively be implemented in performing stages 250 to 256, a parametric statistical analysis of CRES data may be used to distinguish sub-populations of pins with unusually low or high mean values, or unusually narrow or wide standard deviations. These subpopulations can potentially correlate with individual probes or groups of probes with misalignment problems.

Figure 9A:
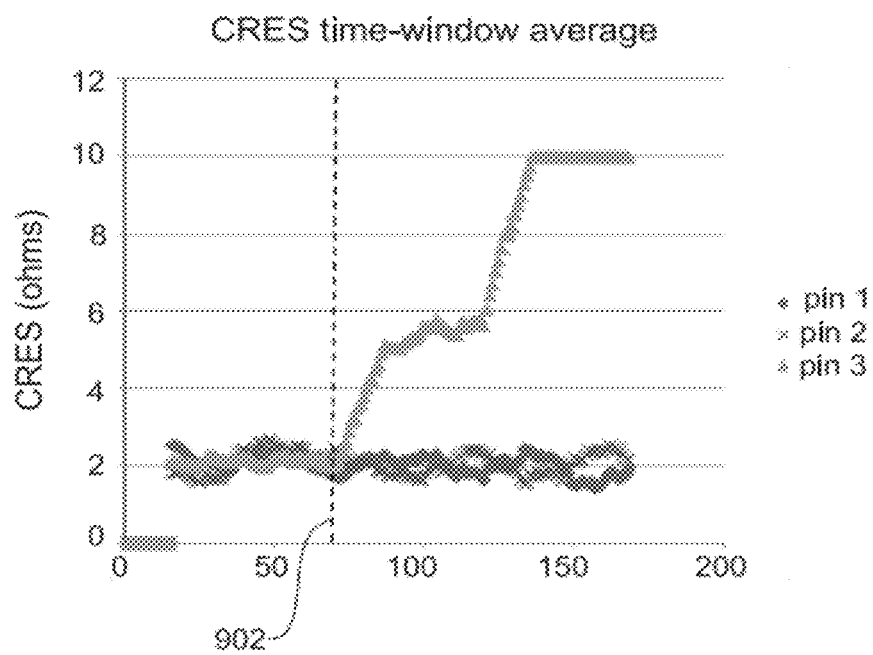
FIG. 9A is a graph of rolling average CRES measurements for the most recent 16 touchdowns or socketings for each of the three pins from FIG. 4, according to some embodiments of the disclosed subject matter.
Figure 9B:
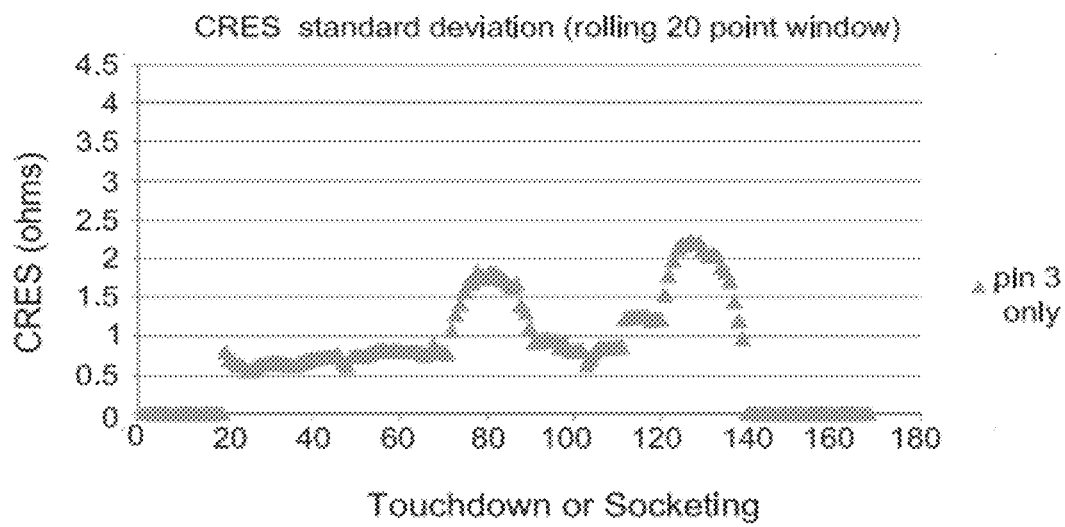
FIG. 9B illustrates calculated rolling CRES standard deviations for the most recent 20 touchdowns or socketings for the data from FIG. 4 on Pin 3, according to some embodiments of the disclosed subject matter.

In still another example of a procedure, which can additionally or alternatively be implemented, a rolling average of CRES measurements may be maintained, for example for each pin, over a certain number of touchdowns. Continuing with the example, stage 220 may be triggered after each touchdown with the rolling average analysis performed in stage 250 on data from the last predetermined number of touchdowns. Refer to FIG. 9A which illustrates rolling average CRES measurements for the most recent 16 touchdowns for Pin 1, Pin 2 and Pin 3 by touchdown (using the data from FIG. 4), according to some embodiments of the invention. The dashed vertical line 902 corresponds to touchdown 70. It can be seen that the rolling average of Pin 3 diverges from the rolling averages of the other two pins going above 3 ohms, whereas the rolling averages of the other two pins stay pretty constant. Refer also to FIG. 9B which illustrates calculated CRES standard deviation based on a rolling 20 point (20 touchdown) window for the data from FIG. 4 on Pin 3, according to some embodiments of the invention. It can be seen that there is a dramatic increase in standard deviation around touchdown 80 and again around touchdown 130. These increases occur approximately at the touchdowns where the data in the rolling 20 point window includes both the older/better CRES and the newer/worse CRES data points.

In still another example of a procedure, which can additionally or alternatively be implemented, a body of reference data may be accrued over time. For instance CRES data relating to one or more individual probes from a rolling window of a certain number of consecutive touchdowns may be acquired, with the cumulative data set treated as the reference distribution.

Continuing with the examples based on the data of FIG. 4, after using method 300 and/or any other procedure for performing stages 250 to 256 and then performing stages 258 and 262, and/or after performing stages 228 to 240, attribute determination can be performed in stage 270. In some embodiments, attribute determination includes determination of incidence of a probe being identified as suspected misaligned. Illustrating such an embodiment again with the data of FIG. 4, and applying a CRES threshold of e.g. 4.3 ohms, it can be seen that the incidence counter for Pin 1 would be incremented only once due to a single measurement of about 5.0 ohms at touchdown 46 (incidence[1]=1), while the incidence counter for Pin 3 would be incremented in almost every touchdown subsequent to touchdown 70. Therefore, in some embodiments attribute determination would include one incidence of Pin 1 being identified as suspected misaligned and multiple incidences of Pin 3 being identified as suspected misaligned. In some embodiments, additionally or alternatively, attribute determination includes trend analysis. For instance, referring again to FIG. 9A the upward trend for Pin 3 compared to Pins 1 and 2 is evident. Any other attribute determination, including inter-alia position attribute determination may additionally or alternatively be performed in any of the above examples which were based on the data of FIG. 4.

Continuing with the examples based on the data of FIG. 4, any type of misalignment indication condition 172 may be evaluated in stage 278. Although the type of condition is not limited, for further illustration to the reader, some instances are now provided. For instance, in some embodiments a decision to indicate misalignment may be made when the Likelihood Ratio is at or above 3.5, or when the Likelihood Ratio is above 3.5 and other condition(s) have been met. In another instance, additionally or alternatively, a condition may require that the average CRES value of identified suspected misaligned probes exceeds a predetermined value or a value threshold relative to the average CRES value of probes which have not been identified as suspected misaligned. Continuing with this instance, in some cases of the data of FIG. 9A a decision to indicate misalignment may be made if the average CRES value of identified suspected misaligned probes exceeds e.g. 3 ohms, or exceeds e.g. the mean plus four standard deviations of the distribution of CRES values from probes not identified as suspected misaligned. In another instance, additionally or alternatively, in some cases of the data of FIG. 8D, because the distribution is unimodal there may be a decision not to indicate misalignment.

Figure 10:
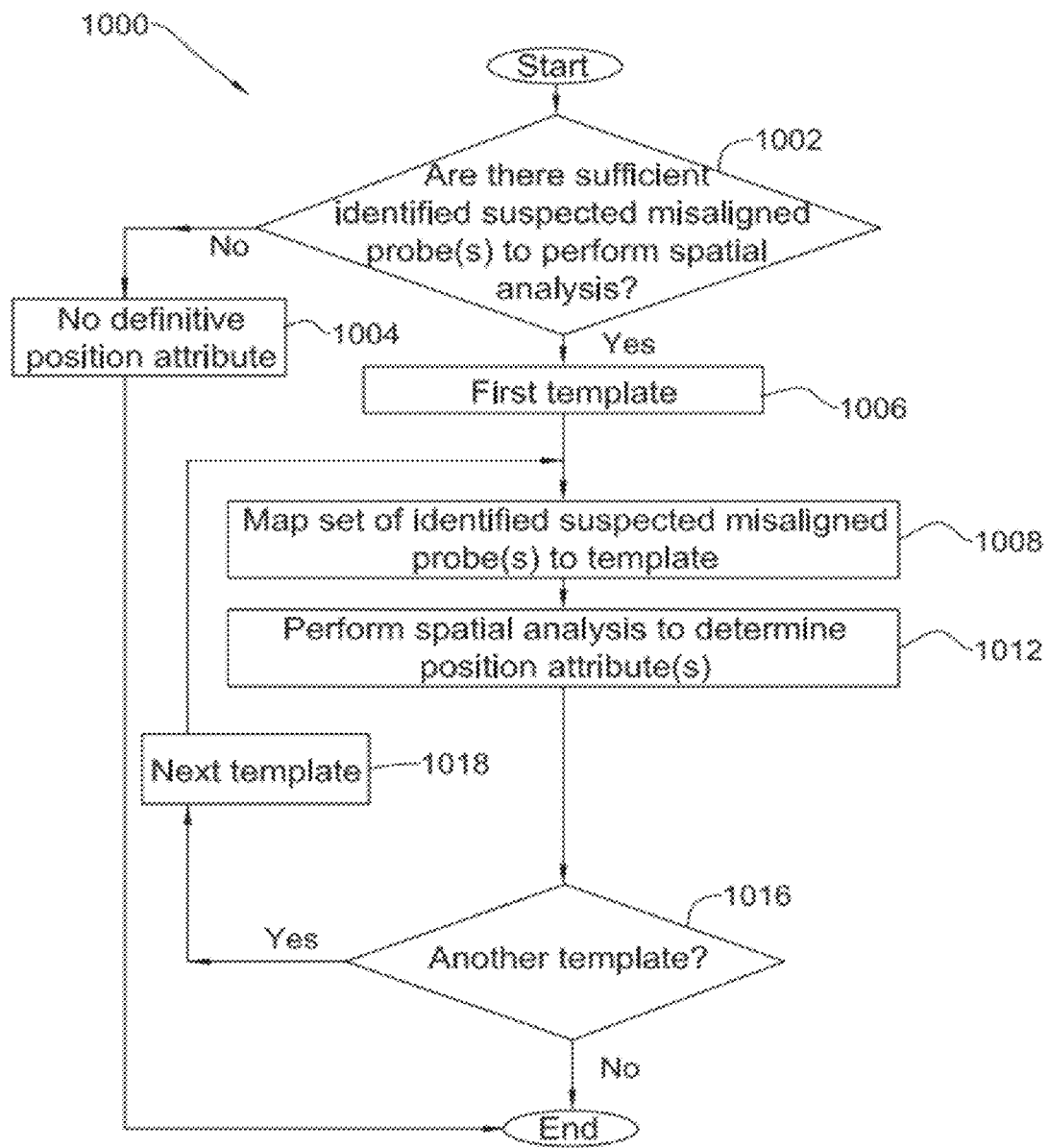
FIG. 10 is a flowchart of a method of determining position attribute(s) which includes spatial analysis, according to some embodiments of the disclosed subject matter.
Figure 13A:
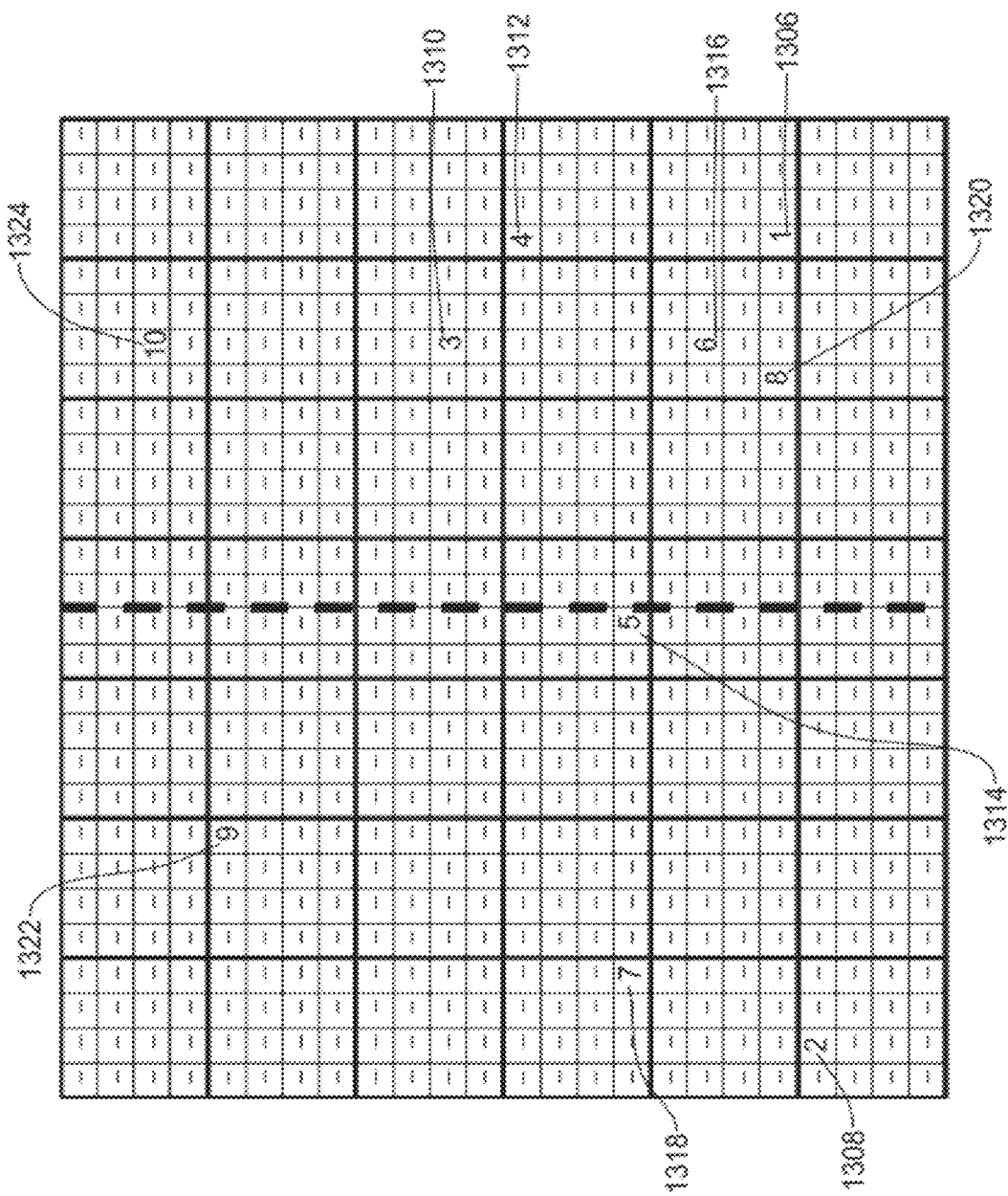
FIG. 13 (comprising FIGS. 13A, 13B, 13C, and 13D) illustrates a series of templates with mapped suspected misaligned probes, corresponding to the chart of FIG. 11, according to some embodiments of the disclosed subject matter.
Figure 13B:
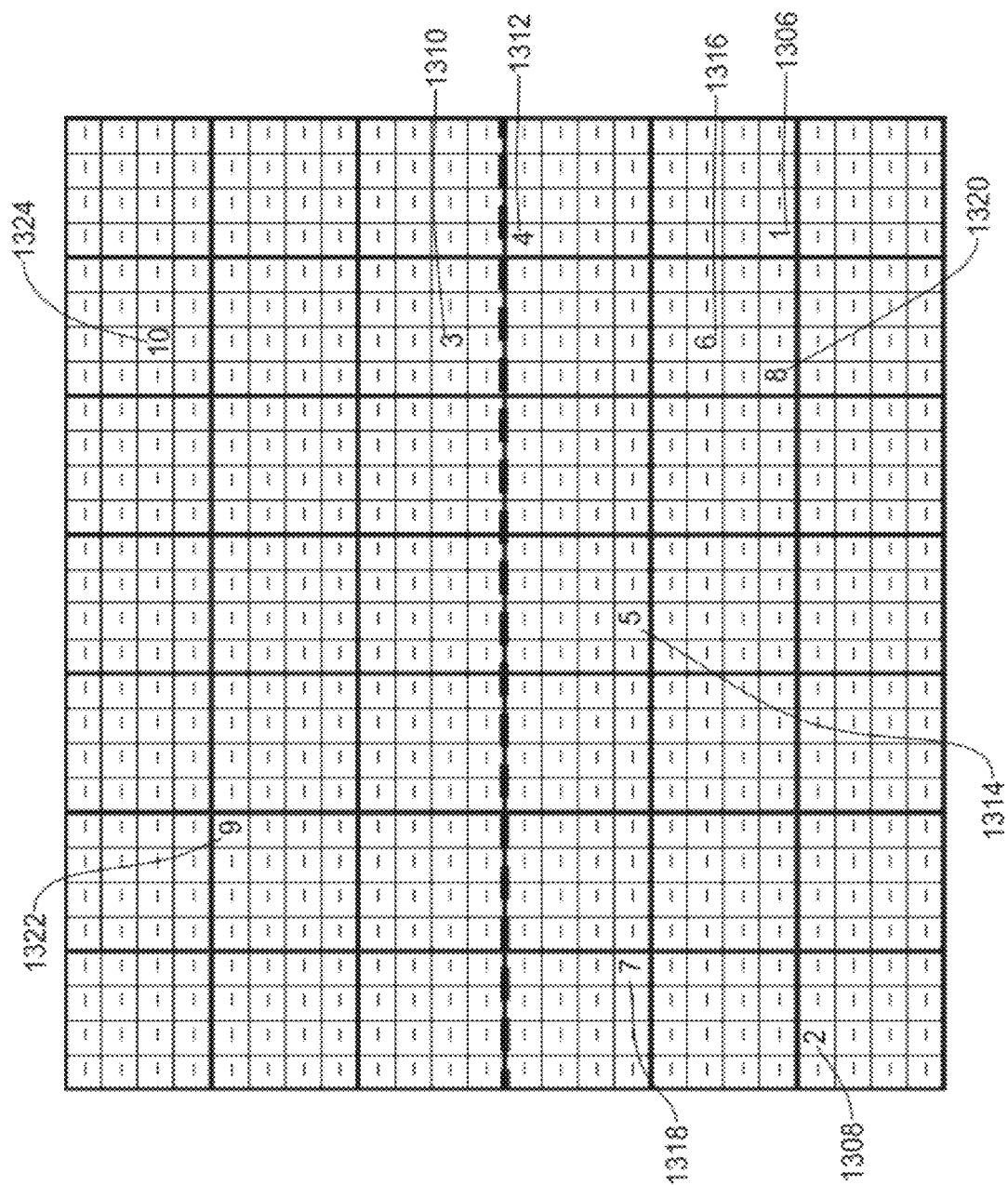
Figure 13C:
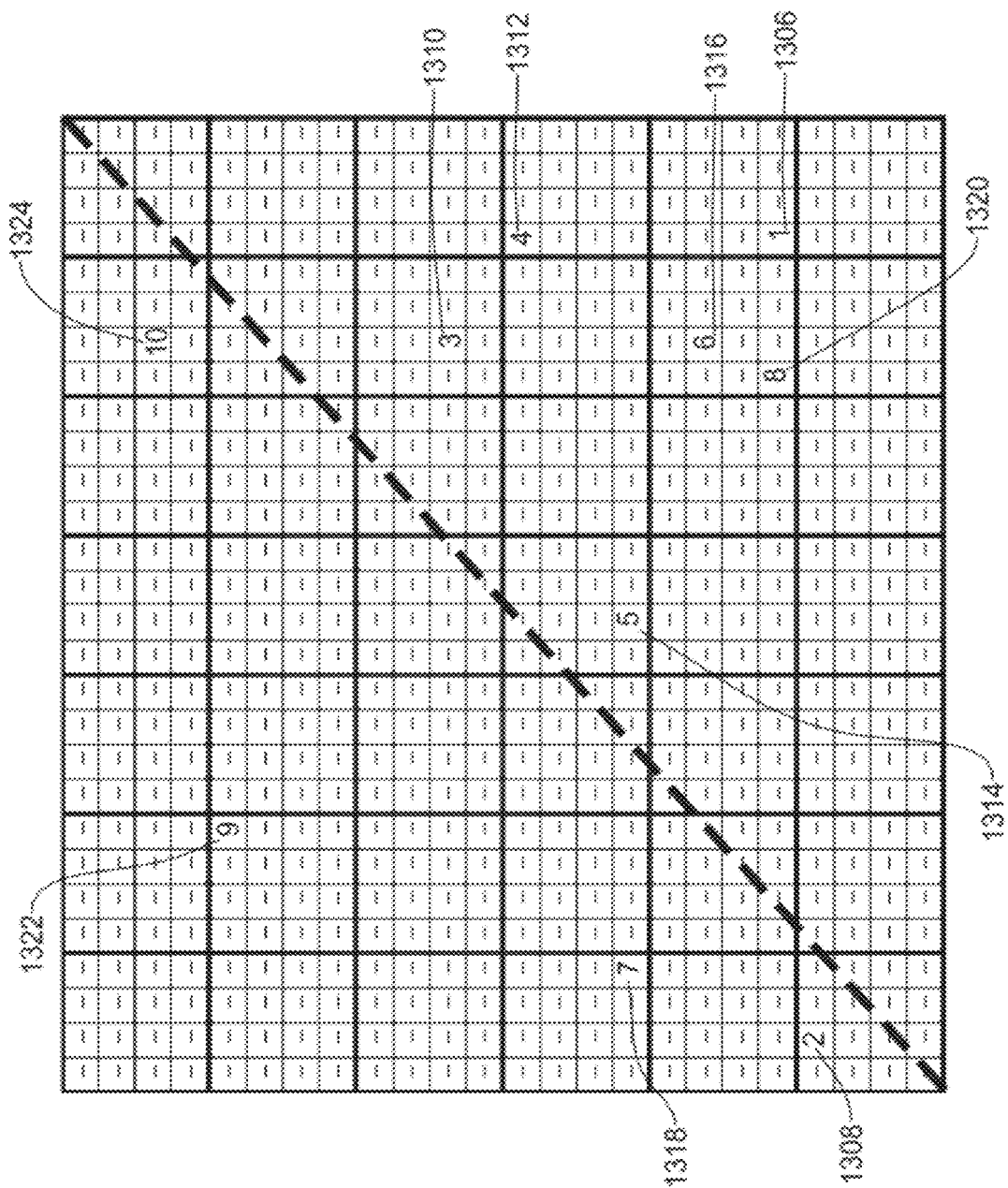
Figure 13D:
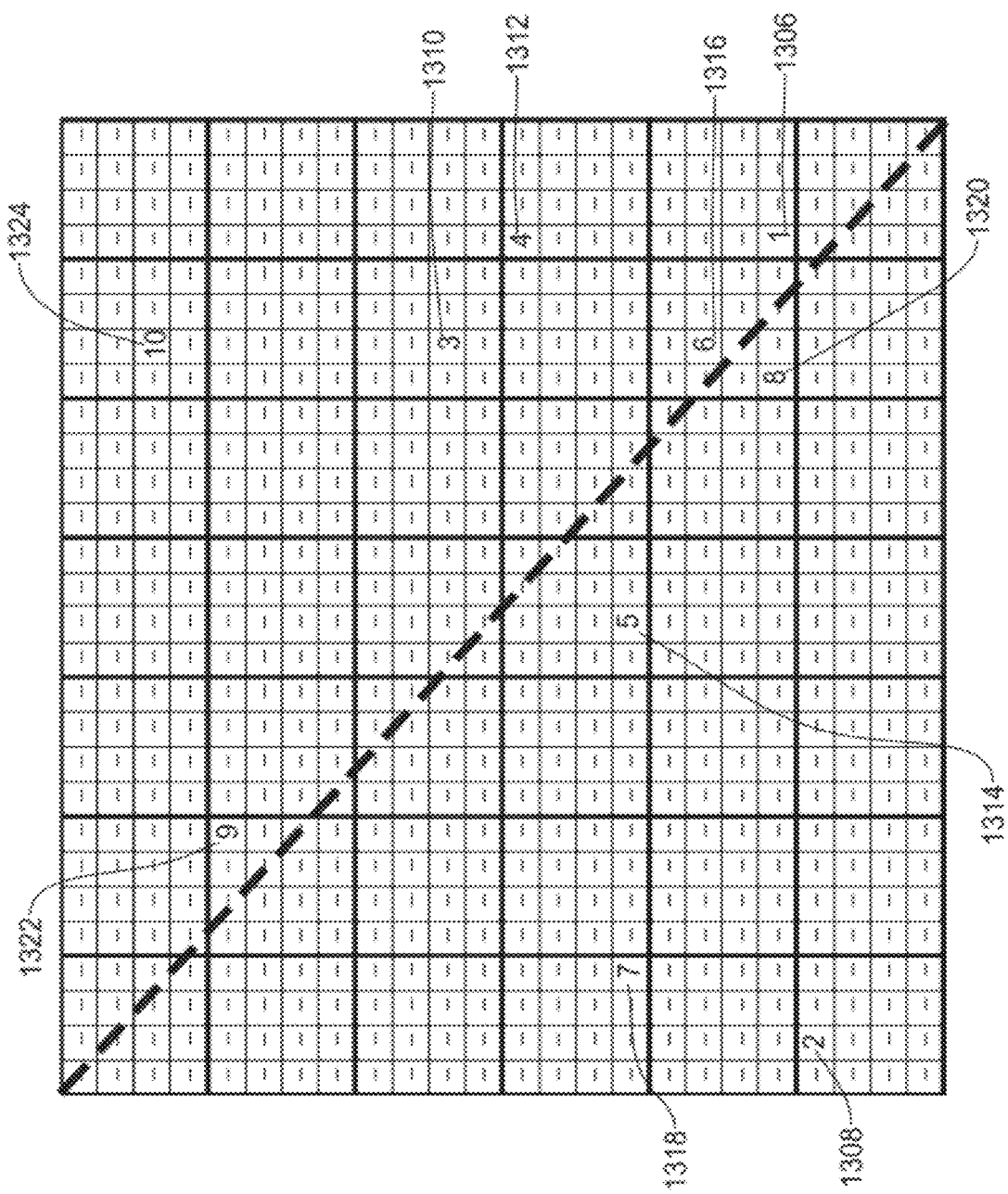
Figure 14A:
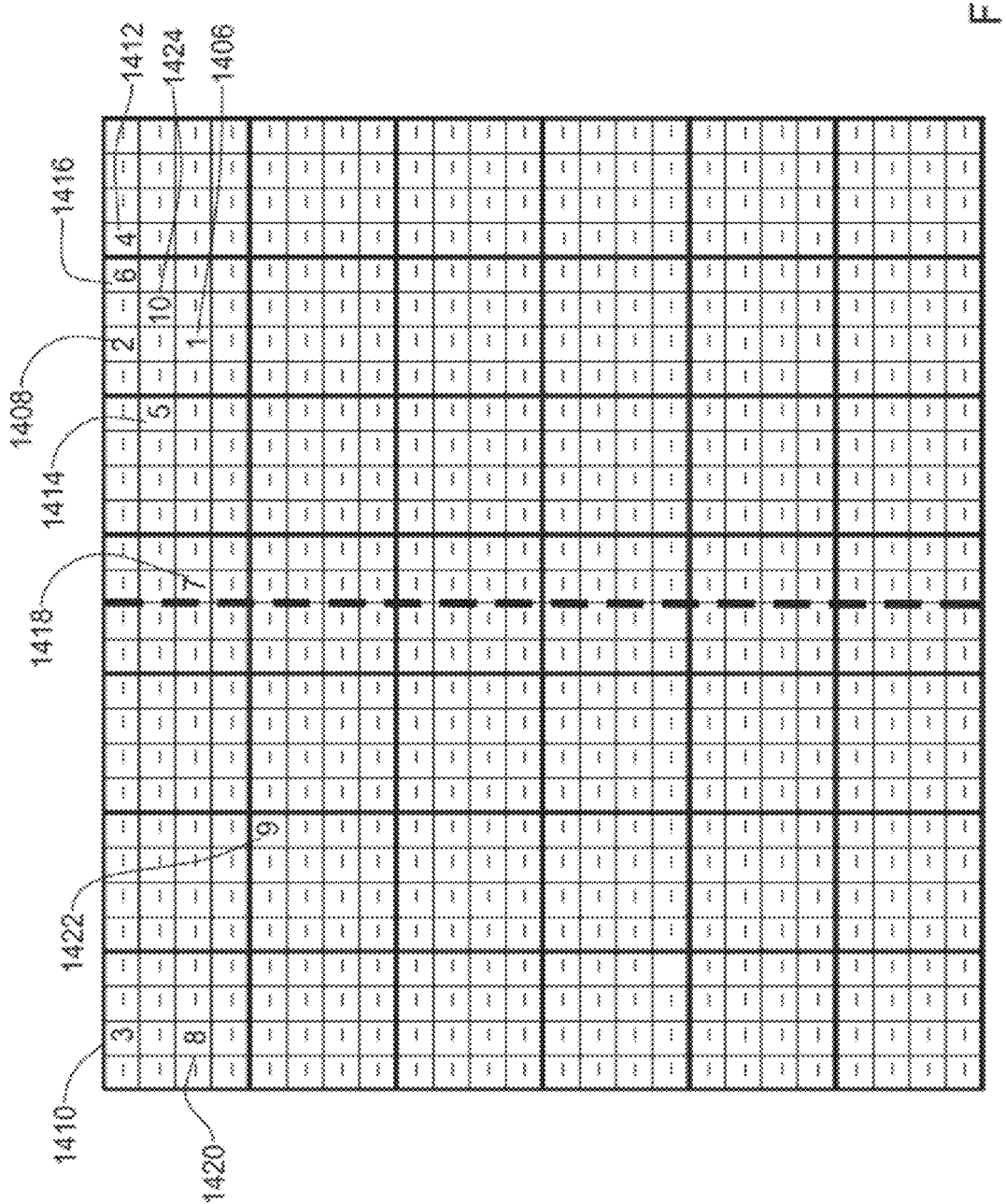
FIG. 14 (comprising FIGS. 14A, 14B, 14C, and 14D) illustrates a series of templates with mapped suspected misaligned probes, corresponding to the chart of FIG. 12, according to some embodiments of the disclosed subject matter.
Figure 14B:
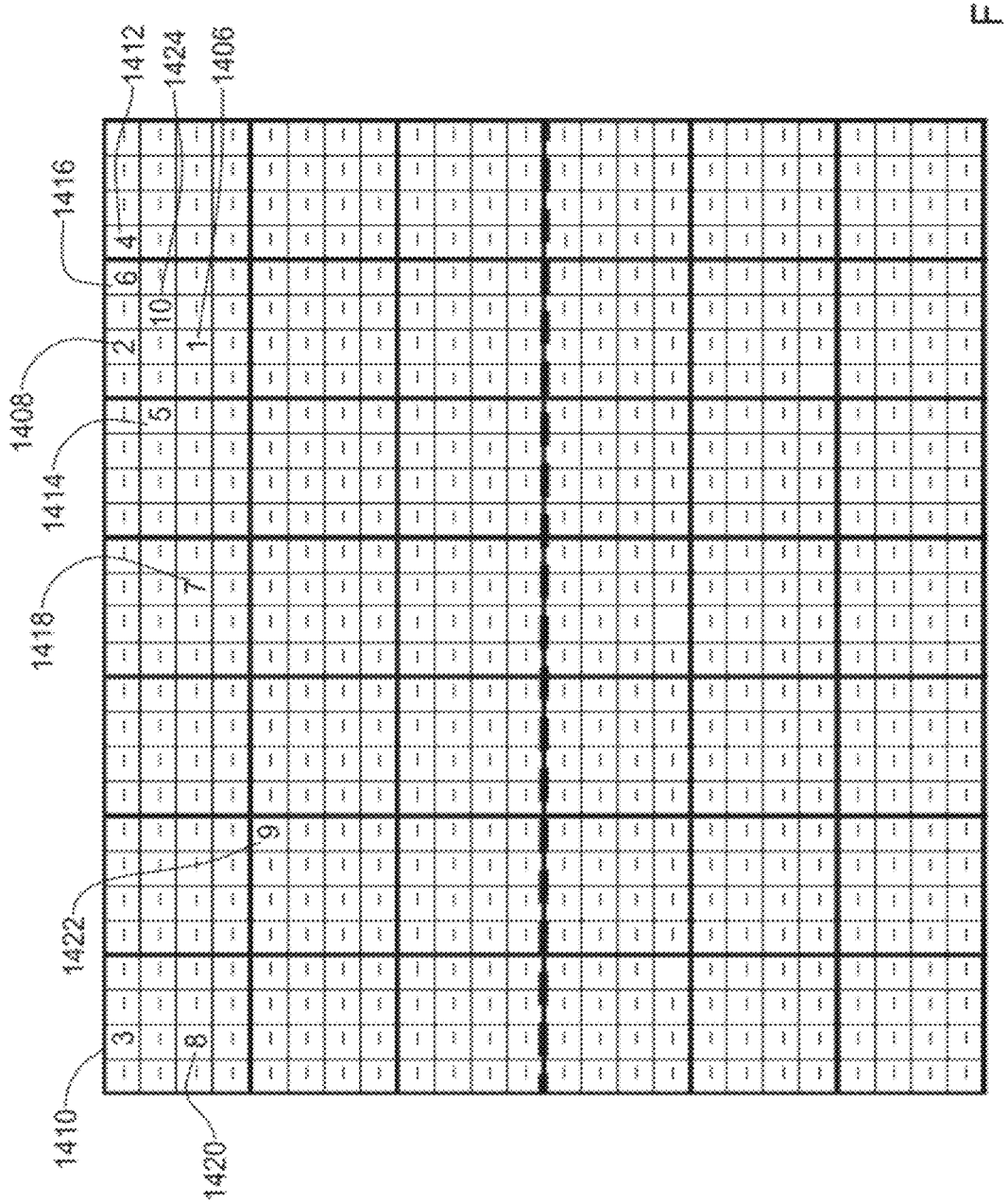
Figure 14C:
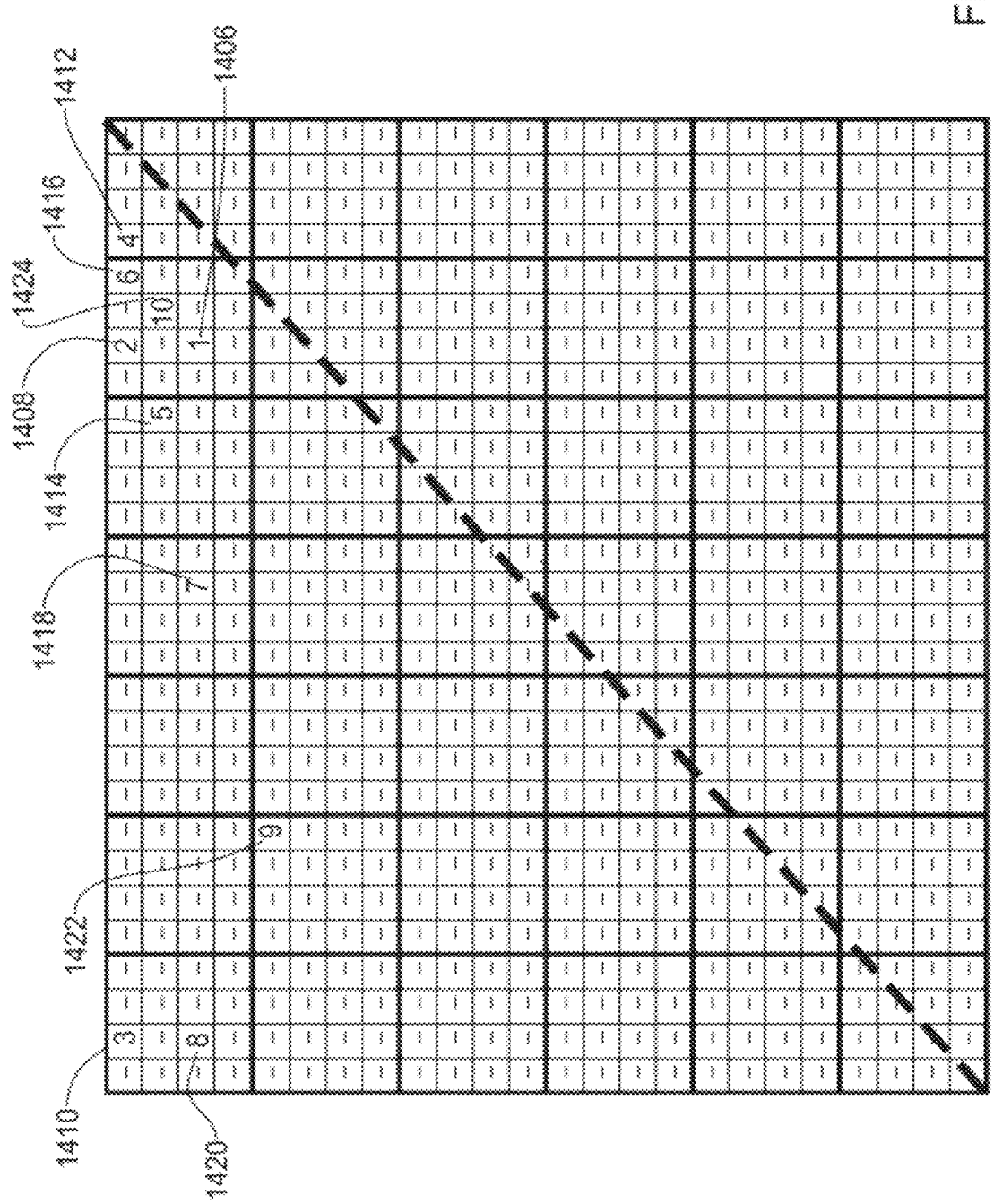
Figure 14D:
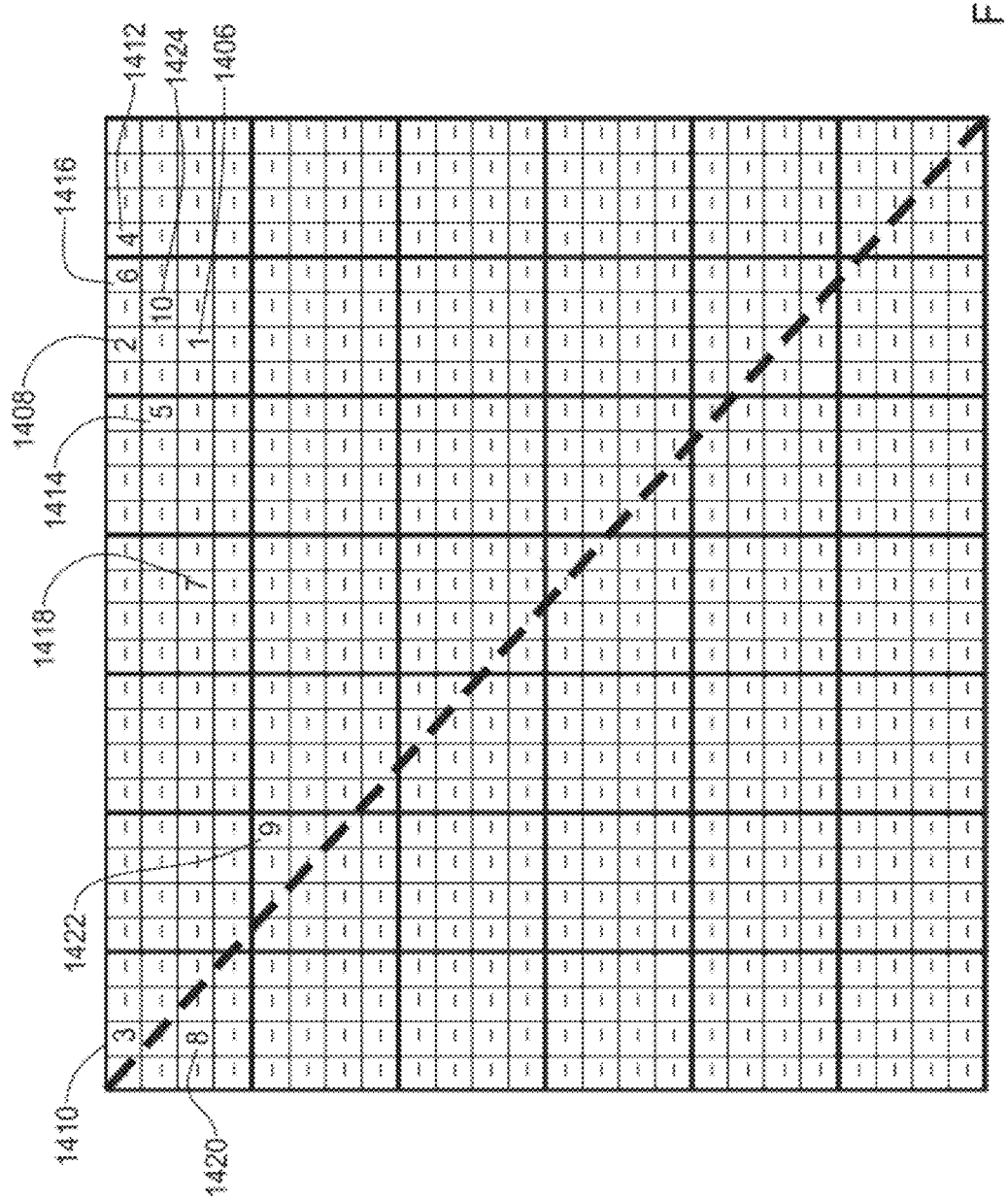

As mentioned above with reference to stage 270 and 274, in some embodiments position attribute(s) may be determined and in some of these embodiments the determination may include spatial analysis. FIG. 10 is a flowchart of an example of a method 1000 of determining position attribute(s) which includes spatial analysis, according to some embodiments of the invention. In some embodiments, position analyzer 164 performs method 1000. In some embodiments of the invention, method 1000 is performed by parametric analyzer 152. In some embodiments, stages which are shown in FIG. 10 as being executed sequentially may be executed in parallel. In some embodiments method 1000 may include more, less and/or different stages than illustrated in FIG. 10. In some embodiments, stages may be executed in a different order than illustrated in FIG. 10.

In the illustrated embodiments in optional stage 1002, it is determined if there are sufficient identified suspected misaligned probes to perform a spatial analysis. If there are sufficient identified suspected misaligned probes (yes to stage 1002), then method 1000 proceeds to stage 1006. If there are not sufficient identified suspected misaligned probes (no to stage 1002), then method 1000 concludes in stage 1004 that a definitive position attribute may not be determined by method 1000 and therefore ends.

In some embodiments, there may not be a minimum number of suspected misaligned probes needed to perform a spatial analysis, and stages 1002 and 1004 may be omitted.

In stage 1006, a first template 166 is provided. Depending on the embodiment, template 166 used as a first or subsequent template may represent any contiguous or non-contiguous area on one or more wafers, as described in more detail above. Depending on the embodiment, the selection of template 166 used as the first template or as a subsequent template may or may not be based on the type of data and/or anticipated misalignment problem, etc. as described in more detail above. Although method 1000 shows that if there is a plurality of templates, the templates are consecutively applied, in other embodiments with a plurality of templates, some or all of the templates may be applied in parallel.

In the illustrated embodiments, in stage 1008, a set of identified suspected misaligned probes is mapped to the template. Depending on the embodiment, the set of identified suspected misaligned probes may include all identified suspected misaligned probes (from stages 236/258) or may include only some of the identified suspected misaligned probes. As an example of the latter embodiment, in some cases where different templates represent different touchdowns, suspected misaligned probes may be divided into different sets based on the position of the touchdown on the wafer when the testing data which was used for identifying the suspected misalignment was generated. In some embodiments, where a probe which was assigned multiple times to a template is included in the set of suspected misaligned probes, the mapping of the probe to the template may include the same number of mappings as assignments or may include less. For instance the number of mappings may be less if only data corresponding to the probe being positioned in some of the locations represented by the various assignments leads to suspected misaligned identification. Continuing with an example of this instance, a probe's data may be referenced N times in a template, for example if the template includes N touchdowns and each of those touchdowns includes that probe. However in this example, if the probe has been classified as suspect in less than N touchdowns, the number of mappings may be less than N.

In the illustrated embodiments, in stage 1012, spatial analysis is performed in order to determine position attribute(s) for the set of identified suspected misaligned probes. In some embodiments, spatial analysis calculates one or more metrics which quantifies the placement of the set of identified suspected misaligned probes with respect to a contiguous or non-contiguous area on one or more wafers 115, represented by template 166. For example, the spatial analysis may include calculation of one or more spatial density metrics for each region of template 166 such as spatial probability, count, percentage, ratios, etc, and in this example spatial density per region is a type of position attribute. Continuing with the example for the case of spatial probabilities, in some embodiments the expected density of suspected misaligned probes in all template regions is assumed to be the same, approximated as the total number of suspected misaligned probes in all template regions combined divided by the total number of probes within all template regions combined (including both suspected misaligned probes, as well as those that are not suspected misaligned probes). Given this calculated average suspect misaligned probe spatial density, in these embodiments a statistical model is then used to calculate the probability of the occurrence of the actual (observed) number of suspect misaligned probes within each region of the template. If the calculated probability of the observations within one or more of the template regions is very low, which may, for example, be determined by comparison to a predefined limit, then the conclusion is that the actual suspected misaligned probe spatial density of those template regions is either significantly higher or significantly lower than the expected suspected misaligned probe spatial density. In other embodiments of this example, a statistical model may be used to compare the spatial densities of the expected to the actual identified suspected misaligned probes, when the expected identified suspected misaligned probe spatial densities in each region of the template is not equal to the average suspected misaligned probe densities of all regions combined (as described above), but rather a variation in the densities between regions is expected and is included in the statistical calculation. In some embodiments of the statistical calculations described here, the comparison of the probability of the actual number of suspected misaligned probes within each region to a predefined limit based on the probability of observing an expected suspected misaligned probe number within a region may be based on a cumulative probability density function, in which the calculated probabilities and corresponding predefined limits are based on the occurrence of "k or fewer", or "k or greater" suspected misaligned probes within a region (rather than on the occurrence of exactly k suspected misaligned probes). Therefore, depending on the embodiment of the example, calculated spatial probabilities may or may not be cumulative. Any appropriate statistical model can be used in this example, in various embodiments, including binomial (for 2 regions) where the spatial probabilities are binomial probabilities, higher nomial statistics, hypergeometric, Poisson, negative binomial (trinomial, higher nomial), geometric distribution, etc. It is noted that in some cases of this example, assuming that the expected distribution is random, the spatial analysis yields for a region a very high or very low spatial probability when it is more likely that the identified suspected misaligned probes are not randomly distributed among the regions (but rather the distribution is systematic). It is also noted that in some cases of this example, assuming that the expected distribution is random, it can be concluded that there is clustering of identified suspected misaligned probes in template region(s) with high spatial probability, for example corresponding to section(s) of a touchdown and/or of a wafer, etc. In another example with spatial densities, the spatial analysis may include additionally or alternatively, a simple count of the number of suspected misaligned probes per region. In this example, the count per region, the count per region as a percentage (or ratio) of the number of identified suspected misaligned probes, the count per region as percentage (or ratio) of that a nominal reference region, and/or any other type of function of count per region may be a type of position attribute. In another example, additionally or alternatively, spatial analysis may include calculation of spatial variation, for instance by calculating the position of a centroid (or "center of gravity") of identified suspected misaligned probe locations in order to identify if there is systematic spatial variation, and in this example spatial variation is a type of position attribute.

In the illustrated embodiments in stage 1016, it is determined if there is another template to examine. Depending on the embodiment there may be any number of templates (≥1). If there is another template (yes to stage 1016), then method 1000 iterates for a next template (stage 1018) beginning with stage 1008. Depending on the embodiment the same set of identified suspected misaligned probes or a different set (with or without overlapping members) may be mapped to the template. If there is no other template (no to stage 1016) then method 1000 ends.

Depending on the embodiment with method 1000, the position attribute(s) derived by method 1000 may be used in any manner (or may not be used at all), in deciding whether or not misalignment indication condition 172 has been met (in stage 278). For example, in some embodiments condition 172 may require, solely or in combination with other factors, that distribution of identified misaligned probes is unlikely to be random (and is therefore likely to be systematic). Continuing with the example, in some of these embodiments distributions of suspected misaligned probes that are unlikely to be random may in some cases be demonstrated by spatial probabilities for regions on a template (or for regions on each of a plurality of templates) that are above a predetermined floor and/or below a predetermined ceiling. As another example, in some embodiments, additionally or alternatively condition 172 may require, solely or in combination with other factors, that the number of suspected misaligned probes per region, the number per region as a percentage (or ratio) of the number of identified suspected misaligned probes, the number per region as a percentage (or ratio) of that of a nominal reference region, or similar calculation, be above a predetermined floor and/or below a predetermined ceiling. As another example, in some embodiments, additionally or alternatively, condition 172 may depend, solely or in combination with other factors, on which touchdown section(s) the identified suspected misaligned probes are clustered, and/or on which wafer section(s) the identified suspected misaligned probes are clustered, etc. As another example, in some embodiments condition 172 may be vary depending on whether or not the distribution is likely to be random, for instance with a different combination of attribute(s) required to be met for a distribution of suspected misaligned probes likely to be random than one likely to be systematic.

Although embodiments of the invention do not limit applications of the above described methods and systems, some examples will now be provided for further illustration to the reader which include position attribute determination.

Figure 11:
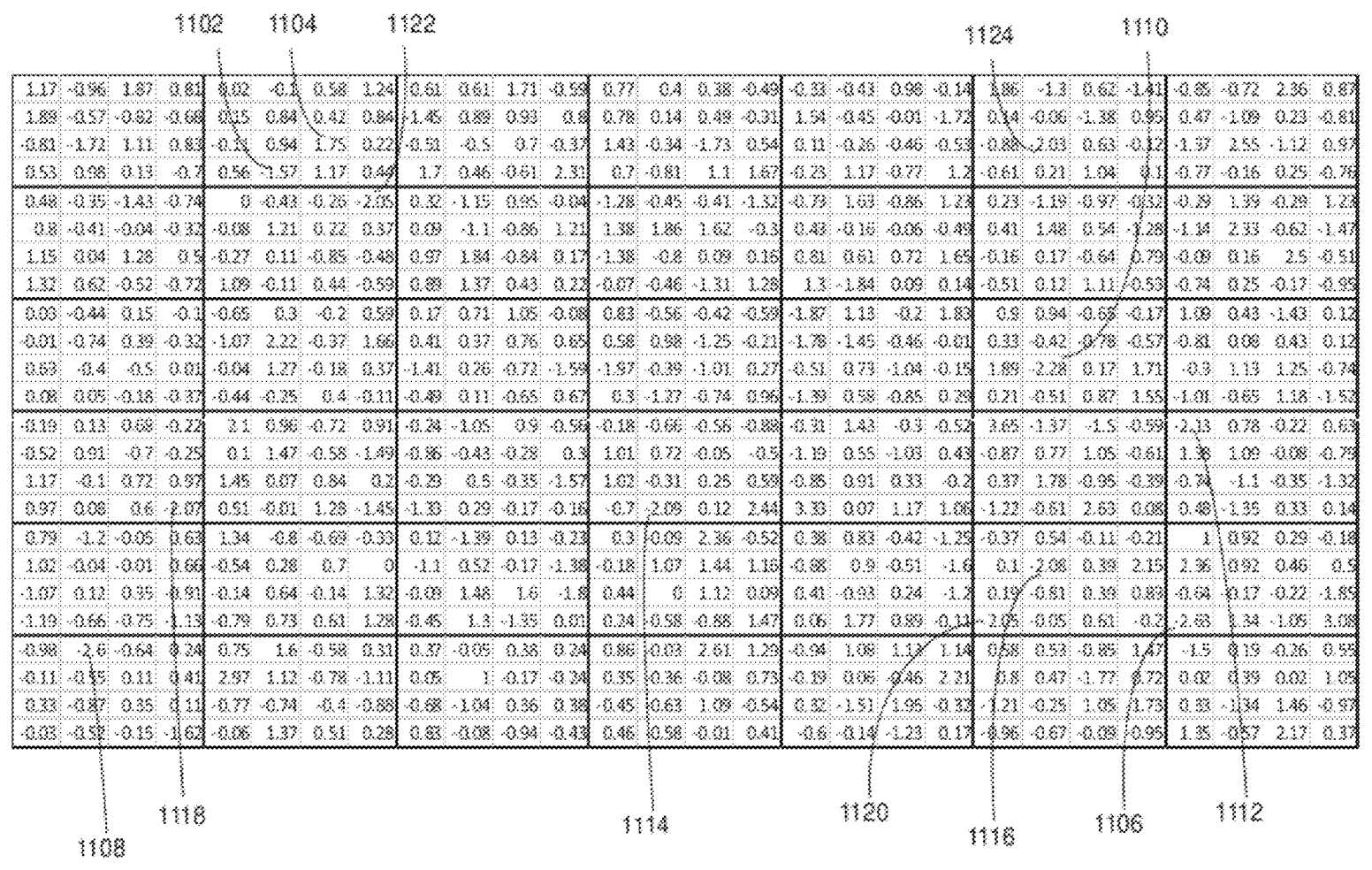

One example is based on FIG. 11. FIG. 11 is a chart 1100 of probe misalignment (offset from zero misalignment) in the X or Y direction for a probe array, where the misalignment values by probe location are random and the distribution of misalignment values is Gaussian, according to some embodiments of the present invention. In chart 1100 the probe array includes 672 probes, and it is assumed that 42 dies with 16 pins each can be tested in parallel in a touchdown. The shown offsets may be the initial offsets prior to beginning testing, or may be representative of a point in time during testing. It is noted that in a case where there is a drift in the negative direction, probes with negative offset, such as probe 1102, are at a greater risk of eventually falling off the bondpads and probing the bondpad edge or the passivation (rather than those with a positive offset). On the other hand, if there is drift in the positive direction, probes with positive offset, such as probe 1104, are at a greater risk of eventually falling off the bondpads and probing the bondpad edge or the passivation (rather than those with a negative offset).

Figure 12:
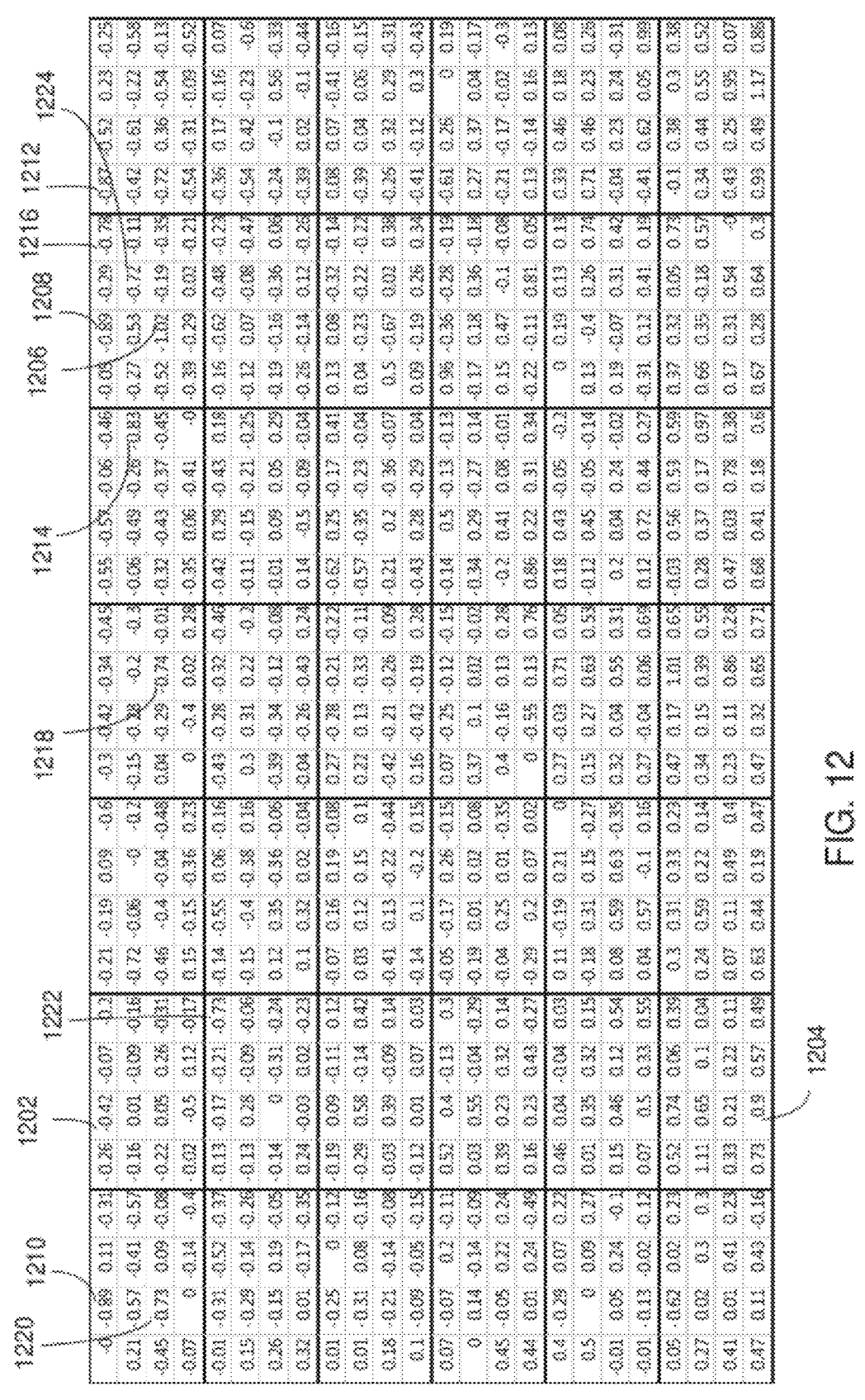

A second example is based on FIG. 12. FIG. 12 is a chart 1200 of probe misalignment (offset from zero misalignment) in the X or Y direction for a probe array, where the misalignment values by probe location are not random, according to some embodiments of the present invention. Probes near the top of the probe array and especially at the northeast corner, are systematically skewed with negative misalignment. In chart 1200 the probe array also includes 672 probes, and it is assumed that 42 dies with 16 pins each can be tested in parallel in a touchdown. The shown offsets may be the initial offsets prior to beginning testing, or may be representative of a point in time during testing. It is noted that in a case where there is a drift in the negative direction, probes with negative offset, such as probe 1202, are at a greater risk of eventually falling off the bondpads and probing the bondpad edge or the passivation (rather than those with a positive misalignment offset). On the other hand, if there is drift in the positive direction, probes with positive offset, such as probe 1204, are at a greatest risk of eventually falling off the bondpads and probing the bondpad edge or the passivation (rather than those with a negative offset).

The examples discussed below relate to X or Y misalignment because charts 1100 and 1200 show offsets in the X or Y dimension. However, the examples could additionally or alternatively relate to misalignment in the Z or theta dimension.

In these examples, in stages 202 CRES data are measured for all pins of each DUT, and/or an "opens" test is executed, optionally along with other tests of the test flow. The CRES data and pin-level "opens" failure data are generated in stage 204 and made accessible in stage 206.

In order to simplify the examples, it is assumed that completion of testing of a touchdown or a plurality of touchdowns acts as a trigger in stage 220.

In some embodiments of these examples, it is assumed that without having to perform a statistical analysis of parametric data, suspected misaligned probes are identified using pass/fail test(s) sensitive to misalignment such as the OPENs test, in stages 228 to 240.

In some of embodiments of the first example, using chart 1100, and based on the offsets listed and an assumed negative drift, it is assumed that the bondpad associated with the probe with the largest negative offset would be identified as suspected misaligned first due to failing first the pass/fail test, and then the bondpad associated with the probe with the next largest negative offset would be identified as suspected misaligned second due to failing second the pass/fail test, etc. Based on these assumptions, the bondpad associated with the probe 1306 with offset 1106 would be identified as suspected misaligned first, then the bondpad associated with the probe 1308 with offset 1108 next, then the bondpad associated with the probe 1310 with offset 1110 next, followed by the bondpad associated with the probe 1312 with offset 1112, followed by the bondpad associated with the probe 1314 with offset 1114, followed by the bondpad associated with the probe 1316 with offset 1116, followed by the bondpad associated with the probe 1318 with offset 1118, followed by the bondpad associated with the probe 1320 with offset 1120, followed by the bondpad associated with the probe 1322 with offset 1122, and followed by the bondpad associated with probe 1324 with offset 1124. It is noted that the probes are labeled so that the reader can more easily follow the remainder of the discussion.

In some of embodiments of the second example, using instead chart 1200, and based on the offsets listed and an assumed negative drift, it is assumed that the bondpad associated with the probe with the largest negative offset would be identified as suspected misaligned first due to failing first the pass/fail test, and then the bondpad associated with the probe with the next largest negative offset would be identified as suspected misaligned second due to failing second the pass/fail test, etc. Based on these assumptions, the bondpad associated with the probe 1406 with offset 1206 would be identified as suspected misaligned first, then the bondpad associated with the probe 1408 with offset 1208 next, then the bondpad associated with the probe 1410 with offset 1210 next, followed by the bondpad associated with the probe 1412 with offset 1212, followed by the bondpad associated with the probe 1414 with offset 1214, followed by the bondpad associated with the probe 1416 with offset 1216, followed by the bondpad associated with the probe 1418 with offset 1218, followed by the bondpad associated with the probe 1420 with offset 1220, followed by the bondpad associated with the probe 1422 with offset 1222, and followed by the bondpad associated with probe 1424 with offset 1224. It is noted that the probes are labeled so that the reader can more easily follow the remainder of the discussion.

In some embodiments of these examples, additionally or alternatively, some or all of suspected misaligned probes listed above may be identified in stages 250 to 262 using parametric data, for instance CRES measurements. For example, assume that after each touchdown the data of all 672 pins from that touchdown are analyzed together in one group, or in separate groups for example depending on electrical and/or physical characteristics of the pins. In this case, since the analysis is performed after each touchdown, timing of when the suspected misaligned probes are identified as suspected misaligned is accurate to the touchdown level. However, in some embodiments, the data of the pins from a range of (a plurality of) touchdowns may be analyzed together in one group or in separate groups for example dependent on electrical and/or physical characteristics of the pins, and in these embodiments the timing is accurate to the touchdown range.

In some embodiments of these examples, in stage 270, the determination of attribute(s) for a set of identified suspected misaligned probes includes at least the determination of position attribute(s) using spatial analysis, for example as described above with reference to method 1000 of FIG. 10. In some embodiments of these examples, it is assumed that the determination of position attribute(s) is performed after enough touchdowns have been completed for there to be sufficient identified misaligned probes to perform a spatial analysis.

In some embodiments of these examples, user-defined location template(s) 166 are applied (for instance in stage 1006/1018). For simplicity of description it is assumed that each template represents a touchdown and each template is divided into geometric regions that are anticipated to display enhanced suspected misaligned probe density in the event of the misalignment mechanisms being considered. An illustration of a simple series of four such templates is shown in each of FIGS. 13 and 14, for the first and second example respectively, according to some embodiments of the invention. In these figures, each of the eight templates 166 is shown in a separate figure (namely FIGS. 13A, 13B, 13C, and 13D for the first example, and FIGS. 14A, 14B, 14C, and 14D for the second example) and each template divides the probe array into two regions containing approximately equal numbers of probes. In some cases, additional or different regions may be identified within the probe arrays of the user-defined series of location templates.

In some embodiments of these examples, referencing the probe offset scenario of the first example in FIG. 11, the set of probes which are likely to be identified as suspected misaligned in the case of negative drift, as discussed above, is mapped onto each of the templates of FIG. 13 (comprising FIGS. 13A, 13B, 13C, and 13*d*) in stage 1008. Similarly, referencing the probe offset scenario of the second example in FIG. 12, the set of probes which are likely to be identified as suspected misaligned in the case of negative drift, as discussed above, is mapped onto each of the templates of FIG. 14 (comprising FIGS. 14A, 14B, 14C, and 14D) in stage 1008. Each suspected misaligned probe is numbered in FIG. 13 (comprising FIGS. 13A, 13B, 13C, and 13D) and FIG. 14 (comprising FIGS. 14A, 14B, 14C, and 14D) in the order in which identification as suspected misaligned in the given scenario would be expected to occur. It is assumed for simplicity of description that with gradually worsening probe alignment, the sequence in which the indicated probes are identified as suspected misaligned can be surmised based on the probe offset values of FIG. 11 and FIG. 12, as discussed above.

In some embodiments of these examples, a numerical or statistical comparison of the density of the identified suspected misaligned probes occurring in the defined regions of each location template is performed as part of the spatial analysis of stage 1012 in order to determine if the density is statistically higher in one region that the other(s), or equivalently, if the number of identified suspected misaligned probes for any given user-defined region is statistically unlikely (either too few, or too many), given the total number of suspect probes from across the entire probe array. The results of this spatial analysis indicate the nature of any non-uniformity of identified suspected misaligned probe locations, which may be used subsequently as a criterion for deciding on misalignment indication.

It is noted that in some embodiments of these examples, if a drift in probe alignment occurs as probing progresses, the location of the probes exhibiting abnormal CRES measurements may be a random or systematic in nature. In the illustrated embodiments of this example, it is assumed that the statistical model used for comparing the densities is a binomial model and that cumulative binomial probabilities (an example of spatial probabilities described above) are therefore calculated. FIG. 15 and FIG. 16 show cumulative binomial probabilities, for the random pattern in the first example and a systematic pattern in the second example respectively, according to some embodiments of the invention. Referring first to FIG. 15, the raw data shown on the left side of FIG. 15 are derived from FIGS. 13*a*, 13*b*, 13*c*, and 13*d*, showing for regions A and B of each, the number and sequence of probes being identified as suspected misaligned up to point where the first ten suspected misaligned probes have been so identified. The left side of FIG. 16 has a similar meaning, based on data derived from FIGS. 14*a*, 14*b*, 14*c*, and 14*d*.

In the illustrated embodiments of these examples, in FIG. 15 and FIG. 16, the column with heading labeled "Average Bad Probe Density" indicates the fraction of probes within the probe array that have been identified as suspected misaligned. Thus, in the first example in FIG. 15, at the point of identification of the first suspected misaligned probe, the fraction is $1/672$, for a density of 0.001488, and at the point of the identification of the tenth suspected misaligned probe, the fraction is $10/672$, for a density of 0.01488. As the intermediate suspect probes appear, the listed average suspect probe densities are calculated similarly. For simplicity and the convenience of this example, as mentioned above, each of the four user-defined regions contain the same number of probes, with 336 probes each for region A and region B, as indicated in the row labeled "# probes/region". In general, this need not be the case.

In some embodiments of the first and second example in FIG. 15 and FIG. 16, respectively, the columns of the right-hand table are the calculated cumulative probabilities of observing the number of suspected misaligned probes found within the various user-defined regions, based on binomial statistics. In some of these embodiments, the cumulative binomial probability of getting k or fewer suspected misaligned probes in one region out of n probes in the probe array is given by:

$$P = \sum_{j=0}^{j=k} \binom{n}{j} p^j q^{(n-j)},$$

where $$\binom{n}{j} = \frac{n!}{j!(n-j)!},$$

p is the average bad probe density which equals the cumulative number of suspected misaligned probes in all regions at that point divided by the total number of probes in the probe array, and q equals 1−p.

Referring, for example, to the bottom row of probabilities in FIG. 15 that have been calculated for the "Region A" regions of the four templates, reading 44% (probability 1502), 26% (probability 1504), 44% (probability 1506), and 44% (probability 1508), one finds the probability of those regions containing 4 or fewer suspect probes (i.e., 44%), and 3 or fewer suspect probes (i.e., 26%), out of the 336 total probes contained within each region, at the calculated overall Average Bad Probe Density value of 0.01488. In the present example, a lower probability value indicates that fewer suspect probes have been observed within the region than would be expected at the given Average Bad Probe Density.

In some embodiments of the first example, as the data of FIG. 15, and FIGS. 13A, 13B, 13C, and 13D, are derived from a spatially random series of initial probe offsets (as shown in FIG. 11), the probabilities associated with regions A and B of the four templates are only slightly polarized. The lowest probability value of 9% (probability 1510) is associated with region A of FIG. 13B at the point at which a total of 8 total suspected misaligned probes have been identified, with only one located in region A (versus 7 suspect probes within region B). Inspection of the location of the first ten suspect probes in FIG. 13 confirms that there is some tendency for more to fall in the bottom half of the probe array (region B) than in the top half (region A).

In some embodiment of the second example, the data of FIG. 16, and FIGS. 14A, 14B, 14C, and 14D by comparison, are derived from a set of initial probe offsets that are far less spatially random (shown in FIG. 12). Thus, the probabilities associated with regions A and B of the four templates in this example are highly polarized. The lowest probability values of 1% (probabilities 1602 and 1604) are associated with region B of FIGS. 14B and 14C at the point at which a total of 10 total suspect probes have been identified. In this example, none of the suspected misaligned probes are found to be located in the bottom half (region B of FIG. 14B) or in the south-east corner of the probe array (region B of FIG. 14C), which is a very improbable result if a spatially random suspect probe distribution is given. A low probability value of 4% (probability 1606) is also found for the south-west corner of the probe array (region A of FIG. 14D). Inspection of the location of the first ten suspect probes in FIG. 14 confirms that there is a very strong tendency for suspect probes to appear in the upper half of the probe array than in the lower half.

In some embodiments of these examples, it is assumed that attribute determination in stage 270 also includes incidence of each probe being identified as suspected misaligned. For instance, if data from each touchdown is analyzed separately, incidence may in some cases refer to the number of touchdowns in which the analyzed data leads to an identification of a probe as suspected misaligned.

In some embodiments of these examples, the decision on whether condition 172 for indication of misalignment has been met, in stage 278 depends at least partly on the calculated cumulative binomial probabilities. Additionally or alternatively the decision can be a function of other attribute(s), such as the number of probes identified as suspected misaligned, the values of the incidence counters, rolling time-average CRES associated with suspected misaligned probes, etc.

In some embodiments of these examples, a primary criterion required for indicating misalignment is greater than or equal to 6 probes identified as suspected misaligned (that is, the cumulative total of identified unique suspected misaligned probes is six or greater), and with 3 or more of these identified suspected misaligned probes having incident counter values greater than or equal to 2 (that is, at least three probes having been identified as suspected misaligned probes at least twice, suggesting consistency). Further, for example, a secondary criterion may be applied to assign a signature of a "systematic probe alignment problem" to the probing problem if the probability of suspect probe location configuration for any (or combination of) region in a user-defined spatial template is, say, 5% or less, at the average bad probe density calculated when 6 probes have been identified as suspected misaligned of which 3 were identified twice. In the present examples, if a probing problem has been determined by the primary criterion to exist, but a systematic probe alignment problem has not been determined by the secondary criterion, then the signature of the probing problem may in some cases be designated as "random".

In some embodiments of the first example, applying these hypothetical criteria to the data of FIG. 15, and assuming that the given incident counter criterion of consistency of failure for at least three probes twice has been fulfilled, it can be seen that the nature of the suspected misalignment can be analyzed when 6 probes have been identified as suspected misaligned. Given the spatial templates applied, and probability calculations, at this point the minimum probability of 20% (probabilities 1512 and 1514) would exceed the 5% probability required for designating the problem as "systematic", and thus, would be designated instead as "random". In contrast, in some embodiments of the second example, based on the data of FIG. 16, at the point when 6 probes have been identified as suspected misaligned, the positional analysis reveals that three regions exhibit probabilities of 5% or less (probabilities 1608, 1610, and 1612), causing the probing problem to be designated as "systematic".

In some embodiments of these examples, in cases where the probing problem has been designated as random, there may be additional criteria stipulated by condition 172 to indicate misalignment, than when the probing problem has been designated as systematic. For instance, if a probing problem has been determined to be random in nature, then in some cases the additional criteria may include an average CRES value of probes identified as suspected misaligned exceeding a fixed value and/or exceeding a value threshold relative to the average CRES value of probes which have not been identified as suspected misaligned. Similarly, in some embodiments of these examples, in cases where the probing problem has been designated as systematic, there may be less criteria stipulated in condition 172 to indicate misalignment, than when the probing problem has been designated as random. For instance, systematic classification may be sufficient reason to indicate misalignment, and no additional attribute(s) evaluation may be required.

Figure 17:
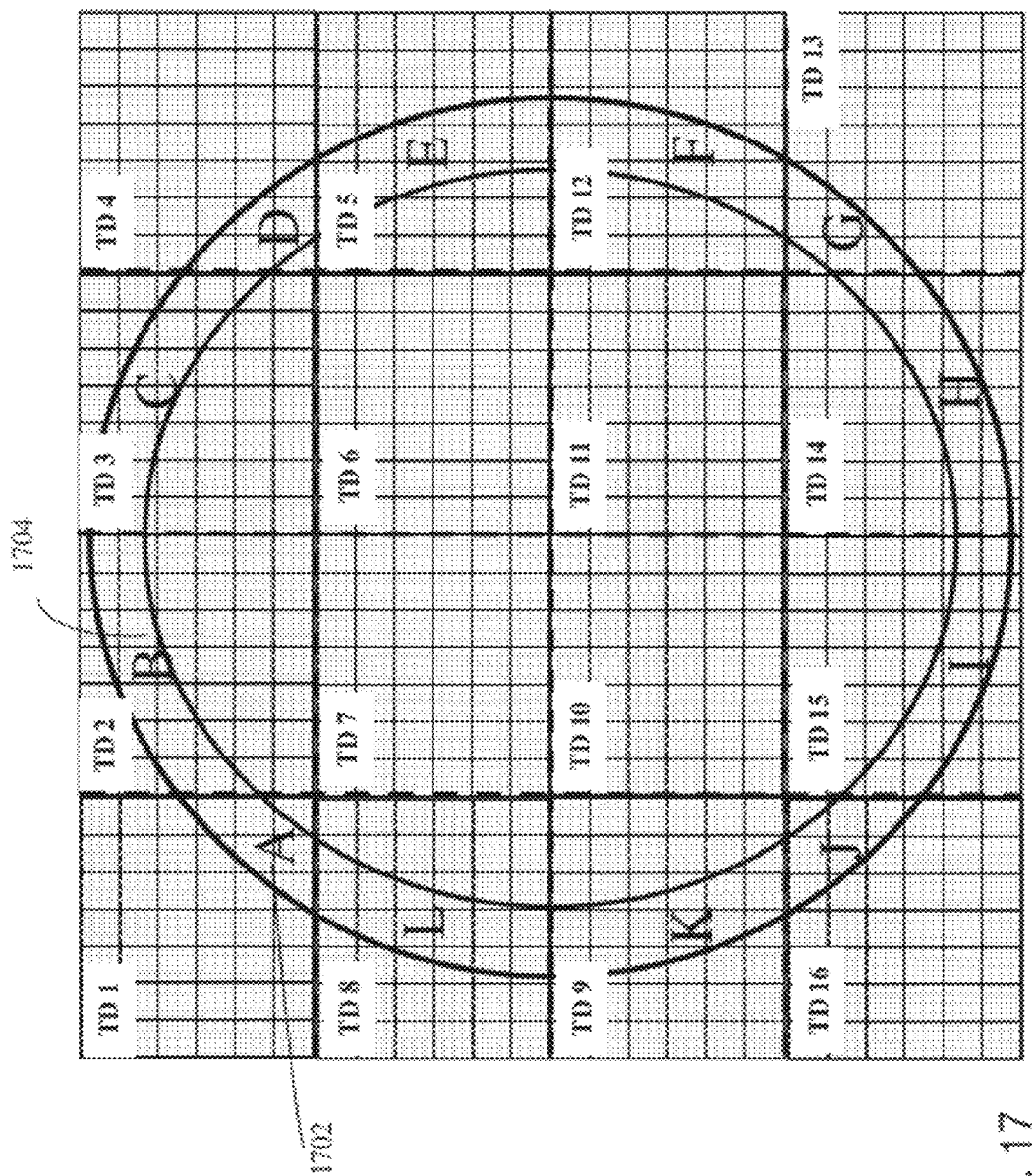
FIG. 17 illustrates a scenario in which templates are defined to highlight misalignment problems involving only probes near the wafer edge, according to some embodiments of the disclosed subject matter.

In other examples, method 200 proceeds as in the first and second example described above. However these examples separately track identified suspected misaligned probes for touchdowns in different sections of a wafer. In these examples, templates may be defined that are "touchdown-specific" (that vary with the touchdown involved). Therefore in these embodiments the analysis of suspect probe positions as part of the attribute determination in stage 270 is not performed for a cumulative series of suspect probe locations across all touchdowns of a wafer (or series of wafers), but performed rather on the suspected misaligned probe location data across multiple wafers, cumulative for similarly located touchdowns. For instance, if a probe alignment problem exhibits a specific dependence on the location being probed on a wafer, in such a case, the templates applied for positional analysis may need also to vary with the location being probed on a wafer (i.e., touchdown location). FIG. 17 illustrates a scenario in which templates 166 are defined to highlight misalignment problems involving only probes that fall near the wafer edge, according to some embodiments of the invention. In FIG. 17 the templates highlight edge problems impacting the probabilities of becoming suspected misaligned in the labeled regions of each of the indicated touchdowns that overlap the wafer edge. FIG. 17 shows the probecard being applied to the wafer in the labeled touchdown sequence 1 to 16, with probe array edges delineated by the heavy dashed lines. The edge of the wafer is indicated by the heavy solid line of the outer circle. It is noted that 12 of the 16 touchdowns in this example have associated with them a unique template for spatial analysis of wafer edge probing problems, composed of the regions labeled by the letters A through L, each bounded by the edges of the associated touchdown, and by an arc at the wafer edge and an arc within the wafer interior. Region A 1702 is applied for analysis of Touchdown 1, Region B 1704 for Touchdown 2, and so on. As illustrated in this particular figure, the templates within a given template series do not necessarily contain the same number of defined regions. For the template set illustrated in FIG. 17, touchdown 6, 7, 10, and 11 consist only of a single region, while the other twelve touchdowns each comprise two regions (i.e. the labeled region and the region interior to the labeled region).

In these examples, position attribute determination with respect to the defined regions of FIG. 17 for a set of the identified suspected misaligned probes, as part of stage 270, may in some embodiments occur after each touchdown. In some of these embodiments the position attribute determination may be performed using data accumulated from similar touchdowns across multiple wafers. In some cases of these examples spatial probabilities are computed separately after each touchdown for the corresponding edge regions A through L and the corresponding (unlabeled) non-edge interior regions. In other cases of these examples, after a plurality of wafers have been tested, spatial probabilities are computed separately for each edge region A through L and for each (unlabeled) non-edge regions, cumulatively across those wafers. In some embodiments of these examples, the criteria for determining if misalignment indication condition 172 has been met may involve comparing probabilities derived from the various edge regions A through L to the (unlabeled) non-edge regions of these examples. In some embodiments of these examples, the criteria for determining if a misalignment indication condition has been met may require combining the results of statistical analysis from several regions, to establish a pattern spanning the entire wafer. For instance, if only a few regions within a segment of the wafer edge are found to have systematically skewed probabilities (perhaps indicating a wafer chuck 114 and/or probecard 112 with a particular tilt causing one point at the wafer edge to be higher than the point at the opposite diagonal), interpretation of the problem would be different than if all of the defined edge regions exhibit skewed probabilities.

The remainder of the description will focus on testing of packaged devices rather than devices contained on a wafer in die format.

Before describing in more details some embodiments of systems and methods of packaged device testing, an overview will now be presented.

As mentioned above, in packaged format, temporary contact for testing purposes is made between test socket contacts and the "pins" of the packaged device. In some embodiments the form and structure of the package pins may vary depending on the embodiment, as may the contacts of the package-compatible test socket being used. There are myriad types of test sockets and of device packages; however, most or all have in common the need to establish extremely low resistance connections between individual package "pins" and the corresponding socket contacts. Thus, these elements may in many cases take the form of tiny metallic pins, formed leads, balls, and the like. When leads and contacts are clean, properly socketed, and well-aligned each device pin and corresponding socket contact should touch one another with sufficient metal-to-metal cross-sectional area overlap and sufficient force to allow for minimal contact resistance. Similar to the challenge of maintaining excellent probe-to-pad alignment during wafer probing, the consistent alignment of pins-to-contacts while performing package test operations is made difficult by small package pin-to-pin pitch (often less than 1 mm), by the large number of pins within a package (often several hundred in number), and/or by the repetitive mechanical stress associated with socketing/unsocketing devices (often involving tens of thousands of insertions during the lifetime of a socket). In test operations involving high temperature test conditions, thermal stresses also come into play. In some cases, the repetitive mechanical and thermal stresses a socket is subjected to during its normal use in manufacturing test operations may gradually cause socket elements to wear out, eventually failing to comply with dimensional specifications, and as a result, may become prone to misalignment during packaged device insertions. In case of a misalignment event, one or more of the device pins may not make contact with the corresponding package contact(s) with enough overlap area or force to produce the normal low contact resistance, and may rather exhibit an elevated contact resistance. The condition may be electrically exhibited through a direct Cres measurement, of the type described in more detail above, and in some cases may in addition or instead be exhibited by other electrical measurements, for example, by a resistive drop in power supply voltages reaching the chip's internal Vdd bondpad, or by an unusual RC delay in a high-speed signal path.

In a high volume test manufacturing operation; automated handling equipment (AKA handler) is used to insert the packaged parts into sockets on test loadboards prior to the testing, and to remove them after testing has been completed. In some embodiments, parallel test hardware is provided permitting simultaneous testing of multiple packaged devices seated in multiple sockets at the same time. Whether socketing and testing packaged devices individually, or performing socketing and testing in a multiple-device parallel fashion, any misalignment between the package(s) and the socket(s) has the potential of causing an electrically measurable aberration. For example, insertion of devices into sockets with inadvertent tilt in the Z-dimension could cause the device pins that have not been inserted deeply enough into the socket to exhibit increased contact resistance because of reduced cross-sectional area contact with socket contacts and/or due to reduced pin-to-contact force. To provide another example, with the wear on a socket that occurs over an extended use period, the fit of packed parts within that socket could become less snug than required to guarantee consistent pin-to-contact connection on all pins. Misalignment in the X/Y directions, as well as rotational misalignment, may eventually result. In this case, some of the pins of devices inserted into that socket may suffer from electrical degradation during testing, while others remain normal. To provide a final example, with the wear on a socket that occurs over an extended use period, random individual contacts within the socket may become physically deformed and/or marginally misaligned, eventually resulting in a poor electrical pin-to-contact connection on the corresponding device pins, while remaining sound on pins corresponding to socket contacts that have not degraded. Given these examples, a bimodality or multimodality in the distribution of relevant electrical measurements from the set of all pins within the package may in some cases occur, and with traceability of the incongruous measurements to individual pin-to-contact positions (within the packaged device and socket), suspected misaligned contacts can be logged. In addition, given these examples, it is expected that if the misalignment described becomes severe, the devices being tested may in some cases actually fail tests within the test flow with known pin continuity sensitivity, such as "opens", and the identity of the associated failing contacts may also be logged.

Figure 18A:
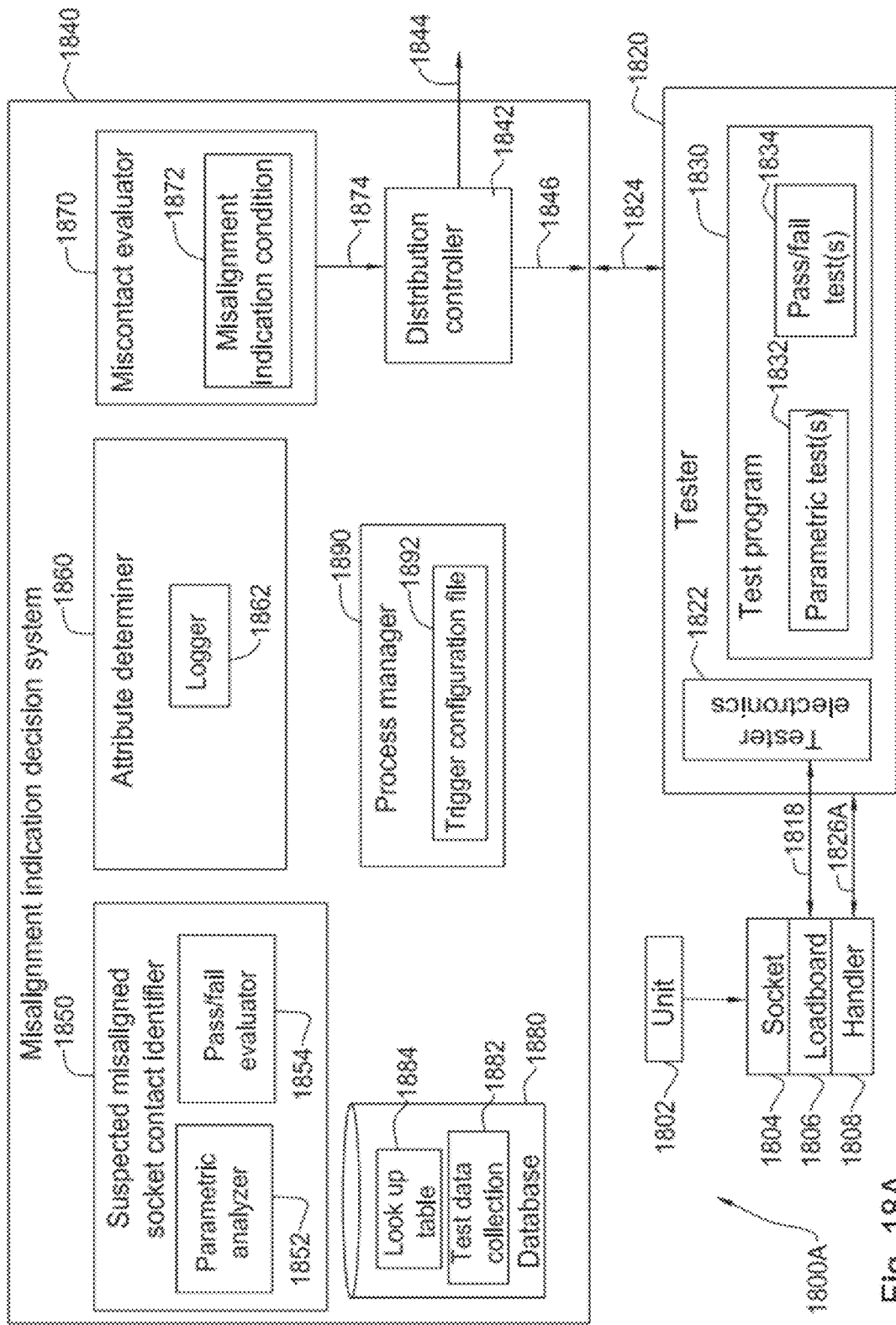
FIG. 18A shows a packaged device testing system, according to some embodiments of the disclosed subject matter.
Figure 18B:
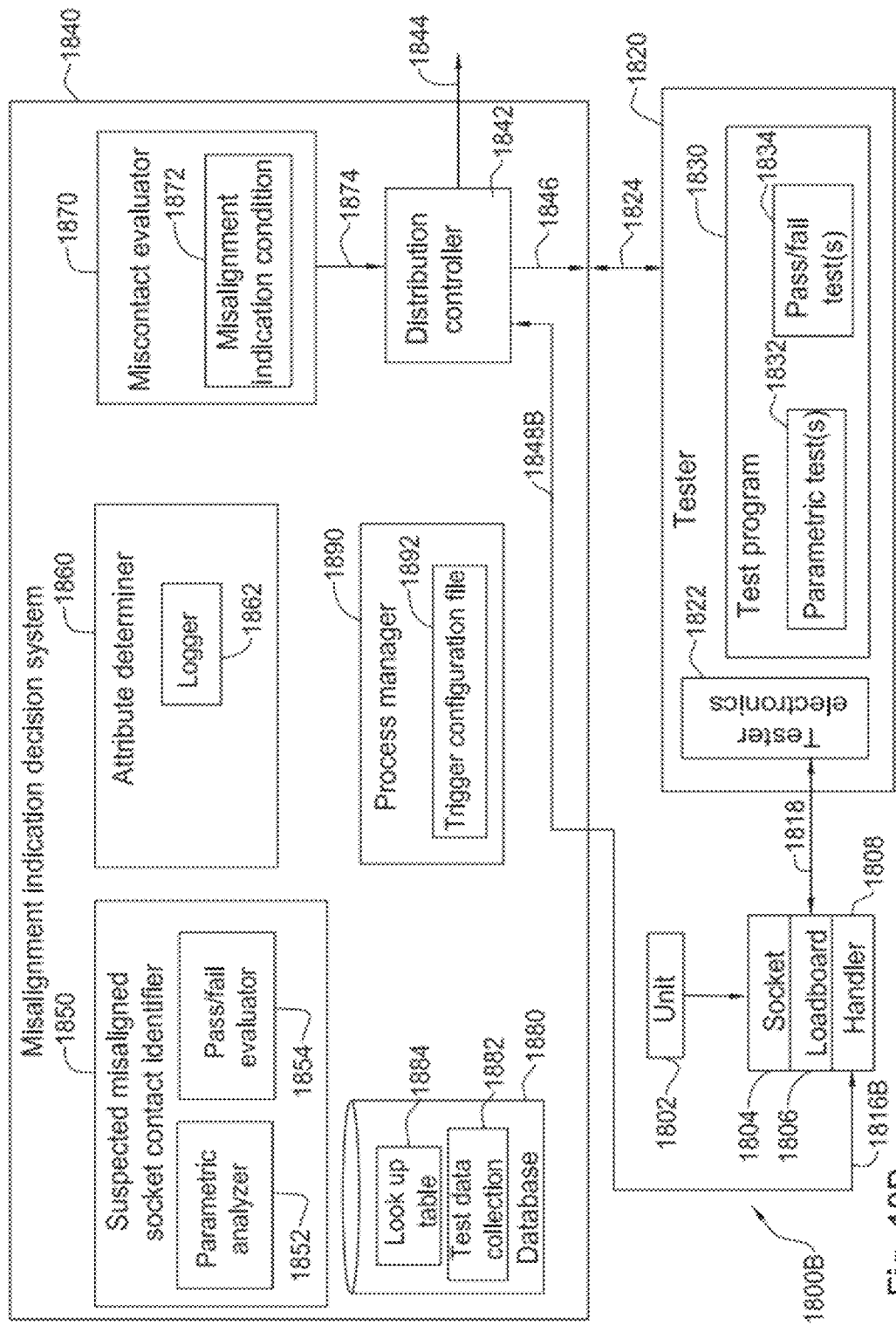
FIG. 18B shows a packaged device testing system, according to some other embodiments of the disclosed subject matter.

Refer now to FIGS. 18A and 18B which illustrate some embodiments of a packaged device testing system. For simplicity's sake, in the description herein a module or arrow is labeled with a number and the letter A or B when referring specifically to the module or arrow in FIG. 18A and FIG. 18B respectively. However a module or arrow is labeled with only a number when referring to the module in either FIG. 18A or 18B and/or in both FIGS. 18A and 18B. FIG. 18A illustrates a packaged device testing system 1800A and FIG. 18B illustrates a packaged device testing system 1800B, according to various embodiments of the present invention. In the illustrated embodiments, packaged device testing system 1800 (e.g. system 1800A and/or 1800B) is configured to test semiconductor packaged devices.

In the illustrated embodiments, packaged device testing system 1800 comprises a tester 1820 configured to test packaged devices (i.e. units) 1802, a misalignment indication decision system 1840 configured to make a decision on whether or not to indicate misalignment, and a handler 1808 (AKA handling equipment) configured to cause the contacts of a socket 1804 to make contact with pins on unit 1802, for example by mechanically transporting and aligning unit 1802 to socket 1804, and then inserting unit 1802 into socket 1804.

In various embodiments of the invention, any of the modules in FIGS. 18A and 18B may be made up of any combination of software, hardware and/or firmware that performs the functions as described and explained herein. In some embodiments, packaged device testing system 1800A and/or 1800B may include fewer, more and/or different modules than shown in FIG. 18A and FIG. 18B respectively. For example, in some of these embodiments, some or all of tester 1820 and misalignment indication decision system 1840 may be integrated together. In some embodiments, the functionality of packaged device testing system 1800A and/or 1800B may be divided differently than illustrated among the modules illustrated in FIG. 18A and FIG. 18B respectively. In some embodiments, packaged device testing system 1800 may include additional, less, and/or different functionality than described herein.

In the illustrated embodiments of packaged device testing system 1800A, misalignment indication decision system 1840 and tester 1820 communicate with one another via a channel 1824, and tester 1820 and handler 1808 communicate with one another via a channel 1826A. In the illustrated embodiments of packaged device testing-system 1800B, misalignment indication decision system 1840 communicates with tester 1820 via channel 1824, and misalignment indication decision system 1840 communicates with handler 1808 via a channel 1816B.

In some embodiments, the communication between handler 1808 and other modules of system 1800 (for example with tester 1820 in FIG. 18A via channel 1826A, or with misalignment indication decision system 1840 in FIG. 18B via channel 1816B) may occur, in some cases, via any suitable channel including inter-alia: parallel digital communication, RS-232 serial communication, a Transmission Control Protocol/Internet Protocol TCP/IP network, a GPIB bus (General Purpose Interface Bus), also known as a IEEE-488 or HP-IB bus (Hewlett-Packard Instrument Bus), a Universal Serial Bus (USB), an IEEE 1394 Interface, any appropriate channel using high-speed electronic communication technology, etc.

In some embodiments, the communication between misalignment indication decision system 1840 and tester 1820, assuming different units, is via any suitable channel 1824 including inter-alia a local area network such as an Ethernet connection with a network protocol (e.g. TCP/IP), a Universal Serial Bus (USB), an IEEE 1394 Interface, any appropriate channel using high-speed electronic communication technology, etc.

In the illustrated embodiments, tester 1820 applies electronic test sequences to packaged devices currently being tested (also known as devices under test DUTs) through a test program 1830. Test program 1830 digitally controls tester electronics 1822 for generating physical test signals, such as pin electronics cards, pattern generator boards, power supplies, and the like, to drive test signals and to provide power to all socket contacts in socket 1804. Depending on the embodiment, tester 1820 may support testing of multiple packaged devices in parallel and/or testing each package device sequentially.

In the illustrated embodiments, specification of the test content, for example the desired signal transition timing, voltage or current levels, pass/fail criteria, vector/data pattern selection, vector/data pattern sequences, test subroutine and pattern content, test flow sequencing and branching, etc. is made through compiled or linked files constituting test program 1830, created for example using custom tester-specific programming languages and a library of application programming interface (API) functions. In the illustrated embodiments, the test content of test program 1830 includes pass/fail test(s) 1834 and/or parametric test(s) 1832. A pass/fail test 1834 is a single-valued test which yields a single valued result indicating whether or not the tested value is greater than (or in other testing less than) a given value/limit. If the tested value is greater than (or less than) the given limit, the single valued result is "failure", but if not then the single valued result is "pass". A parametric test 1832 yields a resulting measurement that can take on any of multiple values. Depending on the implementation, the resulting measurement value for a particular parametric test 1832 may be provided by analog measurement equipment (as part of testing electronics 1822), or may be honed in through the performance of a plurality of single valued tests. As an example of the latter implementation, a series of single valued tests may be performed, in which the given value/limit is repeatedly varied until determination of a range of the actual measurement value to within the desired resolution. In some embodiments, parametric test(s) 1832 include at least one or more different parametric tests whose resulting measurement values are sensitive to misalignment between contact(s) on socket 1804 and pin(s) on packaged device 1802 which is undergoing testing. In some embodiments, additionally or alternatively, pass/fail test(s) 1834 include at least one or more different pass/fail tests whose results are sensitive to misalignment between contact(s) on socket 1804 and pin(s) on packaged device 1802 which is undergoing testing.

In some embodiments, commercially available testers used for electronic device testing operations today, along with their operating systems, may be adapted to become tester 1820. As an example, the Verigy HP93K tester or the Teradyne J750 tester may be considered typical of such commercially available systems.

In the illustrated embodiments, tester electronics 1822 are electrically connected to the traces of loadboard 1806 on which socket 1804 is mounted while the contacts of socket 1804, for example composed of gold plated beryllium-copper structures, make temporary contact to the surface of the leads of packaged device 1802 currently being tested. The specific contact structures and contacting mechanisms depend on package technology. Metal socket contacts may be variously formed as metal springs (such as helical springs, or as "Pogo Pins"), as thin metal beams, or as metal fingers, clips, or clamps, to name a few examples. Contacting mechanisms in some package technologies may involve a simple insertion of packaged device 1802 into receiving socket 1804, while others, for example, may involve application of a clamping mechanism to maintain adequate lead-to-socket-contact force after insertion has occurred. The socket contacts provide a mechanical and electrical interface through which electrical signals and power supply voltages are applied to the device during testing, and also pass voltage responses from the device back to the tester for evaluation, for example via tester-socket signal(s) 1818. Socket 1804 may have as many as several hundred socket contacts attached for testing, which may span an area of several centimeters.

In some embodiments, tester 1820 may be the same tester as tester 120 (described with reference to system 100 above), for example a tester which is adapted to perform wafer testing and/or packaged device testing. In other embodiments, tester 1820 may be a different tester than tester 120.

In some embodiments, each packaged device pin should be precisely positioned within the XY plane corresponding to the positions of the contacts of the socket, and should also be positioned properly in the Z dimension such that the device pins all are within the plane of the socket contacts when the packaged device has been inserted for testing, and should also be rotationally aligned. In some of these embodiments, good electrical contact between socket contacts and pins can only be achieved when these socket contacts are positioned within a few micrometers of the centers of the associated pins while also being correctly positioned in the Z and theta dimensions. In some of these embodiments, maintaining the correct alignment of each one of the hundreds of socket contacts involved without error or adjustment, while hundreds of successive packaged devices are inserted in a semiconductor manufacturing packaged device testing operation is challenging.

In the illustrated embodiments, misalignment indication decision system 1840 includes a suspected misaligned socket contact identifier 1850 configured to identify suspected misaligned socket contact(s), an attribute determiner 1860 configured to determine one or more attributes relating to identified suspected misaligned socket contact(s), a miscontact (AKA suspected misaligned socket contact) evaluator 1870 configured to evaluate the attribute(s) to decide whether or not a condition for indicating misalignment has been met and misalignment is to be indicated. In some embodiments, misalignment indication decision system optionally also includes a distribution controller 1842 configured to distribute a misalignment indication, a database 1880 configured to store a test data collection and/or a look up table, and/or a processor manager 1890 configured to control the operation of one or more of the modules in misalignment indication decision system 1840. Any of the modules in misalignment indication decision system 1840 may be made up of any combination of software, hardware and/or firmware that performs the functions as described and explained herein. In some embodiments, misalignment indication decision system 1840 may comprise a machine specially constructed for the desired purposes, and/or may comprise a programmable machine selectively activated or reconfigured by specially constructed program code. In some embodiments, misalignment indication decision system 1840 includes at least some hardware.

In some embodiments, misalignment indication system 1840 may be the same system as misalignment indication system 140 (described with reference to system 100 above), for example a misalignment indication system which is adapted for wafer testing and/or packaged device testing. In other embodiments, misalignment indication system 1840 may be a different system than misalignment indication system 140. More specifically in some embodiments, any of suspected misaligned socket contact identifier 1850, attribute determiner 1860, miscontact evaluator 1870, process manager 1890, distribution controller 1842 and/or database 1880 may be the same element as suspected misaligned probe identifier 150, attribute determiner 160, misprobe evaluator 170, process manager 190, distribution controller 142 and/or database 180 respectively (described above), adapted for wafer testing and/or packaged device testing. In some other embodiments, additionally or alternatively, any of suspected misaligned socket contact identifier 1850, attribute determiner 1860, miscontact evaluator 1870, process manager 1890, distribution controller 1842 and/or database 1880 may be a different element than suspected misaligned probe identifier 150, attribute determiner 160, misprobe evaluator 170, process manager 190, distribution controller 142 and/or database 180 respectively.

In some embodiments, misalignment indication decision system 1840 may include fewer, more and/or different modules than shown in FIG. 18A and FIG. 18B. For example, in some of these embodiments, part or all of database 1880 may be separated out of misalignment indication decision system 1840 (for example included instead in tester 1820 or in a separate unit), or may be omitted. As another example, in some embodiments, suspected misaligned socket contact identifier 1850 may be separated out of misalignment indication decision system 1840. For instance, in some embodiments there may be advantages to the identification provided by suspected misaligned socket contact identifier 1850 even when separated from the functionality of the remainder of system 1840. In some embodiments, the functionality of misalignment indication decision system 1840 may be divided differently than illustrated among the modules illustrated in FIG. 18A and FIG. 18B. In some embodiments, misalignment indication decision system 1840 may include additional, less, and/or different functionality than described herein. For example misalignment indication decision system 140 may include additional functionality relating to testing and/or support functionality for additional modules such as computer terminals, networked test program servers, and/or networked data storage systems.

In the illustrated embodiments, test data collection 1882 is shown stored in database 1880 but in some embodiments some or all of test data collection 1882 is made accessible to identifier 1850 without being stored in database 1880 or without being stored at all. Test data collection 1882 includes test results from parametric tests 1832 and/or pass/fail tests 1834 relevant to a current decision on whether or not to indicate misalignment (for example results of parametric and/or pass fail tests which are sensitive to misalignment). For pass/fail tests, only failing results may be included in test data collection 1882 or both passing and failing results may be included.

Embodiments of the current invention do not limit test data collection 1882. However for the sake of further illustration to the reader, some examples will now be presented. Assuming for simplicity of description that test data collection 1882 relates the single socket 1804, then possible examples of test data collection may include inter-alia: data over a plurality of packaged devices for a single socket contact, data over a plurality of packaged devices for selected socket contact(s), data over a plurality of packaged devices for socket contact(s) previously identified as suspected misaligned, data over a plurality of packaged devices for all socket contacts, data from a single packaged device for selected socket contacts, data from a single packaged device for all socket contacts, etc.

In some embodiments, the scope of test data collection 1882 varies depending on the type of misalignment indication decision to be made based on that test data collection. For example, if looking for variation within a packaged device, for instance due to individual misaligned socket contacts, then in some cases a particular test data collection 1882 may include data from a single packaged device. As another example, if looking for variation in successive packaged devices socketings, for instance due to drift in one or more directions, then in some cases a particular test data collection may include data from a plurality of packaged device socketings.

Depending on the embodiment, the extent of test data collection 1882 may be defined a-priori or may be dynamic. For example, assume that n identified suspected misaligned socket contacts (n≥1) are required in order to make a useful misalignment indication decision. In this example, test data collection 1882 needs to include sufficient test data to allow the identification of at least n suspected misaligned socket contacts. However, since the amount of data which would be sufficient to allow identification of at least n suspected misaligned socket contacts is not known a-priori, the extent of test data collection 1882 may either be dynamic based on the real time identification, or may be predefined to be sufficiently large so that identification of n suspected misaligned socket contacts (n≥1) is sufficiently probable to meet the demands of the implementation. In another example, there may not be a requirement for n identified suspected misaligned socket contacts (n≥1) nor any other requirements which cannot be determined a-priori, and therefore in this example, the extent of test data collection 1882 may be predefined. In another example, if in a previous misalignment indication decision certain socket contact(s) were identified as suspected misaligned but the decision was not to indicate misalignment, then test data collection(s) 1882 used for subsequent misalignment indication decisions may focus on data relating to those socket contact(s) identified as suspected misaligned. Similarly, in this example, current test data collection 1882 may additionally or alternatively be reduced as needed while identification of suspected misaligned socket contacts continues, in order to focus on data relating to socket contacts identified as suspected misaligned. In this example, the extent of a particular test data collection 1882 may therefore be dynamically changed based on the identity of previously identified suspected misaligned socket contacts. In another example, the extent of a particular test data collection 1882 may be dynamically changed if a previous misalignment indication decision was borderline, in order to allow for a more conclusive misalignment indication decision.

It is noted that depending on the embodiment, only one test data collection 1882 may be accessible at a time, or a plurality of test data collections 1882 (each relevant for a different instance of a misalignment indication decision) may be accessible at a time. In cases where a plurality of test data collections 1882 are accessible at a time, the plurality may be accessed in parallel in order to make parallel misalignment decisions, or the plurality may not be accessed at the same time. Assuming test data collection 1882 is stored on database 1880 then depending on the embodiment, database 1880 may include only one data collection 1882 at a time or may include a plurality of data collections concurrently. Assuming different test data collections 1882 during the life of system 1800 (which may or may not be accessible at the same time), then depending on the embodiment, each data collection (which is used in a different decision on whether or not to indicate misalignment) may include a unique set of data, or each data collection does not necessarily include a unique set of data. As an example of the latter embodiment, assuming each test data collection includes data from a plurality of packaged device socketings in a given socket, each data collection may include data relating to distinct packaged device socketings or two or more data collections may include data relating to at least one of the same packaged device socketing.

In some embodiments of test data collection 1882, corresponding pins for test results are apparent. For example, in some embodiments in packaged device testing system 1800A, handler 1808 may transfer identification data of the packaged device(s) currently being tested to tester 1820, for example identification data such as lot number, packaged device number, etc. may also be provided to tester 1820. In these embodiments tester 1820 integrates test results with identification data so that the test results, identified by identification data, can become part of test data collection 1882. As another example, in some embodiments of packaged device testing system 1800B, misalignment indication decision system 1840 controls synchronization of testing and socketing and therefore is aware of identification data of the packaged device(s) currently being tested, for example lot number, packaged device number, etc. Misalignment indication decision system 1840 can therefore integrate identification data with test results received from tester 1820 so that the test results, identified by identification data, can become part of test data collection 1882. In various embodiments of either of the latter two examples, corresponding pins for test results may be apparent because the test results are arranged in test data collection 1882 in a manner in which the corresponding pin is evident (for example in consecutive order by pin number), and/or because the corresponding pin is explicitly indicated for each result.

In the illustrated embodiments, database 1880 additionally or alternatively includes a look up table 1884 or an equivalent correspondence module which associates pins with socket contacts. For example, in some cases look up table 1884 comprises any convenient system readable file format (such as American Standard Code for Information Interchange ASCII) that includes information indicating which pin corresponds to which socket contact. Depending on the embodiment, look up table 1884 may be the same or may vary with test data collection 1882. In some other embodiments, look up table 1884 is included elsewhere in misalignment indication decision system 1840. In some other embodiments, the correspondence between pins and socket contacts is hardcoded.

In some embodiments, look up table 1884 includes entries relating to various products tested by packaged device testing system 1800, and for each product that is tested table entries relating to that product are referenced. In some other embodiments, each product that is tested by packaged device testing system 1800, has a unique associated look up table, or is uniquely hardcoded. In embodiments with a look up table, the product table entries may in some cases be differentiated by package type, and/or by the semiconductor device(s) contained within the package.

In some embodiments, look up table 1884 includes other useful product specific information such as pin electrical and/or physical characteristics including for example pin type, pin layout, and/or pin device signal association, etc. Additionally or alternatively, in some of these embodiments look up table 1884 includes useful socket information such as physical characteristics of contacts. For example, in some cases such product and/or socket specific information may be used as a basis for grouping data for common analysis (see for example description of stage 1950 below). In some other embodiments such product and/or socket specific information is included in a separate lookup table which does not include pin to socket contact correspondence. In some other embodiments, such product and/or socket specific information is not used in deciding whether or not to indicate misalignment or such product and/or socket specific information is hardcoded.

In some embodiments database 1880 may additionally or alternatively include other data, for example test data irrelevant to misalignment, etc.

Optionally, suspected misaligned socket contact identifier 1850 includes a parametric analyzer 1852 configured to analyze parametric data in test data collection 1882 relating to misalignment and/or a pass/fail evaluator 1854 configured to evaluate pass/fail data in test data collection 1882 relating to misalignment. In some embodiments with suspected parametric analyzer 1852, the analysis relates to determining whether or not there is data incongruity, as will be discussed in more detail below.

Optionally attribute determiner 1860 includes a logger 1862 configured to log attribute(s) relating to suspected misaligned socket contact(s). For example logger 1862 may log any of the following inter-alia: incidence (e.g. number of times) that a particular socket contact is identified as suspected misaligned; the "badness" (explained further below) of a particular suspected misaligned socket contact; incongruous parametric data; the total number of and/or fraction of identified suspected misaligned socket contact(s) within the socket; the likelihood ratio (e.g. as described above in FIG. 3); tested packaged device during which a particular socket contact was identified (each time) as suspected misaligned; statistical values derived from incongruous testing data; parametric congruous testing data (for example in order to provide a contrast); electrical functionality of pin corresponding to particular identified suspected misaligned socket contact; unusual physical characteristic of pin corresponding to particular identified suspected misaligned socket contact and/or unusual physical characteristic of particular identified suspected misaligned socket contact; physical positions of identified suspected misaligned socket contacts within the socket; statistical values derived from congruous testing data; statistical values derived from testing data of all socket contacts (both those identified as suspected misaligned and those not so identified); change in any of the above as a function of socketing iteration, number of socketings since the last socket maintenance procedure; socketing index and/or trend etc. In various embodiments, statistical values can include any appropriate statistical value such as for example, mean, median, maximum, minimum, standard deviation and/or rolling average, etc.

In the illustrated embodiments, miscontact evaluator 1870 includes misalignment indication condition 1872 so that miscontact evaluator 1870 can evaluate attribute(s) determined by attribute determiner 1860, singly and/or in combination, and decide whether or not a misalignment indication condition has been met. Depending on the embodiment, condition 1872 may necessitate a particular attribute or combination of attributes, or condition 1872 may be fulfilled by any of two or more stipulations, where each stipulation requires a particular attribute or combination of attributes. Depending on the embodiment, misalignment indication condition 1872 may be predetermined, and/or may be created and/or adapted by system 1840. If misalignment indication condition 1872 has been met, then misalignment is to be indicated. For example, in some embodiments, miscontact evaluator 1870 provides a misalignment indication 1874 to distribution controller 1842. Continuing with the example, in system 1800A, distribution controller 1842 outputs a misalignment indication for example to an operator or engineering personnel (e.g. indication 1844) and/or to tester 1820 (e.g. indication 1846 via channel 1824) with the indication optionally forwarded by tester 1820 to handler 1808 (e.g. via channel 1826A). Continuing with the example, in system 1800B, distribution controller 1842 outputs a misalignment indication for example to an operator or engineering personnel (e.g. indication 1844), to tester 1820 (e.g. indication 1846 via channel 1824) and/or to handler 1808 (e.g. indication 1848B via channel 1816B). As another example, in some embodiments, distribution controller 1842 is omitted and any misalignment indication is outputted to an operator/engineering personnel, tester 1820 and/or handler 1808 by miscontact evaluator 1870. As another example, distribution controller 1842 and miscontact evaluator 1870 may both output misalignment indications.

In some embodiments, control of the operation of one or more of the modules in misalignment indication decision system 1840 by process manager 1890 includes triggering suspected misaligned socket contact identifier 1850 to attempt to identify if there are any suspected misaligned socket contacts. For example process manager may monitor the testing status and trigger attempts accordingly.

Optionally process manager 1890 includes a trigger configuration file 1892. Trigger configuration file 1892 may comprise any convenient system readable file format (such as ASCII) which stipulates trigger point(s) within a test flow. In some cases, trigger configuration file 1892 can also include any of the following specifications for each specified trigger point: which test data collection 1882 to access (see stage 1924 below), how to group parametric data (see stage 1950 below), how to analyze a group of parametric data (see stage 1950, method 300 and other procedures for performing stage 1950 discussed below), how to divide identified suspected misaligned socket contact(s) into set(s) for attribute determination (see stage 1970 below), which attributes to determine (see stage 1970 below), which misalignment indication condition (see stage 1978 below), which misalignment indication decision to decide (see stage 1978 below), any combination of the above, etc. In some cases, a particular trigger point may trigger access to a plurality of test data collections 1882 in order to make a plurality of independent misalignment indication decisions, and therefore in some of these cases one or more of the above specifications may need to be specified per test data collection for that trigger point. In cases where a particular trigger point triggers access to a plurality of test data collections in order to make a plurality of misalignment indication decisions, the triggering may be performed consecutively or in parallel. In some embodiments, some or all of the above specifications may not be included in configuration file 1892, for example, because the specification is the same for each trigger point included in configuration file 1892.

In some other embodiments, process manager 1890 may be omitted, and triggering point(s) for suspected misaligned socket contact identifier 1850 to attempt identification may be defined a-priori, for instance as a static set of default conditions embedded in the logic of system 1840 (for example in suspected misaligned socket contact identifier 1850 and/or other module(s)). In these embodiments specification(s) for each trigger point may in some cases also be embedded in the logic of system 1840.

Figure 19A:
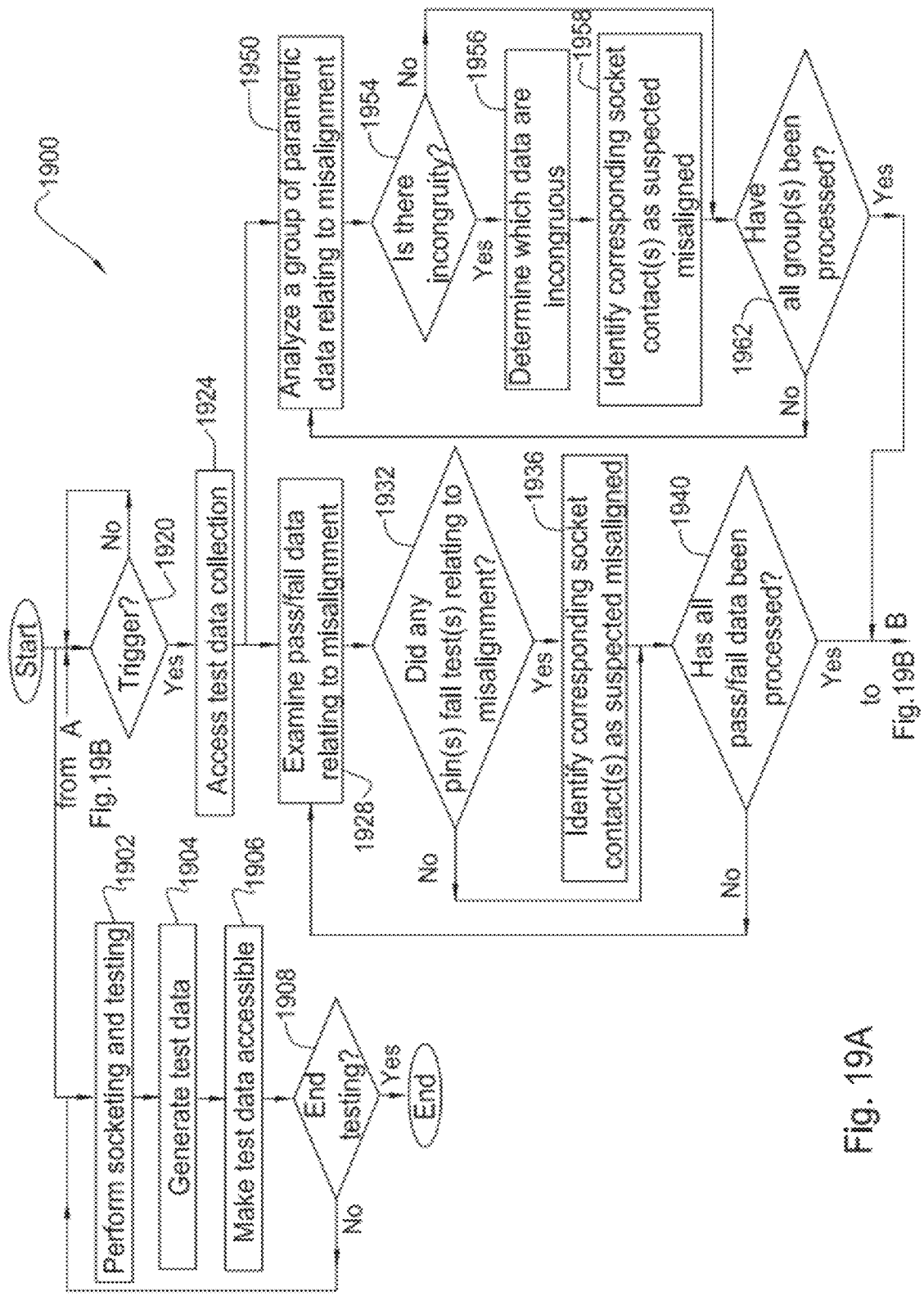
FIG. 19 (comprising FIGS. 19A and 19B) is a flowchart of a method of semiconductor packaged device testing, according to some embodiments of the disclosed subject matter.
Figure 19B:
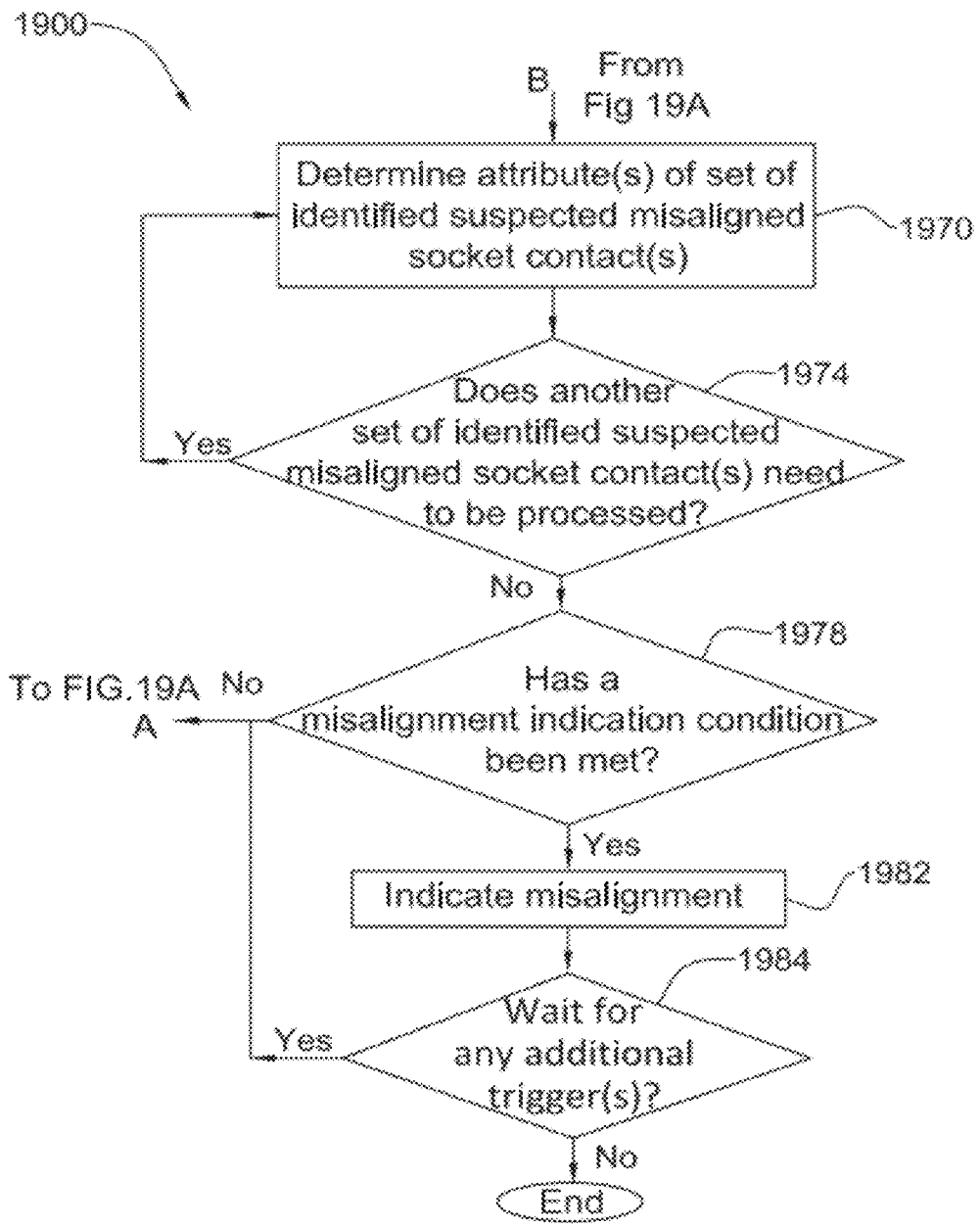

FIG. 19 is a flowchart of a method 1900 of semiconductor packaged device testing, according to some embodiments of the invention. In some embodiments, packaged device testing system 1800 performs method 1900. In some embodiments, stages which are shown in FIG. 19 as being executed sequentially may be executed in parallel and/or stages shown in FIG. 19 as being executed in parallel may be executed sequentially. In some embodiments method 1900 may include more, less and/or different stages than illustrated in FIG. 19. In some embodiments, stages may be executed in a different order than illustrated in FIG. 19.

In the illustrated embodiments a first subprocess includes any of stages 1902 to 1908. In the illustrated embodiments, in stage 1902 socket contacts on socket 1804 make temporary contact with pins of a packaged device and tester 1820 executes a test program 1830 including for example one or more parametric tests 1832 and/or one or more pass/fail tests 1834. Depending on the embodiment, handler 1808 can perform any kind of maneuvering of the packaged device so that the pins make temporary contact with socket contacts on socket 1804.

It is assumed that test program 1830 executed in stage 1902 includes at least one parametric test 1832 and/or pass/fail test 1834 whose result is sensitive to socket contact to pin misalignment in any dimension (X, Y, Z or theta). Embodiments of the invention do not limit the types of parametric tests and/or pass fail tests whose results are sensitive to misalignment, but for the sake of further illustration to the reader, some examples are now presented. One example of a parametric test that may reflect misalignment (and/or other issues) is a contact resistance (CRES) test. Pins are typically formed out of metals or metal alloys, in various shapes and sizes, for example as formed metal leads; or as solder coated balls or solder bumps attached to the underside of the package. Pins are typically surrounded by the package's bulk material which is composed of insulating materials such as preformed ceramics or moldable compounds, such as epoxy cresol novolac polymer. Under good electrical contact between pins and socket contacts, there would be some inherent contact resistance whose value would depend on one or more factors such as the pin and/or socketing technology, measurement procedure, resistance definition (for example including or excluding series resistance added by measurement fixturing), etc. For example, in some cases the inherent contact resistance may be less than 1 ohm whereas in other cases with different factor(s) the range may be about 2 to 3 ohms. Any type of misalignment which alters the socket contact-to-pin force (e.g. too light or too heavy depending on Z alignment) and/or which causes the socket contact to incompletely contact the pin metal surface may have an impact on contact resistance. For example, if the position of a socket contact is off target in the XY plane or is rotationally misaligned so that the socket contact incompletely contacts the pin metal surface and/or partially or fully falls on the package insulating bulk material, then higher than inherent contact resistance between socket contact and pin may result. Additionally or alternatively, if the socket contact's tip position in the Z dimension is lower than the nominal socket contact tip position (e.g. socket with tilt in the Z-dimension causing some device pins to not be inserted deeply enough and therefore have reduced cross-sectional area contact with socket contacts and/or reduced contact-to-pin force), then higher than inherent contact resistance between socket contact and pin may result. At an extreme instance, if a socket contact lands completely off the pin but on the bulk package material instead, the socket contact will not make electrical contact with the pin and the measured pin electrical contact resistance will be infinite, optionally limited by tester 1820 overvoltage protection. It is noted that higher than inherent contact resistance can alternatively or additionally indicate other conditions in some embodiments such as a need for socket cleaning (as socket contacts slowly become increasingly resistive with repeated use), a damaged socket contact, a socket contact blocked by a particle, etc.

As another example, a pass/fail test which may be sensitive to misalignment is an opens test. A pin will fail the test typically if misalignment is severe although in some embodiments the opens test can be defined to fail for less severe misalignment. For example, in some cases X, Y and/or theta misalignment and/or Z alignment due to too little insertion force (too little socket contact-to-pin force) may cause an opens test failure. It is noted that in some embodiments a pin may additionally or alternatively fail an opens test due to other conditions such as a damaged socket contact, a socket contact-tip blocked by a particle, etc.

Other examples of tests whose results may be sensitive to misalignment include pin leakage tests, tests for a specific product whose results are affected by increases in contact resistance (e.g. power supply drop, on-chip data latch, etc), a resistive drop in power supply voltages reaching the chip's internal Vdd bondpad, an unusual RC delay in a high-speed signal path, etc.

In some embodiments, at least one parametric test 1832 and/or pass/fail test 1834 whose result is sensitive to even slight socket contact to pin misalignment is included so that early detection of misalignment is possible.

In some embodiments, not all tests which are sensitive to misalignment are performed. For example, in some cases the tests which are performed may depend on the product. As another example, in some cases the tests which are performed may depend on results of earlier performed tests. Continuing with the example, and assuming that the opens test is scheduled before the contact resistance test, in some of these cases if a pin failed an opens test, contact resistance may not be measured for that pin.

In the illustrated embodiments, in stage 1904 test data are generated. The test data can include results of tests performed in stage 1902 and generated by tester 1820, identification data of the packaged device currently being tested, etc. As mentioned above, identification data may be generated by handler 1808, by misalignment indication decision system 1840, and/or otherwise.

Although the generation of test data and the format of the test data is not limited by embodiments of the invention, for the sake of further illustration to the reader, two examples are now given. In the first example, where a device had eight input/output pins that were submitted to the an opens test, test data may include an index/unit counter and the pass/fail results in a format such as "Unit 14 OPENS PPPFPPPP" where the index of the unit under test is 14, the test is the opens test and of the eight pins, the fourth failed and the rest passed the test. As another example, assuming the same device with eight input/output pins had contact resistance measured, test data may include the index/unit counter and the measurements in a format of "Unit 14 CRES1.115 1.121 0.998 0.999 1.002 1.107 1.101 1.103", where CRES indicates that the test was contact resistance measurement.

In the illustrated embodiments, in stage 1906 the generated test data is made accessible to identifier 1850. For example, in some embodiments, generated test data may be stored in database 1880 so as to be accessible to identifier 1850. As another example, the generated test data may be passed to identifier 1850 for processing without storage.

In the illustrated embodiments, in stage 1908, it is determined if testing has been completed. If testing has been completed, then stages 1902 to 1906 are not repeated. If testing has not been completed, then stages 1902 to 1906 are repeated for the next packaged device to be socketed in socket 1804. The next packaged device may be from the same lot or from the next lot.

In the illustrated embodiments, a second sub-process of method 1900 (including any of stages 1920 to 1984) illustrates possible stages in some embodiments for deciding whether or not to indicate misalignment. In some embodiments, the second subprocess is performed by misalignment indication decision system 1840. Embodiments of the invention do not limit the timing of the second subprocess in relation to the timing of the first subprocess. For example, in some embodiments, once the second subprocess has triggered in stage 1920 various remaining stages of the second subprocess may be performed without regard to which stages of the first subprocess are being performed. As another example, in some embodiments, additionally or alternatively, once the second subprocess has triggered, at least some of the remaining stages of the second subprocess are preferably performed between various passes of stage 1902 (i.e. when no packaged device is currently being tested). As another example, in some embodiments, additionally or alternatively, once the second subprocess has triggered, at least some of the remaining stages of the second subprocess are preferably performed in parallel with stage 1902 (i.e. when packaged device is actually being tested). As another example, in some embodiments, additionally or alternatively once the second subprocess has triggered, at least some of the remaining stages of the second subprocess may be performed after testing has ended (i.e. after a yes in stage 1908)

In the illustrated embodiments in stage 1920, it is determined if a trigger occurred which causes the remaining stages of the second subprocess to be executed. If not, method 1900 waits for a trigger. If a trigger has occurred then method 1900 proceeds to stage 1924. In some embodiments, process manager 1890 monitors the testing, for example monitors subprocess 1902 to 1908, and triggers the remaining stages of the second subprocess, in accordance with trigger configuration file 1892 described above. In some embodiments, additionally or alternatively, the remaining stages of the second subprocess are triggered according to a static set of default conditions integrated for example in suspected misaligned probe identifier 1850 and/or other module(s) in misalignment indication decision system 1840.

Embodiments of the invention do not limit the trigger(s). However for the sake of further illustration to the reader, some examples will now be presented. For example, trigger point(s) can include any of the following material processing event(s): after each socketing, after a plurality of devices have been processed through a socket, after a plurality of lots have completed testing, etc. As another example, additionally or alternatively trigger point(s) can include event(s) not directly related to material processing such as amount of data in a system data buffer, time of day, time based event (e.g. after every N hours of "runtime", shiftly, daily, weekly etc), manufacturing-based event/metric (such as after the first N devices have been tested following a handler set up conversion from Product Type A to Product Type B or when low yield has been observed on a series or set of devices tested on a given socket, etc), after a maintenance operation (for example after every socket clean operation), whenever misalignment indication decision system 1840 is available, etc.

In some examples of trigger point(s), additionally or alternatively, a specified trigger point for a particular misalignment indication is substantially soon after the required test data collection 1882 is complete. For instance, in some of these examples, after each socketing a decision for a type of misalignment which could be manifested within an individual socketing (such as one or more socket contacts that are out of alignment) may be triggered, with test data collection 1882 possibly including data from that socketing. Additionally or alternatively, for instance, in some of these examples, a decision for a type of misalignment which could be manifested after a plurality of socketings (such as a gradual continuous drift from time zero in one or more directions, monotonically getting worse in X, Y, Z, and/or theta dimension) may be triggered after a plurality of socketings, with test data collection possibly including data from those socketings. However, in some other examples of trigger point(s), additionally or alternatively, a specified trigger point may be at a point later in time than when the test data collection 1882 needed for the misalignment indication decision is complete. For instance, a trigger point may be deferred in order to postpone the analysis necessary for the misalignment indication decision to a time when tester 1820 and/or system 1840 is idle. Continuing with this instance, in some of these examples, the trigger point for a misalignment indication decision may be when the current lot is being switched, even if the misalignment indication decision does not require testing data from later packaged devices in the current lot, because there is typically more idle time during the switching of the lot than at other times such as socketing and unsocketing packaged devices. In examples where a misalignment indication decision is deferred, any action resulting from a decision to indicate misalignment would also be deferred.

As mentioned above, depending on the embodiment, a trigger point may trigger access to one data collection 1882 and one pass of remaining stages of subprocess 1920 to 1984 in order to make a misalignment decision, or multiple accesses to a plurality of test data collections 1882 and a plurality of passes in order to make a plurality of independent misalignment decisions, consecutively or in parallel. For simplicity of explanation it is assumed in the description below that access to one data collection 1882 and one pass of the remaining stages of subprocess 1920 to 1984 is triggered at trigger point 1920.

In the illustrated embodiments, in stage 1924, test data collection 1882 is accessed, for example by suspected misaligned contact identifier 1850. Test data collection 1882 includes, inter-alia, data generated and made accessible in one or more iterations of stages 1904 and 1906 which will be analyzed in one pass of stages 1928 to 1984 in order to make a decision on whether or not to indicate misalignment. See above description of FIG. 18 for additional details on various embodiments of test data collection 1882.

Depending on the embodiment, in the current pass of method 1900, stages 1928 to 1940 may be performed, stages 1950 to 1962 may be performed, and/or both stages 1928 to 1940 and stages 1950 to 1962 may be performed. In embodiments where both stages 1928 to 1940 and stages 1950 to 1962 are performed, stages 1928 to 1940 may or may not be performed in parallel with stages 1950 to 1962.

In the illustrated embodiments of stage 1928, pass/fail data relating to misalignment in test data collection 1882 is examined, for example by pass/fail evaluator 1854.

In the illustrated embodiments of stage 1932, it is determined, for example by pass/fail evaluator 1854 whether or not any pins failed tests relating to misalignment. Refer again to the example of test data which in the form of "Unit 14 OPENS P P P F P P P". Pass/fail evaluator 154 may detect the "F" in the fourth position indicating that the fourth pin failed the test, while the "P"s in the other positions indicate that the other pins passed the test.

If there are any failing pins (yes to stage 1932) then stage 1936 is performed. If there are no failing pins then stage 1936 is skipped.

In some embodiments, test data in test data collection 1882 which relate to pass/fail tests, may only include failure results. In these embodiments, stages 1928 to 1932 may be simplified because there are no passing results to be examined.

In the illustrated embodiments in stage 1936, socket contact(s) corresponding to failing pin(s) are identified as suspected misaligned socket contact(s), for instance by pass/fail evaluator 1954. In some embodiments, the determination of which socket contact(s) correspond to the failing pin(s) is facilitated by the usage of lookup table 1884. In some embodiments, data corresponding to identified suspected misaligned socket contacts is indexed to socket contact identity (e.g. corresponding to a particular contact within socket 1804), to socket identity (e.g. corresponding to a particular socket from the set of all sockets in use in a parallel test operation), and/or to socketing iteration identity (e.g. corresponding to one particular socketing from a serialized within-lot socketing sequence).

In the illustrated embodiments, in stage 1940, it is determined, for instance by pass/fail evaluator 1854, whether or not all pass/fail data required for attribute determination has been processed. In some embodiments, all pass/fail data related to misalignment in test data collection 1882 is processed in one or more iterations of stages 1928 to 1940 prior to determining attribute(s). Depending on the embodiment, the amount of pass/fail data processed in each iteration may vary. If another iteration is required (yes to stage 1940), then method 1900 iterates back to stage 1928. If no more iterations are required, then method 1900 proceeds with stage 1970 (optionally after waiting for stages 1950 to 1960 to also be completed).

In the illustrated embodiments, in stage 1950, a group of parametric data in test data collection 1882 relating to misalignment is analyzed, for instance by parametric analyzer 1852. Depending on the embodiment, the group may include all the parametric data in test data collection 1882 relating to misalignment or may include only part of the parametric data. It is assumed that any feature or artifact that increases the standard deviation of measurements of a group of parametric test data being analyzed together could possibly lead to a false conclusion of defective subpopulations and/or may mask the presence of actual defective subpopulations. Therefore in some embodiments, each group includes parametric test data results, preferably resulting from the same parametric test, which are expected to be sufficiently similar to one another under identical physical socket contact-to-pin contact conditions.

For example, assume test data collection 1882 relates to all pins or selected pins tested during one or more socketings. Further assume in this example that pins can be classified according to the characteristic electronic design and/or physical characteristics, so that each group of parametric data relates to performing a given test on pins with similar electrical and/or physical characteristics. Continuing with the example, assume as a simplified instance that test data collection 1882 includes CRES measurements for 16 pins with similar physical characteristics but of which eight are bidirectional input/output pins, four are dedicated input pins (e.g. clock input, output enable, etc), and two are power supply pins. Due to differences in the electronic circuits of the device design that are connected to the various types of pins, the electrical characteristics under CRES measurement may differ, producing different CRES measurement values even under identical socket contact-to-pin contact conditions. Therefore in this example, the CRES test results relating to bidirectional input/output pins, dedicated input pins, and power supply pins are analyzed in separate groups. In another example, assume that the pins of the previous example also differ based on relevant physical characteristics such as pin location within the package. In this example, CRES measurements can be divided into groups, each of which is distinguished by electrical characteristic and/or physical characteristic from the other groups. In some embodiments of these examples, the division into groups may be facilitated by socket and/or product specific information, possibly including and optionally differentiated according to the package type, which may be provided for example by look-up table 1884.

Depending on the embodiment of stage 1950 the analysis may or may not be statistical. Some embodiments of analysis procedures for stage 1950 are described elsewhere in this description, for example with reference to FIG. 3 and/or further below.

In the illustrated embodiments of stage 1954, it is assumed that the analysis of stage 1950 enables determination if there is data incongruity in the group. If data incongruity exist (yes to stage 1954) then method 1900 continues with stage 1956. If on the other hand data incongruity does not exist (no to stage 1954), then method 1900 skips stages 1956 and 1958.

In the illustrated embodiments, in stage 1956, it is determined which data is incongruous. For example, it is determined which test result(s) are incongruous with other test results in the group.

In the illustrated embodiments, in stage 1958, the socket contact(s) which correspond to pin(s) whose test results are incongruous are identified as suspected misaligned. In some embodiments, the determination of which socket contact(s) correspond to the pin(s) with incongruous test results is facilitated by the usage of lookup table 1884. It is noted that in some embodiments, a particular pin may only have test result(s) which are either incongruous or congruous with group test results whereas in other embodiments this is not necessarily so and a particular pin may in some cases have test result(s) which are incongruous as well as test result(s) which are congruous. In some embodiments, data corresponding to identified suspected misaligned socket contacts is indexed to socket contact identity (e.g. corresponding to a particular contact within socket 1804), to socket identity (e.g. corresponding to a particular socket from the set of all sockets in use in a parallel test operation), and/or to socketing iteration identity (e.g. corresponding to one particular socketing from a serialized within-lot socketing sequence).

In the illustrated embodiments, in stage 1962, it is determined if all groups which should be processed prior to attribute determination have been processed. If all groups have been processed (yes to stage 1962), then method 1900 proceeds to stage 1970 (optionally after waiting for stages 1928 to 1940 to also be completed). If all groups have not been processed (no to stage 1962), then method 1900 iterates to process the next group beginning with stage 1950.

In some embodiments, each group may include unique data points compared to any other groups, whereas in other embodiments this may not necessarily be the case and any particular data point may be common to one or more groups.

In some embodiments, there may be one or more group(s) common to the current test data collection 1882 and to test data collection(s) used in previous misalignment decision indication passes. In some of these embodiments, the common group(s) may be again analyzed in stages 1950 to 1962 in order to identify suspected misaligned socket contacts in the group(s), if any. In other of these embodiments, the common group(s) may not be re-analyzed in stages 1950 to 1962 but the identities of any suspected misaligned socket contacts relating to the common group(s) which were previously identified may be retrieved.

It is noted that identifying a socket contact as being suspected misaligned in stage 1936 or 1958 does not necessarily mean that the socket contact is misaligned. For example, as noted above, other circumstances may lead to a socket contact being suspected for misalignment, for example a dirty socket contact, damaged socket contact, a contact blocked by a particle. For this reason, the term "suspected" is used.

In some embodiments, the identification of suspected misaligned socket contact(s) is advantageous. Some examples of advantages will now be provided for further illustration to the reader, but embodiments of the invention do not limit the possible advantages. For example, in some embodiments the identification of suspected misaligned socket contact(s) in stage 1936 or 1958 enables tracking to see if the same socket contact(s) are consistently being identified as suspected misaligned for each iteration of stage 1936 or 1958 or there is instead inconsistency in which socket contact(s) are identified as suspected misaligned. Continuing with the example, in some cases the consistency or inconsistency (for example as recorded by an incidence attribute-see below) across packaged devices may be useful in making the decision of whether or not to indicate misalignment. As another example, in some embodiments, additionally or alternatively the identification of suspected misaligned socket contact(s) in stage 1936 or 1958 may cause future analysis to focus only on data relating to corresponding pin(s), or cause future analysis to focus more on such data than on data relating to other pins. Continuing with the example, in some cases, only data relating to pin(s) whose corresponding socket contact(s) were previously identified as suspected misaligned (based on data from previous socketing(s)) is analyzed to see if there is an upward trend in parametric measurements such as CRES, and/or for other tracking purposes. As another example, in some embodiments, additionally or alternatively, data relating to socket contact(s) identified as suspected misaligned in stage 1936 or 1958 is excluded from any calculations reserved for normal parametric measurements such as normal CRES measurements. Continuing with the example, in some cases, if it is desired to calculate the mean and standard deviation to model a nominal dataset (for example for the unimodal model described above with reference to stage 346 of FIG. 3), data relating to identified suspected misaligned socket contact(s) may be excluded. As another example, in some embodiments, additionally or alternatively, the identification of suspected misaligned socket contacts in stage 1936 or 1958 enables the determination of common attributes between identified socket contacts. Continuing with the example, in some cases, it can be determined if all identified suspected misaligned socket contacts are associated with pins that are located at particular positions in a packaged device or which have common electrical functionality. As another example, additionally or alternatively, the identity of the suspected misaligned socket contact(s) (and optionally other analysis results) as identified in stage 1936 or 1958, can be reported to engineering personnel and/or an operator for use in determining the root cause of the problem. Continuing with the example, in some cases identified suspected misaligned socket contact(s) may be subsequently optically inspected in order to narrow down the list of hypothetical root cause problems.

It should be apparent from the above advantages that in some cases, it may be advantageous to identify suspected misaligned socket contact(s) even outside the context of a misalignment indication decision or in a different misalignment indication system than described with respect to method 1900. Similarly suspected misaligned socket contact identifier 1850 may in these cases be useful even separate from a misalignment indication system or within a different misalignment indication system than system 1840.

In the illustrated embodiments, in stage 1970, one or more attributes of a set of one or more identified suspected misaligned socket contact(s) is determined, for example by attribute determiner 1860.

Depending on the embodiment, the determination of attribute(s) of identified suspected misaligned socket contact(s) can be performed on one or more sets of identified suspected misaligned socket contact(s). Embodiments of the invention do not limit the division into sets, but for the sake of further illustration to the reader some examples are now given. For example, in some embodiments all identified suspected misaligned socket contact(s) may belong to the same set, and attributes(s) for the set may be determined. In another example, in some embodiments, additionally or alternatively, suspected misaligned socket contact(s) identified via pass/fail test data may be part of one set analyzed for attribute(s) and suspected misaligned socket contact(s) identified via parametric test data may be part of a different set which is separately analyzed for attribute(s). In another example, suspected misaligned socket contact(s) corresponding to incongruous data with larger value(s) than congruous data may be part of one set analyzed for attribute(s) and suspected misaligned socket contact(s) corresponding to incongruous data with smaller value(s) than congruous data may be part of a different set analyzed for attribute(s). In embodiments with more than one set, each set may include unique identified suspected misaligned socket contact(s), or each set may not necessarily include unique identified suspected misaligned socket contact(s) and partial or full overlap among identified suspected misaligned socket contact(s) which are members of each set is possible.

The invention does not limit the possible attribute(s) which may be determined in stage 1970. However for the sake of further illustration to the reader, some examples will now be presented. Examples of possible attribute categories include any of the following inter-alia: actual test results, statistical attribute(s), temporal attribute(s) (e.g. history), electrical and/or physical characteristics (attributes), position/geographical attribute(s) etc. Examples of possible attribute(s) which may or may not fit the listed attribute categories include any of the following inter-alia: incidence (e.g. number of times) that a particular socket contact is identified as suspected misaligned; the "badness" (explained below) of a particular suspected misaligned socket contact; incongruous parametric data corresponding to the set; the total number of and/or fraction of identified suspected misaligned socket contacts(s) within the socket; the likelihood ratio (e.g. as described in FIG. 3); tested packaged device, during which a particular socket contact was identified (each time) as suspected misaligned; electrical functionality of pin corresponding to a particular identified suspected misaligned socket contact; unusual physical characteristic of pin corresponding to particular identified suspected misaligned socket contact and/or unusual physical characteristic of particular identified suspected misaligned socket contact; physical positions of identified suspected misaligned socket contacts within the socket; statistical values derived from incongruous testing data corresponding to the set; parametric congruous testing data (for example in order to provide a contrast); statistical values derived from congruous testing data; statistical values derived from testing data of all socket contacts (both those identified as suspected misaligned and those not so identified); change in any of the above as a function of socketing iterations, number of socketing(s) since the last socket maintenance operation, socketing index; and/or trend etc. In various embodiments, separate statistical values may be derived from testing data which was analyzed in different groups, or statistical values may be derived from testing data which was analyzed in all groups of the current pass. In various embodiments, statistical values can include any appropriate statistical value such as for example, mean (i.e. average), median, maximum, minimum, standard deviation and/or rolling average, etc. Depending on the embodiment and the attribute, determination of attributes derived for different sets of identified suspected misaligned socket contact(s) may or may not be cumulative for test data collection 1882. For example, in some embodiments an incidence attribute for a particular suspected misaligned socket contact which is included in more than one set, cumulates over all sets in which the socket contact is included. In other embodiments of the same example, accumulation is not required since suspected misaligned socket contacts would be evaluated as one set for incidence attribute, even though not necessarily for other attributes, or because separate incidence counters for each set is preferable for making the misalignment indication decision. Assuming embodiments where if a particular pin fails a pass/fail test sensitive to misalignment and parametric measurements for a test sensitive to misalignment is in any event performed on that pin, in some of these embodiments if a socket contact is identified as suspected misaligned based on data from a pass/fail test and also identified as suspected misaligned based on data from a parametric test, where the data from both tests relates to the same packaged device, the incidence attribute is incremented once whereas in other of these embodiments the incidence attribute is incremented twice.

In some embodiments with a "badness" attribute, the "badness" of an individual suspected misaligned socket contact may be expressed in any appropriate manner, for example by the incidence of a socket contact being identified as suspected misaligned, by the mean, median, or maximum values that have been observed for the corresponding pins, etc. In some embodiments, the "badness" attribute may additionally or alternatively be expressed as a function of the congruous testing data points, or of the statistical parameters of a distribution of the congruous data points. For example, in some of these embodiments the number of standard deviations from the average of the distribution of the congruous data points that were analyzed in the same group(s) as the incongruous data associated with an identified suspected misaligned socket contact (or the average or maximum value of the incongruous data associated with an identified suspected misaligned socket contact) may be computed and used as a parametric figure-of-merit of the "badness".

In some embodiments, an unusual physical characteristic for a pin may relate to an unusual layout feature such as a pin which is located at the corners of a packaged device. Similarly in some embodiments, an unusual physical characteristic for a socket contact may relate to an unusual design feature such as a socket contact which is located at the corners of a socket.

In the illustrated embodiments of stage 1974 it is determined if another set of identified suspected misaligned socket contact(s) needs to be processed for attribute determination, prior to making a misalignment indication decision. If yes (yes to stage 1974), then attribute(s) are determined for another set in another iteration of stage 1970. If no other sets need to be processed then method 1900 continues with stage 1978.

In the illustrated embodiments, in stage 1978, it is decided, for example by miscontact evaluator 1870, whether or not a misalignment indication condition has been met and misalignment is to be indicated. For instance, miscontact evaluator 1870 may evaluate attribute(s) determined in stage 1970 and decide if misalignment indication condition 1872 has been met by the attribute(s), singly and/or in combination. Depending on the embodiment, condition 1872 for a misalignment indication may necessitate a particular attribute or combination of attributes, or condition 1872 may be fulfilled by any one of two or more stipulations, where each stipulation requires a particular attribute or combination of attributes. For example, a misalignment indication related to a socketing condition in which a packaged device is seated in a socket with a small rotational misalignment may be defined by one or more of the socket's contacts positioned at the socket corners being identified as "suspect misaligned" at least 3 times in the last 30 device socketings, while simultaneously no socket contacts are identified as "suspect misaligned" from among a specified set of contacts positioned near the center of the socket, also based on the last 30 device socketings. Thus, in this example, a determination of rotational misalignment involves a combination of two stipulations, each utilizing a socket contact positional attribute and an attribute related to the frequency of socket contacts being identified as "suspect misaligned".

Depending on the embodiment, misalignment indication condition 1872 and all possible stipulations may be predetermined, or there may be a possibility for creating and/or adapting misalignment indication condition 1872 and/or one or more stipulations. As an example of the latter embodiment, in some cases if a previous misalignment decision was to not indicate misalignment due to the absence of one stipulated attribute even though remaining stipulated attribute(s) were present, then a current misalignment decision may be to indicate misalignment if the stipulated attribute that was previously absent is present, even if one of the previously present stipulated attribute(s) is now absent.

Embodiments of the invention do not limit the attribute(s) which are required to meet the misalignment indication condition 1872 but for the sake of further illustration to the reader, some examples are now given. For example, in some embodiments an attribute (required singly or in combination) may be that a median or average value for all CRES measurements whose incongruity led to corresponding socket contacts to be identified as suspected misaligned is above a predetermined threshold, or that a median or average value for all CRES measurements whose incongruity led to corresponding socket contacts to be identified as suspected misaligned is above a value threshold relative to the median or average value for all congruous data. As another example, in some embodiments an attribute (required singly or in combination) may be that incidence of a socket contact being identified as suspected misaligned is above a predetermined threshold, or that incidence of a socket contact being identified as suspected misaligned which was previously never flagged as suspected misaligned is above a predetermined threshold. As another example, in some embodiments an attribute (required singly or in combination) may be incidence of a socket contact being identified as suspected misaligned in at least x out of the last y socketings.

In the illustrated embodiments, if it is determined that the misalignment indication condition 1872 has not been met and therefore misalignment is not to be indicated (no to stage 1978), then method 1900 iterates back to stage 1920, waiting for the next trigger (if any) to make one or more new misalignment indication decision(s). If instead it is determined that the misalignment indication condition 1872 has been met and misalignment is to be indicated (yes to stage 1978), then misalignment is indicated in stage 1982. For example miscontact evaluator 1870 may provide misalignment indication 1874 to distribution controller 1842 which in turn distributes misalignment indication(s) (e.g. indication 1846, 1844 and/or 1848B) outside of misalignment decision system 1840. As another example, additionally or alternatively, miscontact evaluator 1870 may output misalignment indication(s) directly from misalignment decision system 1840.

Embodiments of the invention do not limit the type of misalignment indication, but for further illustration to the reader some examples will now be presented. For example, a misalignment indication may include an (automatic) abort indication to tester and/or handler (e.g. indication 1846 and/or 1848B), and/or a notification indication to an operator and/or engineering personnel (e.g. indication 1844 which may include a hardware indication such as a red light and/or may include an indication sent in any appropriate fashion including: via email, beeper, and/or as part of a report, etc). In some cases, the notification may be recognizable to the operator as indicating that action is required, for example manual abort, review to see if aborting is necessary, etc. In some cases, the notification may additionally or alternatively be informative, for example providing diagnostic output from execution of method 1900. In some of these cases, the diagnostic output can include the identity of the suspected misaligned socket contacts and/or any other appropriate data.

Embodiments of the invention do not limit consequences of an automatic or manual abort, but for the sake of further illustration to the reader, some examples are now given. Consequences may include for example, not performing part or all of method 1900. Continuing with the example, in some cases at least performance of stage 1902 may be stopped. Consequences may additionally or alternatively include for example further diagnostic troubleshooting such as optical inspection of the pins of a packaged device which has been tested, and/or inspection of the socket in question, for instance either manually or using a specialized automated inspection tool. In some cases of troubleshooting, system 1840 may be interfaced to diagnostic equipment in order to facilitate troubleshooting. Consequences may additionally or alternatively include one or more alignment procedures.

In some embodiments, an indication (which is not a misalignment indication) may be provided even if the decision is to not provide a misalignment indication. For example, diagnostic output may be provided despite the decision to not indicate misalignment. As another example, additionally or alternatively, an indication may be provided because the decision that misalignment condition 1872 was not met, led to the determination that some other condition was met. Continuing with the example, in some cases, a "clean" or "damaged socket contact" indication may be output if the analysis led to that conclusion (see for example discussion of FIG. 8D further below). In some embodiments, an indication unrelated to misalignment may be provided in addition to the misalignment indication.

In the illustrated embodiments, after misalignment has been indicated in stage 1982, it is determined in stage 1984 whether or not to wait for any additional triggers. If it is decided to wait for any additional triggers (yes to stage 1984) then method 1900 iterates back to stage 1920, waiting for the next trigger (if any). If instead it is decided not to wait for any additional triggers (no to stage 1984), then method 1900 ends. For example, in some embodiments if the misalignment indication includes an automatic abort and/or notification to manually abort, then the decision is to not wait for any additional triggers. In these embodiments, if the misalignment indication does not include an automatic abort nor a notification to manually abort, then the decision is to wait for the next trigger (if any). Alternatively, in some embodiments, even if the misalignment indication does not include an automatic abort nor a notification to manually abort, the decision in some cases may be to not wait for any additional triggers. For example in some of these embodiments, the decision may be to not wait for any additional triggers if the current misalignment indication was sufficiently informative to allow the operator to review and determine if manual abort is necessary.

Some embodiments of the current invention may be advantageous for any of the following reasons: first, identification of suspected misaligned socket contacts may be advantageous compared to a method where there is no identification. See above description of some possible advantages of identification (before description of stage 1970). Second, additionally or alternatively, in embodiments with parametric data, the decision of whether or not to indicate misalignment may in some cases be more fine-tuned due to the analysis of parametric data that can take on any of multiple values compared to a method which only included analysis of binary pass/fail test results. This fine-tuning, for example can in some of these cases lead to a misalignment indication being output at an advantageous time. Continuing with the example, if a decision to indicate misalignment instead relied only on say the opens test, then indicating misalignment after say only one failure may in some instances be not as advantageous because the failure may be due to packaged device fabrication error rather than misalignment, but indicating misalignment only after say 5 failures may in some cases be not as advantageous because the misalignment by then may be severe. Third, additionally or alternatively, in some cases tester 1820 and handler 1808 do not need to be adapted in order to implement method 1900.

Although embodiments of the invention do not limit applications of the above described methods and systems, some examples relating to packaged device testing will now be provided for further illustration to the reader.

The examples of FIGS. 4 through 9, previously discussed in the context of Cres data gathered in a wafer sort operation, apply equally to a package test operation. In such an embodiment, the graph of FIG. 4 may be interpreted as showing CRES measurements by touchdown (or socketing sequence) for three pins, Pin 1, Pin 2, and Pin 3, during testing of a series of packaged devices through a given socket.

Statistical method 300 described with reference to FIG. 3 may be applied in some embodiments to the Pin 3 CRES data of FIG. 4 when those data have been derived from a package test operation. In these embodiments, in which the data of FIGS. 3, 4, and 5 are derived from a package test operation, the calculation of the Likelihood Ratio from the cumulative Pin 3 data at the 70th, 90th, and 110th socketing (shown in FIG. 5A, FIG. 5B, and FIG. 5C, respectively) proceeds exactly as in the wafer sort embodiments described above, and the meaning and interpretation of the resulting Likelihood Ratio values is also the same. FIG. 6 continues to be a useful illustration in some package test embodiments of the fitting of two Gaussian curves to the example of a bimodal Pin3 data distribution found in a sequence of 110 package test socketings, specifically highlighting the meaning and calculation of the mixing fraction values for the two fitted curves, as described previously.

For embodiments in which stage 1920 of FIG. 19 triggers after each package test socketing, the Likelihood Ratio may be calculated based on cumulative data from the present and a prior set of test operations performed using the socket being analyzed. In FIG. 7, for example, according to some embodiments of the present invention, the cumulative data from the first 70 socketings for each of Pin 1, Pin 2, and Pin 3 (data up to dashed line 402 of FIG. 4) are analyzed as a group, using method 300 of FIG. 3 (possibly an analysis of cumulative data for other pins, each group having data from a single pin, is also performed). In such package test embodiments, the calculations and interpretation of the Likelihood Ratio are as previously described, and for the given example may provide an indication of what may be an appropriate threshold in making a decision to indicate misalignment. With such nominal data, the maximum Likelihood Ratio calculated has a value around 3, suggesting sufficient margin if a threshold were set to be for instance near the value of around 3.5, i.e. set for instance to the Likelihood Ratio which was calculated using the data of FIG. 5B.

In some embodiments, other procedures can be implemented in performing stages 1950 to 1956, additionally or alternatively to method 300 described above with reference to FIG. 3.

An example of another procedure that may be applied to embodiments concerning package test socketings is now given, not in order to limit applications of other procedures, but to further illustrate embodiments of the invention to the reader. Referring to the data of FIG. 4 for pins 1, 2, and 3, some embodiments of histograms for the combined dataset of Pin 1, Pin 2 and Pin 3 with reference to package testing are shown for the first 70 socketings, socketings 71 to 122, and socketings 123 to 170, in FIG. 8A, FIG. 8B, and FIG. 8C respectively. For example, it may be assumed that the three pins are similar enough that data relating to the three pins may be analyzed together.

In the illustrated embodiments of this example, it is assumed that the distribution is normal and similar for all material and therefore suitable historical data representative of normal CRES distributions may be used as a reference. In this example, assuming the CRES distribution of FIG. 8A is normal, a model normal distribution with mean of 2.13 ohms and standard deviation of 0.72 ohms may be used as a basis for identification of subsequent points with statistically unlikely high CRES values, for example those with values greater than the mean plus three standard deviations, or 4.3 ohms for the example data group of FIG. 8A. In excursions, the CRES data distribution will be composed of one or more subdivisions as shown in FIG. 8B and continuing in FIG. 8C. Based on the calculated threshold of the present example, the data associated with the high CRES values, on the right-hand side of the histogram, are easily distinguished based on CRES values greater than 4.3 ohms.

Referring to FIG. 4, beginning at the dashed vertical line 402 marking touchdown number 70, Pin 3 begins to exhibit elevated CRES values, with most Pin 3 values beyond that touchdown falling above 4.3 ohms.

As previously discussed in wafer sort embodiments, similarly, in some package test socketing embodiments, a "clean" rather than a misalignment problem may be distinguished by a unimodal distribution with a higher mean CRES than in earlier touchdowns. Refer to FIG. 8D which shows some embodiments of histograms for the combined dataset of Pin 1, Pin 2 and Pin 3 when cleaning is due to remove material buildup on socket contacts. It is evident that compared to the normal CRES distribution of FIG. 8A, the mean CRES in FIG. 8D is higher but the distribution remains unimodal, hinting that the entire contact population has shifted.

In another example of a procedure, which can additionally or alternatively be implemented in performing stages 1950 to 1956, a parametric statistical analysis of CRES data may be used to distinguish sub-populations of pins with unusually low or high mean values, or unusually narrow or wide standard deviations. These subpopulations can potentially correlate with individual contacts or groups of contacts with misalignment problems.

In still another example of a procedure, which can additionally or alternatively be implemented, a rolling average of CRES measurements may be maintained, for example for each pin, over a certain number of socketings. Continuing with the example, stage 1920 may be triggered after each socketing with the rolling average analysis performed in stage 1950 on data from the last predetermined number of socketings. Refer to FIG. 9A which in the context of package testing illustrates some embodiments of rolling average CRES measurements for the most recent 16 socketings for Pin 1, Pin 2 and Pin 3 by socketing (using the data from FIG. 4). The dashed vertical line 902 corresponds to socketing 70. It can be seen that the rolling average of Pin 3 diverges from the rolling averages of the other two pins going above 3 ohms, whereas the rolling averages of the other two pins stay pretty constant. Refer also to FIG. 9B which illustrates some embodiments of calculated CRES standard deviation based on a rolling 20 point (20 socketing) window for the data from FIG. 4 on Pin 3. It can be seen that there is a dramatic increase in standard deviation around socketing 80 and again around socketing 130. These increases occur approximately at the socketings where the data in the rolling 20 point window includes both the older/better CRES and the newer/worse CRES data points.

In still another example of a procedure, which can additionally or alternatively be implemented, a body of reference data may be accrued over time. For instance CRES data relating to one or more individual socket contacts from a rolling window of a certain number of consecutive socketings may be acquired, with the cumulative data set treated as the reference distribution.

Continuing with the examples based on the data of FIG. 4, after using method 300 and/or any other procedure for performing stages 1950 to 1956 and then performing stages 1958 and 1962, and/or after performing stages 1928 to 1940, attribute determination can be performed in stage 1970. In some embodiments, attribute determination includes determination of incidence of a socket contact being identified as suspected misaligned. Illustrating such an embodiment again with the data of FIG. 4, and applying a CRES threshold of e.g. 4.3 ohms, it can be seen that the incidence counter for Pin 1 would be incremented only once due to a single measurement of about 5.0 ohms at socketing 46 (incidence[1]=1), while the incidence counter for Pin 3 would be incremented in almost every socketing subsequent to socketing 70. Therefore, in these embodiments attribute determination would include one incidence of Pin 1 being identified as suspected misaligned and multiple incidences of Pin 3 being identified as suspected misaligned. In some embodiments, additionally or alternatively, attribute determination includes trend analysis. For instance, referring again to FIG. 9A the upward trend for Pin 3 compared to Pins 1 and 2 is evident. Any other attribute determination, including inter-alia position attribute determination may additionally or alternatively be performed in any of the above examples which were based on the data of FIG. 4.

Continuing with the examples based on the data of FIG. 4, as applied to package testing, any type of misalignment indication condition 1872 may be evaluated in stage 1978. Although the type of condition is not limited, for further illustration to the reader, some instances are now provided. For instance, in some embodiments a decision to indicate misalignment may be made when the Likelihood Ratio is at or above 3.5, or when the Likelihood Ratio is above 3.5 and other condition(s) have been met. In another instance, additionally or alternatively, a condition may require that the average CRES value of identified suspected misaligned socket contacts exceeds a predetermined value or a value threshold relative to the average CRES value of socket contacts which have not been identified as suspected misaligned. Continuing with this instance, in some cases of the data of FIG. 9A a decision to indicate misalignment may be made if the average CRES value of identified suspected misaligned socket contacts exceeds e.g. 3 ohms, or exceeds e.g. the mean plus four standard deviations of the distribution of CRES values from socket contacts not identified as suspected misaligned. In another instance, additionally or alternatively, in some cases of the data of FIG. 8D, because the distribution is unimodal there may be a decision not to indicate misalignment.

It will also be understood that in some embodiments a system or part of a system according to the invention may be a suitably programmed machine. Likewise, some embodiments of the invention contemplate a computer program being readable by a machine for executing a method of the invention. Some embodiments of the invention further contemplate a machine-readable memory tangibly embodying program code readable by the machine for executing a method of the invention.

While the invention has been shown and described with respect to particular embodiments, it is not thus limited. Numerous modifications, changes and improvements within the scope of the invention will now occur to the reader.

The invention claimed is:

1. A system for deciding to indicate misalignment, comprising:
   a suspected misaligned identifier operable to identify at least one suspected misaligned probe or socket contact based at least partly on examination of a test data collection, including analysis of at least one group of a plurality of parametric test measurements whose values are sensitive to misalignment;
   an attribute determiner operable to determine at least one attribute relating to at least one identified suspected misaligned probe or socket contact;
   an evaluator operable to evaluate said at least one attribute in order to decide whether or not a misalignment indication condition has been met and misalignment is to be indicated; and
   a process manager operable to trigger said suspected misaligned identifier to attempt to identify any of said at least one suspected misaligned probe or socket contact.

2. The system of claim 1, wherein said suspected misaligned identifier is operable to identify said probe or socket contact which corresponds to incongruous data among said plurality of parametric test measurements as being suspected misaligned.

3. The system of claim 2, wherein said probe or socket contact that is identified as being suspected misaligned corresponds to at least one outlier measurement among said plurality of parametric test measurements.

4. The system of claim 1, wherein said test data collection includes results of at least one pass/fail test which are sensitive to misalignment, and wherein said suspected misaligned identifier is further operable in said examination to examine said results for fail results and to identify a probe or socket contact which corresponds to a bondpad or pin that failed a pass/fail test that is sensitive to misalignment as being suspected misaligned.

5. The system of claim 4, wherein said pass/fail test is an open circuit test.

6. The system of claim 1, wherein said trigger occurs at a timepoint selected from a group comprising: after a touchdown has completed testing, after a plurality of touchdowns have completed testing, after a wafer has completed testing, after a plurality of wafers have completed testing, after a lot has completed testing, after a plurality of lots have completed testing, after a plurality of devices have been processed through a socket, after a plurality of hours of "runtime", shiftly, daily, weekly, following a set up product conversion, after low yield has been observed, after a maintenance operation, or when said system is available.

7. The system of claim 1, wherein said parametric test measurements include contact resistance measurements.

8. The system of claim 1, wherein said at least one attribute includes an incidence of said at least one identified suspected misaligned probe or socket contact being identified as being suspected misaligned.

9. The system of claim 1, wherein if a plurality of probes have been identified as being suspected misaligned, said at least one attribute includes at least one calculated metric which quantifies placement of said plurality of suspected misaligned probes with respect to an area on one or more wafers.

10. The system of claim 9, wherein said at least one metric includes at least one probability of having said placement, compared to having an expected placement of said plurality of suspected misaligned probes.

11. The system of claim 10, wherein whether or not said misalignment indication condition is met, depends at least partly on a value of said at least one probability.

12. The system of claim 10, wherein said expected placement includes randomly positioned suspected misaligned probes, and said misalignment indication condition is met if at least one of said at least one probability is above or below a predetermined threshold, indicating that said plurality of suspected misaligned probes is probably non-randomly positioned.

13. The system of claim 1, wherein said at least one attribute includes at least one selected from a group comprising: actual test results, statistical attributes, temporal attributes, electrical characteristics, physical characteristics, or position attributes.

14. The system of claim 1, wherein if misalignment is to be indicated, indication of misalignment includes indicating an abort.

15. The system of claim 1, wherein if misalignment is to be indicated, indication of misalignment includes indicating a notification.

16. The system of claim 1, further comprising a distribution control, wherein said evaluator is further operable to indicate misalignment to said distribution control and said distribution control is operable to indicate misalignment by distributing at least one misalignment indication.

17. The system of claim 1, wherein said analysis includes:
comparing a maximum likelihood estimation for a multimodal model to a maximum likelihood estimation for a unimodal model; and
if said multimodal model is more appropriate than said unimodal model, then determining one or more outliers in said multimodal model, wherein a corresponding probe or socket contact which corresponds to at least one of said outliers is identified as being suspected misaligned.

18. The system of claim 17, wherein said outliers are statistically similar to reference data corresponding to a misaligned condition, said reference data having been generated by deliberately probing in a misaligned condition so as to produce reference data incongruous with data produced when probing in a non-misaligned condition.

19. A system for deciding to indicate misalignment, comprising:
a suspected misaligned probe identifier operable to identify suspected misaligned probes;
an attribute determiner operable to determine at least one attribute including being operable to perform a spatial analysis in order to determine at least one position attribute which quantifies placement of a plurality of said suspected misaligned probes with respect to an area on one or more wafers;
a misprobe evaluator operable to evaluate at least one of said at least one determined attribute including at least one of said at least one determined position attribute in order to decide whether or not a misalignment indication condition has been met and misalignment is to be indicated; and
a process manager operable to trigger said suspected misaligned probe identifier to attempt to identify any of said suspected misaligned probes.

20. The system of claim 19, wherein said suspected misaligned probe identifier is operable to identify a probe of said suspected misaligned probes which corresponds to incongruous data among a plurality of parametric test measurements whose values are sensitive to probe-to-pad alignment as being suspected misaligned.

21. The system of claim 20, wherein said parametric test measurements include contact resistance measurements.

22. The system of claim 19, wherein said suspected misaligned probe identifier is operable to identify a probe which corresponds to a bondpad that failed a pass/fail test that is sensitive to misalignment as being suspected misaligned.

23. The system of claim 22, wherein said pass/fail test is an open circuit test.

24. The system of claim 19, wherein said trigger occurs at a timepoint selected from a group comprising: after a touchdown has completed testing, after a plurality of touchdowns have completed testing, after a wafer has completed testing, after a plurality of wafers have completed testing, after a lot has completed testing, after a plurality of lots have completed testing, after a plurality of hours of "runtime", shiftly, daily, weekly, following a set up product conversion, after low yield has been observed, after a maintenance operation, or when said system is available.

25. The system of claim 19, wherein said at least one attribute includes at least one selected from a group comprising: actual test results, statistical attributes, temporal attributes, electrical characteristics, physical characteristics, or position attributes.

26. The system of claim 19, wherein if misalignment is to be indicated, indication of misalignment includes indicating an abort.

27. The system of claim 19, wherein if misalignment is to be indicated, indication of misalignment includes a notification.

28. The system of claim 19, further comprising a distribution control, wherein said misprobe evaluator is further operable to indicate misalignment to said distribution control and said distribution control is operable to indicate misalignment by distributing at least one misalignment indication.

29. The system of claim 19, wherein said at least one determined position attribute includes at least one spatial density of said plurality of suspected misaligned probes.

30. The system of claim 29, wherein said at least one spatial density includes at least one spatial probability of having said placement, compared to having an expected placement of said plurality of suspected misaligned probes.

31. The system of claim 30, wherein said at least one spatial probability includes at least one cumulative binomial probability.

32. The system of claim 30, wherein said expected placement includes randomly positioned suspected misaligned probes, and said misalignment indication condition is met if at least one of said at least one spatial probability is above or below a predetermined threshold, indicating that said plurality of suspected misaligned probes is probably non-randomly positioned.

33. The system of claim 19, wherein said attribute determiner is operable in said spatial analysis to map said plurality of suspected misaligned probes to at least one region on at least one template representing said area; and wherein said position attribute quantifies said placement per region.

34. A method of deciding to indicate misalignment, comprising:
triggering a suspected misaligned identifier to attempt to identify at least one suspected misaligned probe or socket contact using a process manager;
identifying the at least one suspected misaligned probe or socket contact based at least partly on examination of a test data collection using said suspected misaligned identifier, including analyzing at least one group of a plurality of parametric test measurements whose values are sensitive to misalignment;

determining at least one attribute relating to at least one identified suspected misaligned probe or socket contact using an attribute determiner; and evaluating said at least one attribute in order to decide whether or not a misalignment indication condition has been met and misalignment is to be indicated using an evaluator.

35. The method of claim 34, wherein said analyzing includes:

comparing a maximum likelihood estimation for a multimodal model to a maximum likelihood estimation for a unimodal model; and if said multimodal model is more appropriate than said unimodal model then determining one or more outliers in said multimodal model, wherein a probe or socket contact which corresponds to at least one of said outliers is identified as being suspected misaligned.

36. The method of claim 35, further comprising:

generating reference data by deliberately probing in a misaligned condition so as to produce reference data incongruous with data produced when probing in a non-misaligned condition;

wherein said determining one or more outliers includes:

determining data which are statistically similar to said reference data.

37. A method of deciding to indicate misalignment, comprising:

triggering a suspected misaligned probe identifier to attempt to identify suspected misaligned probes using a process manager;

identifying skid suspected misaligned probes using said suspected misaligned probe identifier;

determining at least one attribute using an attribute determiner, including performing a spatial analysis in order to determine at least one position attribute which quantifies placement of a plurality of said suspected misaligned probes with respect to an area on one or more wafers; and evaluating at least one of said at least one determined attribute including at least one of said at least one determined position attribute in order to decide whether or not a misalignment indication condition has been met and misalignment is to be indicated using a misprobe evaluator.

38. The method of claim 37, wherein said performing a spatial analysis includes:

mapping said plurality of suspected misaligned probes to at least one template representing said area, each of which includes at least one region; and wherein said position attribute quantifies said placement per region.

39. A computer program product comprising a non-transitory computer useable medium having computer readable program code embodied therein for deciding to indicate misalignment, the computer program product comprising:

computer readable program code for causing the computer to trigger attempting to identify at least one suspected misaligned probe or socket contact;

computer readable program code for causing the computer to identify the at least one suspected misaligned probe or socket contact based at least partly on examination of a test data collection, including analyzing at least one group of a plurality of parametric test measurements whose values are sensitive to misalignment;

computer readable program code for causing the computer to determine at least one attribute relating to at least one identified suspected misaligned probe or socket contact; and computer readable program code for causing the computer to evaluate said at least one attribute in order to decide whether or not a misalignment indication condition has been met and misalignment is to be indicated.

40. A computer program product comprising a non-transitory computer useable medium having computer readable program code embodied therein for deciding to indicate misalignment, the computer program product comprising:

computer readable program code for causing the computer to trigger attempting to identify suspected misaligned probes;

computer readable program code for causing the computer to identify the suspected misaligned probes;

computer readable program code for causing the computer to determine at least one attribute including performing a spatial analysis in order to determine at least one position attribute which quantifies placement of a plurality of said suspected misaligned probes with respect to an area on one or more wafers; and computer readable program code for causing the computer to evaluate at least one of said at least one determined attribute including at least one of said at least one determined position attribute in order to decide whether or not a misalignment indication condition has been met and misalignment is to be indicated.

* * * * *